United States Patent
Okada et al.

(10) Patent No.: US 10,473,917 B2
(45) Date of Patent: Nov. 12, 2019

(54) MOVABLE REFLECTION DEVICE AND REFLECTION SURFACE DRIVE SYSTEM UTILIZING SAME

(71) Applicant: DAI-ICHI SEIKO CO., LTD., Kyoto-shi, Kyoto (JP)

(72) Inventors: Kazuhiro Okada, Ageo (JP); Satoshi Era, Ageo (JP); Shinya Sakamoto, Kyoto (JP); Yoshifumi Ikeda, Kyoto (JP); Shogo Kurogi, Kyoto (JP); Kenji Ogata, Kyoto (JP)

(73) Assignee: DAI-ICHI SEIKO CO., LTD., Kyoto-Shi (JP)

( * ) Notice: Subject to any disclaimer, the term of this patent is extended or adjusted under 35 U.S.C. 154(b) by 211 days.

(21) Appl. No.: 15/579,435

(22) PCT Filed: Jun. 7, 2016

(86) PCT No.: PCT/JP2016/066967
§ 371 (c)(1),
(2) Date: Dec. 4, 2017

(87) PCT Pub. No.: WO2016/199780
PCT Pub. Date: Dec. 15, 2016

(65) Prior Publication Data
US 2018/0172982 A1    Jun. 21, 2018

(30) Foreign Application Priority Data
Jun. 9, 2015  (JP) .................................. 2015-116200

(51) Int. Cl.
*G02B 26/08* (2006.01)
*B81B 3/00* (2006.01)
*G02B 26/10* (2006.01)

(52) U.S. Cl.
CPC ........ *G02B 26/0858* (2013.01); *B81B 3/0051* (2013.01); *B81B 3/0062* (2013.01);
(Continued)

(58) Field of Classification Search
CPC ............. G02B 26/0858; G02B 26/103; G02B 26/101; G02B 26/105; B81B 3/0062;
(Continued)

(56) References Cited

U.S. PATENT DOCUMENTS 8,730,549 B2 * 5/2014 Aimono ............... G02B 26/101
                                                        359/224.1
2012/0327494 A1  12/2012 Koyama
2015/0022871 A1   1/2015 Naono

FOREIGN PATENT DOCUMENTS

JP  11-168246 A   6/1999
JP  2003-209981 A 7/2003
(Continued)

OTHER PUBLICATIONS

International Search Report, PCT/JP2016/066967, dated Aug. 16, 2016.
(Continued)

*Primary Examiner* — Euncha P Cherry
(74) *Attorney, Agent, or Firm* — Howard & Howard Attorneys PLLC

(57) ABSTRACT

A mirror with a reflective layer formed thereon is supported within a frame-shaped support by two U-shaped arms. A plate-like arm connects fixation points (Q1, Q2), and a plate-like arm connects fixation points (Q3, Q4). A pair of piezoelectric elements (E11, E12) disposed along a longitudinal axis (L1) on an upper surface of an outside bridge of the arm, and a single piezoelectric element (E20) disposed along the longitudinal axis (L2) on the upper surface of an inside bridge. Similarly, a pair of piezoelectric elements
(Continued)

(E31, E32) disposed on an upper surface of an outside bridge of the arm, and a single piezoelectric element (E40) disposed on the upper surface of an inside bridge. When a positive drive signal is applied to the piezoelectric elements (E11, E20, E31, E40) and a negative drive signal is applied to the piezoelectric elements (E12, E32), the mirror is displaced efficiently.

27 Claims, 26 Drawing Sheets

(52) U.S. Cl.
CPC .... *G02B 26/103* (2013.01); *B81B 2203/0109* (2013.01); *B81B 2203/04* (2013.01); *B81B 2203/056* (2013.01)

(58) Field of Classification Search
CPC ............ B81B 3/0051; B81B 2203/056; B81B 2203/04; B81B 2203/0109
USPC ...................................... 359/200.8
See application file for complete search history.

(56) References Cited

FOREIGN PATENT DOCUMENTS

| | | |
|---|---|---|
| JP | 2008-035600 A | 2/2008 |
| JP | 2008-096750 A | 4/2008 |
| JP | 2009-093120 A | 4/2009 |
| JP | 2010-148265 A | 7/2010 |
| JP | 2010-197994 A | 9/2010 |
| JP | 2013-160887 A | 8/2012 |
| JP | 2013-007780 A | 1/2013 |
| JP | 2013-205818 A | 10/2013 |
| JP | 2015-022064 A | 2/2015 |
| KR | 20030083927 A | 11/2003 |
| WO | 2014/050586 A1 | 4/2014 |

OTHER PUBLICATIONS

Written Opinion, PCT/JP2016/066967, dated Aug. 16, 2016.
Office Action (KR Application No. 10-2018-7000440); dated Jan. 22, 2019; Includes English Translation; 24 pages.

\* cited by examiner

NO DRIVE SIGNAL

CONCAVE-DEFORMATION DRIVE SIGNAL

CONVEX-DEFORMATION DRIVE SIGNAL

| NO. | DIMENSIONAL RATIO OF PIEZOELECTRIC ELEMENTS | $\beta/\alpha$ | AMOUNT OF DISPLACEMENT $D$ |
|---|---|---|---|
| 1 | $\alpha : \beta = 1 : 9$ | 9 | +0.47 |
| 2 | $\alpha : \beta = 2 : 8$ | 4 | +0.35 |
| 3 | $\alpha : \beta = 3 : 7$ | 2.3 | +0.31 |
| 4 | $\alpha : \beta = 4 : 6$ | 1.5 | +0.21 |
| 5 | $\alpha : \beta = 5 : 5$ | 1.0 | +0.15 |
| 6 | $\alpha : \beta = 6 : 4$ | 0.66 | −0.02 |
| 7 | $\alpha : \beta = 7 : 3$ | 0.42 | −0.08 |
| 8 | $\alpha : \beta = 8 : 2$ | 0.25 | −0.17 |
| 9 | $\alpha : \beta = 9 : 1$ | 0.1 | −0.31 |

| NO. | DIMENSIONAL RATIO OF PIEZOELECTRIC ELEMENTS | $\beta/\alpha$ | AMOUNT OF DISPLACEMENT $D$ |
|---|---|---|---|
| 1 | $\alpha:\beta=1:9$ | 9 | +0.188 |
| 2 | $\alpha:\beta=2:8$ | 4 | +0.176 |
| 3 | $\alpha:\beta=3:7$ | 2.3 | +0.168 |
| 4 | $\alpha:\beta=4:6$ | 1.5 | +0.167 |
| 5 | $\alpha:\beta=5:5$ | 1.0 | +0.145 |
| 6 | $\alpha:\beta=6:4$ | 0.66 | +0.116 |
| 7 | $\alpha:\beta=7:3$ | 0.42 | +0.084 |
| 8 | $\alpha:\beta=8:2$ | 0.25 | +0.053 |
| 9 | $\alpha:\beta=9:1$ | 0.1 | +0.046 |

| NO. | DIMENSIONAL RATIO OF PIEZOELECTRIC ELEMENTS | $\beta/\alpha$ | AMOUNT OF DISPLACEMENT $D$ |
|---|---|---|---|
| 1 | $\alpha:\beta=1:9$ | 9 | +0.53 |
| 2 | $\alpha:\beta=2:8$ | 4 | +0.50 |
| 3 | $\alpha:\beta=3:7$ | 2.3 | +0.50 |
| 4 | $\alpha:\beta=4:6$ | 1.5 | +0.43 |
| 5 | $\alpha:\beta=5:5$ | 1.0 | +0.29 |
| 6 | $\alpha:\beta=6:4$ | 0.66 | +0.28 |
| 7 | $\alpha:\beta=7:3$ | 0.42 | +0.28 |
| 8 | $\alpha:\beta=8:2$ | 0.25 | +0.17 |
| 9 | $\alpha:\beta=9:1$ | 0.1 | +0.10 |

# MOVABLE REFLECTION DEVICE AND REFLECTION SURFACE DRIVE SYSTEM UTILIZING SAME

CROSS-REFERENCE TO RELATED APPLICATIONS

The present application is a U.S. National Phase of International Application No. PCT/JP2016/066967, filed on Jun. 7, 2016, which claims the benefit of Japanese Patent Application No. 2015-116200, filed on Jun. 9, 2015, the disclosures of which are hereby incorporated by reference in their entirety.

TECHNICAL FIELD

The present disclosure relates to a movable reflective device and a reflective surface drive system using the movable reflective device.

BACKGROUND ART

A movable reflective device capable of tilting a reflective surface is used as a device for controlling the direction of light beams or directional radio waves. Particularly, the movable reflective device capable of tilting the reflective surface with two axes of freedom is used as an installed component for various electronic devices since such a movable reflective device can be used as a two-dimensional scanner for two-dimensional scanning of light beams or the like. For example, the movable reflective device additionally provided with a driver for supplying electrical signals can implement a reflective surface drive system with functions of controlling a reflective surface at an attitude, and thereby can be applied to a projector for projecting images, an onboard radar, or the like. The movable reflective device has been recently installed in a mobile device such as a smartphone, and micro electro mechanical system (MEMS) technology is used to put a compact and low-voltage driven device into practical use.

A typical movable reflective device currently in use has a configuration in which a mirror with a reflective surface is supported by plate-like arms and piezoelectric elements are attached to the plate-like arms. Application of a predetermined electrical signal to the piezoelectric elements causes desired deformation of the arms, which results in tilting of the mirror in a desired direction. Use of a direct-current signal as the electrical signal keeps the reflective surface at a desired attitude, while use of an alternating-current signal as the electrical signal vibrates the reflective surface in a desired direction.

For example, Patent Literature 1 below discloses a movable reflective device in which a mirror is driven by causing flexure of piezoelectric members. Patent Literature 2 discloses use of a so-called gimbal structure in which inner gimbal frame is attached to outer gimbal frame to be freely rotatable about a first rotation axis, and a mirror is attached within the inner gimbal frame to be freely rotatable about a second rotation axis perpendicular to the first rotation axis. Patent Literature 3 discloses a movable reflective device provided with a sensor for detection of stress on a connection so that a tilt angle of a mirror is detectable.

Patent Literature 4 discloses a reflective surface drive system that drives piezoelectric actuators with a sawtooth-waveform electrical signal. Patent Literature 5 discloses a MEMS-device reflective surface drive system having a projector function.

CITATION LIST

Patent Literature

Patent Literature 1: Unexamined Japanese Patent Application Kokai Publication No. 2003-209981.
Patent Literature 2: Unexamined Japanese Patent Application Kokai Publication No. 2009-093120.
Patent Literature 3: International Publication No. WO2014/050586.
Patent Literature 4: Unexamined Japanese Patent Application Kokai Publication No. 2013-205818
Patent Literature 5: Unexamined Japanese Patent Application Kokai Publication No. 2013-160887.

As described above, the typical movable reflective device uses a method that supplies an electrical signal to the piezoelectric elements attached to the plate-like arms to cause the piezoelectric elements to stretch and contract, and causes the arms to deform based on the stretching and contracting to displace the mirror. Such deformation of the plate-like arms caused by the stretching or contracting of the piezoelectric elements appears as upward or downward bow. In other words, the displacement of the mirror is deformation caused by bowing of the plate-like arms.

In general, a very large amount of displacement based on bow of a plate-like member is difficult to obtain. One approach to secure a sufficient amount of displacement as required is to adopt a turnaround structure of an extended plate-like arm having a U-shaped curved plan view shape so as to provide a large amount of displacement at the final end of the plate-like arm. Patent Literatures 2 to 5 listed above disclose a support structure for the mirror by the plate-like arms having the U-shaped plan view shape. These conventional movable reflective devices, however, do not necessarily provide the amount of displacement efficiently.

An objective of the present disclosure is to provide a movable reflective device, in which a mirror is supported by plate-like arms having a U-shaped plan view shape, with a new structure enabling a mirror to more efficiently provide an amount of displacement. Another objective of the present disclosure is to provide a reflective surface drive system capable of driving a movable reflective device having such a structure so as to obtain the amount of displacement more efficiently.

Solution to Problem (1) According to a first aspect of the present disclosure, a movable reflective device includes a mirror including a reflective surface; a support for supporting the mirror; an arm having one end connected to the support and another end connected to the mirror; and piezoelectric elements for causing the arm to deform in accordance with an electrical signal provided, a relative position of the mirror to the support being controllable by deformation of the arm caused by the piezoelectric elements, wherein the arm comprises n bridges and n+1 intermediate connectors, wherein n≥2, and the arm connects a predetermined portion of the support to a predetermined portion of the mirror along a single connection path, wherein the n bridges are plate-like structures extending along different predetermined longitudinal axis, wherein when one end of each bridge, closer to the support on the connection path, is referred to as a proximal end, and another end of each bridge, closer to the mirror on the connection path, is referred to as a distal end, a first intermediate connector connects the predetermined portion of the support to the proximal end of a first bridge, an ith intermediate connector connects the distal end of an (i−1)th bridge to the proximal end of an ith bridge, and an (n+1)th intermediate connector connects the distal end of an nth bridge to the predetermined portion of the mirror, where 2≤i≤n, wherein each of the first to (n−1)th bridges includes a proximal-end-side piezoelectric element arranged on a proximal-end side and a distal-end-side piezoelectric element arranged on a distal-end side, and the nth bridge includes a lengthwise piezoelectric element extending from a vicinity of the proximal end to a vicinity of the distal end, and wherein each of the proximal-end-side piezoelectric element, the distal-end-side piezoelectric element, and the lengthwise piezoelectric element is disposed on an upper surface or a lower surface of the corresponding bridge, and stretches and contracts a surface of the corresponding bridge along the longitudinal axis in accordance with the electrical signal provided.

(2) According to a second aspect of the present disclosure, in the movable reflective device of the first aspect described above, a pair of piezoelectric elements disposed on each of the first to (n−1)th bridges consists of a piezoelectric element having a first length and a piezoelectric element having a second length along the longitudinal axis of the bridge, the first length being longer than the second length, and when the piezoelectric element having the first length is referred to as a long element and the piezoelectric element having the second length is referred to as a short element, for an odd-numbered bridge, the proximal-end-side piezoelectric element is the short element and the distal-end-side piezoelectric element is the long element, and for an even-numbered bridge, the proximal-end-side piezoelectric element is the long element and the distal-end-side piezoelectric element is the short element.

(3) According to a third aspect of the present disclosure, in the movable reflective device of the second aspect described above, a dimensional ratio $\beta/\alpha$ is set to be 1.5 or more for each of the first to (n−1)th bridge, where $\alpha$ is a dimension of the short element and $\beta$ is a dimension of the long element.

(4) According to a fourth aspect of the present disclosure, in the movable reflective device of any one of the first to third aspects described above, the support is a frame structure, the mirror and the arm are disposed inside the frame structure, and the first intermediate connector of the arm is fixed to an inner surface of the frame structure.

(5) According to a fifth aspect of the present disclosure, in the movable reflective device of any one of the first to fourth aspects described above, the longitudinal axis of each bridge is parallel to a predetermined common reference axis.

(6) According to a sixth aspect of the present disclosure, in the movable reflective device of the fifth aspect described above, when an XYZ three-dimensional orthogonal coordinate system is defined, the n bridges and n+1 intermediate connectors that are included in the arm include upper surfaces contained in an XY plane and lower surfaces contained in a predetermined plane parallel to the XY plane, and the longitudinal axes of the n bridges are set to be axes parallel to a Y axis that is the common reference axis.

(7) According to a seventh aspect of the present disclosure, in the movable reflective device of the sixth aspect described above, each piezoelectric element includes a piezoelectric material layer expanding in directions parallel to the XY plane, an upper electrode formed on an upper surface of the piezoelectric material layer, and a lower electrode formed on a lower surface of the piezoelectric material layer, and each piezoelectric element has a property of stretching and contracting in a direction parallel to the XY plane upon application of voltage across the upper electrode and the lower electrode.

(8) According to an eighth aspect of the present disclosure, in the movable reflective device of the seventh aspect described above, each piezoelectric element is disposed on the upper surface of the corresponding bridge, and the lower electrode is fixed on the upper surface of the corresponding bridge.

(9) According to a ninth aspect of the present disclosure, in the movable reflective device of the eighth aspect described above, each piezoelectric element includes the upper electrode, the piezoelectric material layer, and the lower electrode, and orthogonal projection images of the upper electrode, the piezoelectric material layer, and the lower electrode, obtained by orthogonal projection onto the XY plane, are overlaid with one another.

(10) According to a tenth aspect of the present disclosure, in the movable reflective device of the eighth described above, a common lower electrode is formed on an upper surface of the arm, the separate piezoelectric material layers for forming the corresponding piezoelectric elements are formed at predetermined positions on an upper surface of the common lower electrode, the separate upper electrodes are formed on the upper surfaces of the corresponding piezoelectric material layers, and the common lower electrode includes areas in which the separate piezoelectric material layers are formed, the areas serving as the lower electrodes for the corresponding piezoelectric elements.

(11) According to an eleventh aspect of the present disclosure, in the movable reflective device of the eighth aspect described above, a common lower electrode is formed on an upper surface of the arm, a common piezoelectric material layer is formed on an upper surface of the common lower electrode, and separate upper electrodes for forming separate piezoelectric elements are formed on an upper surface of the common piezoelectric material layer, and the common piezoelectric material layer includes areas in which the separate upper electrodes are formed, the areas serving as the piezoelectric material layers of the separate piezoelectric elements, and the common lower electrodes include areas in which the separate upper electrodes are formed, the areas serving as lower electrodes of the separate piezoelectric elements.

(12) According to a twelfth aspect of the present disclosure, in the movable reflective device of any one of the first to eleventh aspects described above, the arm includes one or more U-shaped structures each including a plate-like member having a U-shaped plan view shape.

(13) According to a thirteenth aspect of the present disclosure, in the movable reflective device of any one of the first to twelfth aspects described above, the arm includes a first arm and a second arm, and the first arm is disposed along a first connection path connecting a first fixation point located on the support to a second fixation point located on the mirror, and the second arm is disposed along a second connection path connecting a third fixation point located on the support and a fourth fixation point located on the mirror.

(14) According to a fourteenth aspect of the present disclosure, in the movable reflective device of the thirteenth aspect described above, the mirror includes a rectangular plate-like member, and the first arm and the second arm are connected to vicinities of any of four corners of a rectangle formed by the plate-like member.

(15) According to a fifteenth aspect of the present disclosure, in the movable reflective device of the thirteenth aspect described above, the mirror includes a rectangular plate-like member, the first arm is connected to a central portion of a first side of a rectangle formed by the plate-like member, and the second arm is connected to a central portion of a second side of the rectangle, the first side being opposite to the second side.

(16) According to a sixteenth aspect of the present disclosure, in the movable reflective device of any one of the first to twelfth aspects described above, the arm includes first to fourth arms, the first arm is disposed along a first connection path connecting a first fixation point located on the support to a second fixation point located on the mirror, the second arm is disposed along a second connection path connecting a third fixation point located on the support to a fourth fixation point located on the mirror, the third arm is disposed along a third connection path connecting a fifth fixation point located on the support to a sixth fixation point located on the mirror, and the fourth arm is disposed along a fourth connection path connecting a seventh fixation point located on the support to an eighth fixation point located on the mirror, and the mirror includes a rectangular plate-like member, and the first to fourth arms are connected to respective vicinities of first to fourth corners of a rectangle formed by the plate-like member.

(17) According to a seventeenth aspect of the present disclosure, a composite movable reflective device includes first and second movable reflective devices of any one of first to sixteenth aspects described above, wherein the mirror of the first movable reflective device is displaced with an entirety of the second movable reflective device, wherein the support of the first movable reflective device is connected to the support of the second movable reflective device by the arm of the first movable reflective device, and a relative position of the support of the second movable reflective device to the support of the first movable reflective device is controllable by deformation of the arm of the first movable reflective device caused by the piezoelectric elements of the first movable reflective device, and wherein the support of the second movable reflective device is connected to the mirror of the second movable reflective device by the arm of the second movable reflective device, and a relative position of the mirror of the second movable reflective device to the support of the second movable reflective device is controllable by deformation of the arm of the second movable reflective device caused by the piezoelectric elements of the second movable reflective device.

(18) According to an eighteenth aspect of the present disclosure, a composite movable reflective device includes first and second movable reflective devices of any one of fifth to eleventh aspects described above, wherein the mirror of the first movable reflective device is replaced with an entirety of the second movable reflective device, wherein the support of the first movable reflective device is connected to the support of the second movable reflective device by the arm of the first movable reflective device, and a relative position of the support of the second movable reflective device to the support of the first movable reflective device is controllable by deformation of the arm of the first movable reflective device caused by the piezoelectric elements of the first movable reflective device, wherein the support of the second movable reflective device is connected to the mirror of the second movable reflective device by the arm of the second movable reflective device, and a relative position of the mirror of the second movable reflective device to the support of the second movable reflective device is controllable by deformation of the arm of the second movable reflective device caused by the piezoelectric elements of the second movable reflective device, and wherein the common reference axis of the first movable reflective device is disposed perpendicular to the common reference axis of the second movable reflective device.

(19) According to a nineteenth aspect of the present disclosure, a reflective surface drive system includes the movable reflective device or the composite movable reflective device of any one of the first to eighteenth aspects described above, and a driver for driving the piezoelectric elements of the movable reflective device or the composite movable reflective device by supplying drive signals to the movable reflective device or the composite movable reflective device, wherein the arm included in the movable reflective device includes a plate-like member disposed in a predetermined plane, wherein the driver has a function of selectively supplying, to each piezoelectric element, a concave-deformation drive signal for causing areas of the bridges in which the piezoelectric elements are disposed, to deform to bow convexly downward along the longitudinal direction, and a convex-deformation drive signal for causing the areas of the bridges in which the piezoelectric elements are disposed, to deform to bow convexly upward along the longitudinal direction, and wherein when the driver controls the mirror to have a predetermined attitude, the driver supplies, as electrical signals for supply to a particular arm, a first drive signal to the proximal-end-side piezoelectric element and the lengthwise piezoelectric element of the particular arm, and a second drive signal to the distal-end-side piezoelectric element of the particular arm, the first drive signal being one of the concave-deformation drive signal and the convex-deformation drive signal, the second drive signal being the other thereof.

(20) According to a twentieth aspect of the present disclosure, in the reflective surface drive system of the nineteenth aspect described above, for upward displacement of an end portion of the arm, fixed to the mirror, the driver supplies the concave-deformation drive signal to the proximal-end-side piezoelectric element and the lengthwise piezoelectric element of the arm, and supplies the convex-deformation drive signal to the distal-end-side piezoelectric element of the arm, and for downward displacement of the end portion of the arm, fixed to the mirror, the driver supplies the convex-deformation drive signal to the proximal-end-side piezoelectric element and the lengthwise piezoelectric element of the arm, and supplies the concave-deformation drive signal to the distal-end-side piezoelectric element of the arm.

(21) According to a twenty-first aspect of the present disclosure, in the reflective surface drive system of the nineteenth or the twentieth aspect described above, the driver controls the mirror to keep a predetermined attitude to the support by supplying a direct-current drive signal to each piezoelectric element.

(22) According to a twenty-second aspect of the present disclosure, in the reflective surface drive system of the nineteenth or the twentieth aspect described above, the driver controls periodic motion of the mirror relative to the support by supplying to each piezoelectric element an alternating-current drive signal in which the concave-deformation drive signal and the convex-deformation drive signal are alternately repeated periodically.

(23) According to a twenty-third aspect of the present disclosure, a movable reflective device includes a mirror including a reflective surface; a support for supporting the mirror; an arm having one end connected to the support and another end connected to the mirror; and piezoelectric elements for causing the arm to deform in accordance with an electrical signal provided, a relative position of the mirror to the support being controllable by deformation of the arm caused by the piezoelectric elements, wherein the arm comprises n bridges and n+1 intermediate connectors, where n≥2, and the arm connects a predetermined portion of the support to a predetermined portion of the mirror along a single connection path, wherein the n bridges are plate-like structures extending along different predetermined longitudinal axes, wherein when one end of each bridge, closer to the support on the connection path, is referred to as a proximal end, and another end of each bridge, closer to the mirror on the connection path, is referred to as a distal end, a first intermediate connector connects the predetermined portion of the support to the proximal end of a first bridge, an ith intermediate connector connects the distal end of an (i−1)th bridge to the proximal end of an ith bridge, and an (n+1)th intermediate connector connects the distal end of an nth bridge to the predetermined portion of the mirror, where 2≤i≤n, wherein each of the first to (n−1)th bridges includes a proximal-end-side piezoelectric element arranged on a proximal-end side and a distal-end-side piezoelectric element arranged on a distal-end side, wherein each of the proximal-end-side piezoelectric element and the distal-end-side piezoelectric element is disposed on an upper surface or a lower surface of the associated bridge, and stretches and contracts a surface of the associated bridge along the longitudinal axis in accordance with the electrical signal provided, and wherein a pair of piezoelectric elements disposed on each of the first to (n−1)th bridges consists of a piezoelectric element having a first length and a piezoelectric element having a second length along the longitudinal axis of the bridge, the first length being longer than the second length, and when the piezoelectric element having the first length is referred to as a long element and the piezoelectric element having the second length is referred to as a short element, for an odd-numbered bridge, the proximal-end-side piezoelectric element is the short element and the distal-end-side piezoelectric element is the long element, and for an even-numbered bridge, the proximal-end-side piezoelectric element is the long element and the distal-end-side piezoelectric element is the short element.

(24) According to the twenty-fourth aspect of the present disclosure, in the movable reflective device of the twenty-third aspect described above, a dimensional ratio $\beta/\alpha$ is set to be 1.5 or more for each of the first to (n−1)th bridge, where $\alpha$ is a dimension of the short element and $\beta$ is a dimension of the long element.

(25) According to the twenty-fifth aspect of the present disclosure, in the movable reflective device of the twenty-third or twenty-fourth aspect described above, the nth bridge includes the proximal-end-side piezoelectric element arranged on the proximal-end side and the distal-end-side piezoelectric element arranged on the distal-end side.

(26) According to the twenty-sixth aspect of the present disclosure, in the movable reflective device of any one of the twenty-third to twenty-fifth aspects described above, the longitudinal axis of each bridge is parallel to a predetermined common reference axis.

(27) According to the twenty-seventh aspect of the present disclosure, in the movable reflective device of the twenty-sixth aspect described above, when an XYZ three-dimensional orthogonal coordinate system is defined, the n bridges and n+1 intermediate connectors that are included in the arm include upper surfaces contained in an XY plane and lower surfaces contained in a predetermined plane parallel to the XY plane, and the longitudinal axes of the n bridges are set to be axes parallel to a Y axis that is the common reference axis.

Advantageous Effects of Invention

In the movable reflective device of the present disclosure, the mirror is supported by the plate-like arms having the U-shaped plan view shape. A bridge, which is the closest to the mirror, of a plurality of n bridges included in an arm includes a lengthwise piezoelectric element, and the other bridges include the proximal-end-side piezoelectric element and the distal-end-side piezoelectric element. Thus a new structure enabling the mirror to more efficiently provide an amount of displacement can be achieved. In addition, a reflective surface drive system can be achieved that is capable of driving a movable reflective device having such a structure so as to obtain an amount of displacement more efficiently.

Embodiments having different lengths of piezoelectric elements, in which one of the proximal-end-side piezoelectric element and the distal-end-side piezoelectric element disposed on the same bridge is referred to as a short element and the other is referred to as a long element, can achieve further increase in the amount of displacement of the mirror. In particular, the amount of displacement of the mirror can be increased effectively when a dimensional ratio $\beta/\alpha$ is set to be 1.5 or more, where $\alpha$ is a dimension of the short element and $\beta$ is a dimension of the long element.

DESCRIPTION OF EMBODIMENTS

The present disclosure is described below based on some embodiments with reference to the drawings.

Section 1. Common Movable Reflective Device Using Plate-Like Arm

Figure 1A:
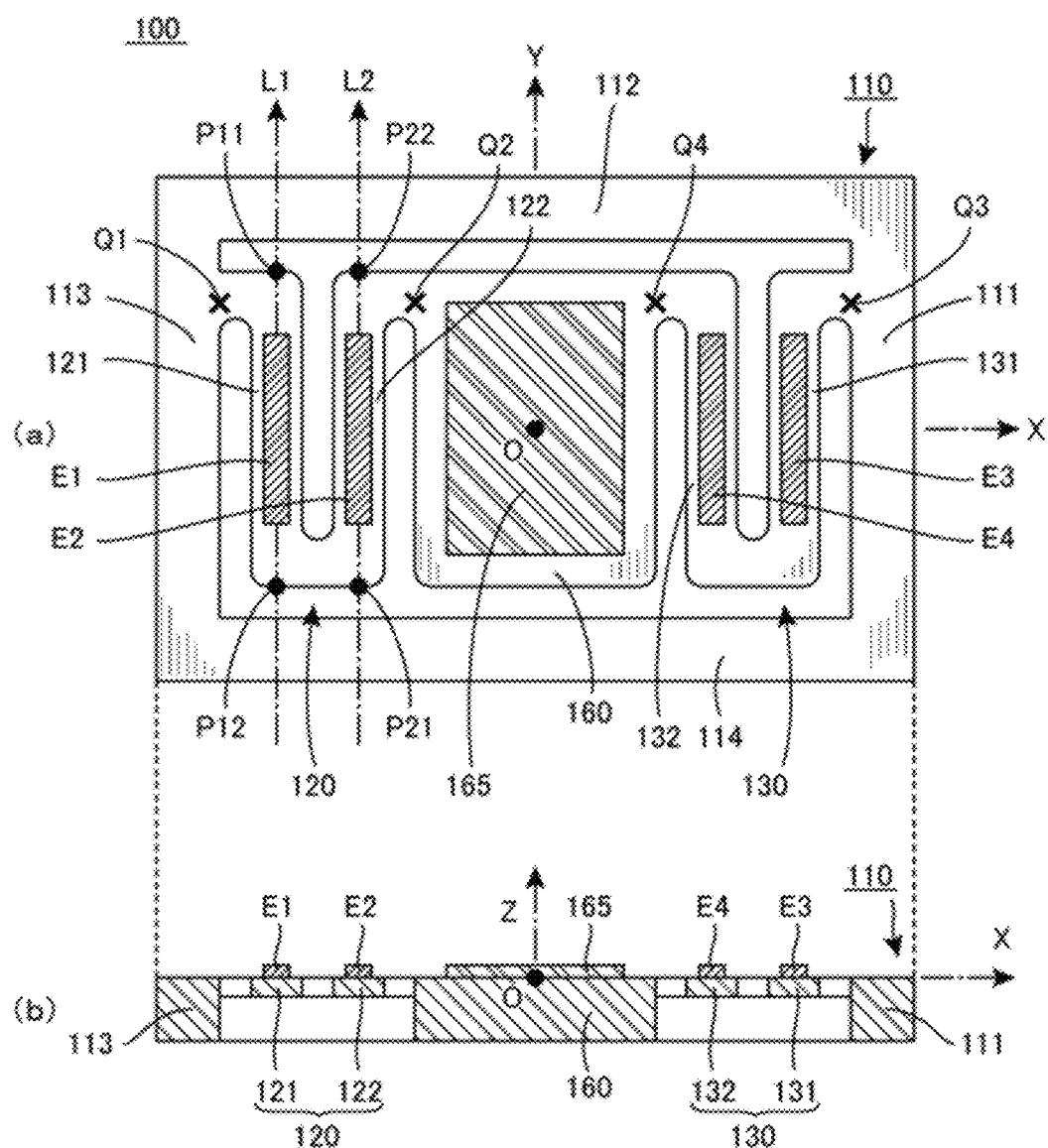
FIG. 1AB illustrates (a) a top view of a conventional two-element movable reflective device and (b) a front cross-sectional view taken along an XZ plane (the hatches i FIG. 1AB are not intended to indicate the cross-section, but to indicate individual areas)
Figure 1C:
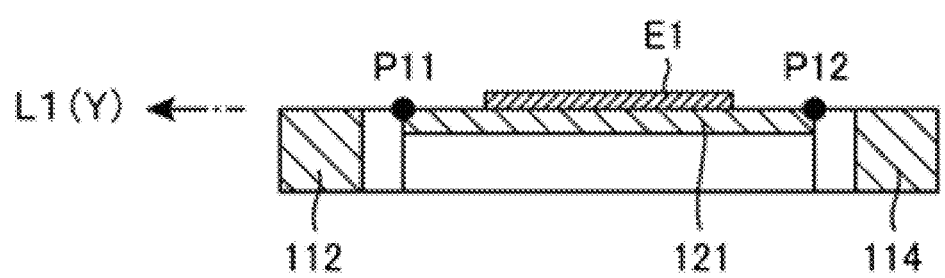
FIG. 1C is a side cross-sectional view taken along an axis L1.

Initially, a basic structure of a movable reflective device using plate-like arms is described. FIGS. 1AB and 1C illustrate a typical conventional movable reflective device 100. The view (a) of FIG. 1AB is a top view thereof, the view (b) of FIG. 1AB is a front cross-sectional view thereof, and FIG. 1C is a side cross-sectional view thereof. For convenience, as illustrated, an XYZ three-dimensional orthogonal coordinate system is defined herein for the following description.

As illustrated in the top view (a) of FIG. 1AB, the basic structure of the movable reflective device 100, which includes plate-like members expanding in the XY plane, include a support 110 having a rectangular frame structure, two U-shaped arms 120 and 130, and a mirror 160 that is a rectangular plate-like member centrally located. Here, for convenience of description, the XYZ three-dimensional orthogonal coordinate system is defined by taking the upper surface of the basic structure as the XY plane and taking the central position of the upper surface of the mirror 160 as the origin O. The axes L1 and L2 illustrated in (a) of FIG. 1AB are longitudinal axes parallel to the Y axis.

In the top view (a) of FIG. 1AB, the direction pointing to the right in the drawing is a positive X direction, the direction pointing up in the drawing is the positive Y direction, and the direction pointing out of the paper plane of the drawing is the positive Z direction. The front cross-sectional view (b) of FIG. 1AB is a cross sectional view of the movable reflective device 100 taken along the XZ plane, in which the direction pointing to the right in the drawing is the positive X direction and the direction pointing up in the drawing is the positive Z direction. FIG. 1C, which is the side cross-sectional view, is a cross-sectional view of the movable reflective device 100 taken along the longitudinal axis L1, in which the direction pointing to the left in the drawing is the positive Y (L1 axis) direction and the direction pointing up in the drawing is the positive Z direction.

As illustrated in (a) of FIG. 1AB, the support 110 is a rectangular frame structure including four frame portions of a right side frame portion 111, an upper side frame portion 112, a left side frame portion 113, and a lower side frame portion 114, and serves to support the mirror 160. The support 110 and the mirror 160 are connected by the two arms 120 and 130. The first arm 120 serves to connect a fixation point Q1 on the left side frame portion 113 to a fixation point Q2 on the left side of the mirror 160 along a U-shaped path. The second arm 130 serves as connecting a fixation point Q3 on the right side frame portion 111 to a fixation point Q4 on the right side of the mirror 160 along a U-shaped path.

The first arm 120 includes a first bridge 121 extending along the longitudinal axis L1 parallel to the Y axis and a second bridge 122 extending along the longitudinal axis L2 parallel to the Y axis. Similarly, the second arm 130 includes a first bridge 131 and a second bridge 132 extending along the respective longitudinal axes parallel to the Y axis. The bridges 121, 122, 131, and 132 are provided on the upper surfaces thereof with respective piezoelectric elements E1, E2, E3, and E4. The mirror 160 is provided on the upper surface with a reflective layer 165 having a reflective surface. In the example provided here, the movable reflective device 100 has a YZ-plane symmetrical structure. Similarly, the movable reflective devices 100A to 100FF illustrated in FIGS. 7 to 21 described below each have a YZ-plane symmetrical structure. The hatches in (a) of FIG. 1AB are not intended to indicate the cross section, but to indicate areas where the piezoelectric elements E1 to E4 and the reflective layer 165 are formed (the same applies to the top view mentioned in the following description).

Here, as illustrated in (b) of FIG. 1AB, as the upper surface of the basic structure (an integral plate-like member having the support 110, the arms 120 and 130, and the mirror 160) of the movable reflective device 100 is taken as the XY plane, the lower surfaces of the piezoelectric elements E1 to E4 and the lower surface of the reflective layer 165 are located in the XY plane. In this example, a plate-like member used as the basic structure has on the order of 3.0 mm length and 4.5 mm width, and the bridges 121, 122, 131, and 132 each have on the order of 2.0 mm length. The thicknesses (e.g., 0.01 mm) of the first arm 120 including the bridges 121 and 122 and the second arm 130 including the bridges 131 and 132 are set to be smaller than the thicknesses (e.g., 0.50 mm) of the support 110 (each frame portions 111 to 114) and the mirror 160 (for convenience of description, dimensional ratios of the drawings differ from dimensional ratios in actual use). Due to such configuration, although the support 110 and the mirror 160 have sufficient rigidity, a certain degree of elastic deformation occurs in the arms 120 and 130. This elastic deformation changes a relative position of the mirror 160 to the support 110.

As illustrated in (a) of FIG. 1AB, predetermined positions (positions of points of intersection between the longitudinal axes L1 and L2 and the both ends of the bridges 121 and 122) on the upper surface of the first arm 120 are taken as reference points P11, P12, P21, and P22. FIG. 1C depicts two reference points P11 and P12 from among these reference points, which are located at both the ends of the bridge 121 in the upper surface thereof. Similarly, the reference points P21 and P22 are located at both the ends of the bridge 122 in the upper surface thereof. The reference points P11 to P22 are used for description of displacement due to bow of the arm 120 in Section 2 below.

Figure 2A:
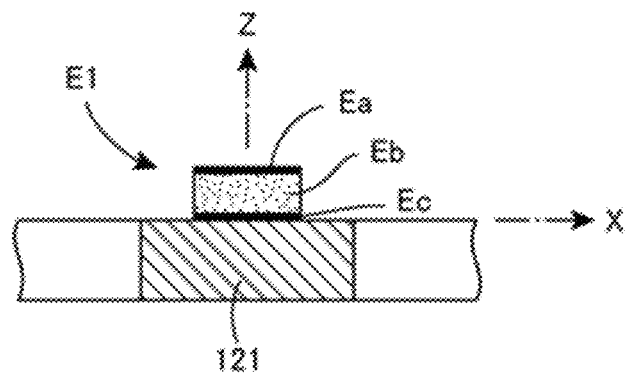
FIG. 2A is a front cross-sectional view illustrating a detailed layer structure of a piezoelectric element E1 illustrated in FIG. 1AB.

FIG. 2A is a front cross-sectional view illustrating a detailed layer structure of the piezoelectric element E1 illustrated in FIG. 1AB, and corresponds to an enlarged view of the vicinity of the piezoelectric element E1 illustrated in (b) of FIG. 1AB. For convenience of illustration, the view (b) of FIG. 1AB and FIG. 1C depict each of the piezoelectric elements E1 to E4 as a single layer, but each piezoelectric element actually has a three-layer structure. The same layer structure illustrated in FIG. 2A, which is a front cross-sectional view illustrating the layer structure of the piezoelectric element E1, applies to the other piezoelectric elements E2 to E4.

As illustrated in FIG. 2A, the piezoelectric element E1 has a three-layer structure of an upper electrode Ea, a piezoelectric material layer Eb, and a lower electrode Ec. The piezoelectric material layer Eb is, for example, a layer of material (material exhibiting piezoelectric properties), such as lead zirconate titanate (PZT), and the upper electrode Ea and the lower electrode Ec are electrodes used for applying voltages to the piezoelectric material layer Eb in up/down directions thereof. Such a pair of electrodes Ea and Ec may include electrically conductive layers of typical electrically conductive material (e.g., metals including aluminum, copper, and the like). The material used for the piezoelectric material layer Eb is a material that exhibits piezoelectric properties in that stretching and contracting of the piezoelectric material layer Eb occurs in the horizontal direction of the drawing when the electrical field is applied in the vertical direction of the drawing.

In the piezoelectric element E1 illustrated in FIG. 2A, when a voltage of predetermined polarity is applied across the upper electrode Ea and the lower electrode Ec, the piezoelectric material layer Eb deforms to stretch and contract in the horizontal direction (the direction pointing to left and right of the drawing and the direction perpendicular to the paper plane of the drawing), and thus contraction stress is applied to the upper surface of the bridge 121. As a result, bowing of the bridge 121 occurs as described below.

Again, each piezoelectric element E1 to E4 includes the piezoelectric material layer Eb expanding in directions parallel to the XY plane, the upper electrode Ea formed on the upper surface of the piezoelectric material layer Eb, and the lower electrode Ec formed on the lower surface of the piezoelectric material layer Eb. Each piezoelectric element E1 to E4 has properties of stretching and contracting in a direction parallel to the XY plane upon application of voltage across the upper electrode Ea and the lower electrode Ec.

In the illustrated example, each piezoelectric element E1 to E4 is disposed on the upper surface of the corresponding bridge 121, 122, 131, and 132, and each lower electrode Ec is fixed on the upper surface of the corresponding bridge. However, the piezoelectric element is not necessarily disposed on the upper surface of each bridge in practicing the present disclosure. For example, each piezoelectric element E1 to E4 may be disposed on the lower surface of the corresponding bridge 121, 122, 131, and 132. In this case, each upper electrode Ea may be fixed on the lower surface of the corresponding bridge. Of course, some piezoelectric elements may be disposed on the upper surfaces of the bridges and the other piezoelectric elements may be disposed on the lower surfaces of the bridges.

Figure 2B:
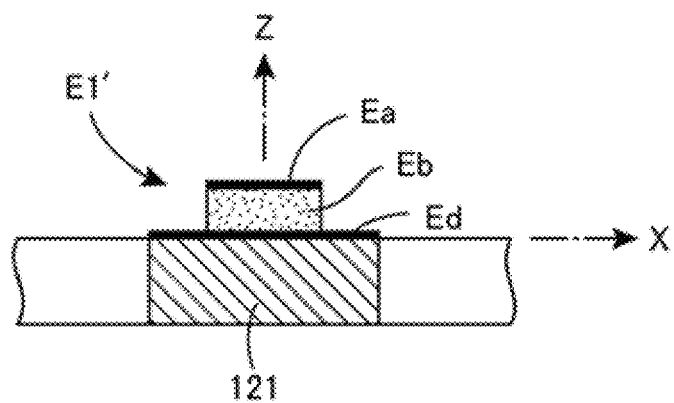
FIG. 2B is a front cross-sectional view (cross-sectional view taken along the XZ plane) illustrating a first variation of the layer structure.
Figure 2C:
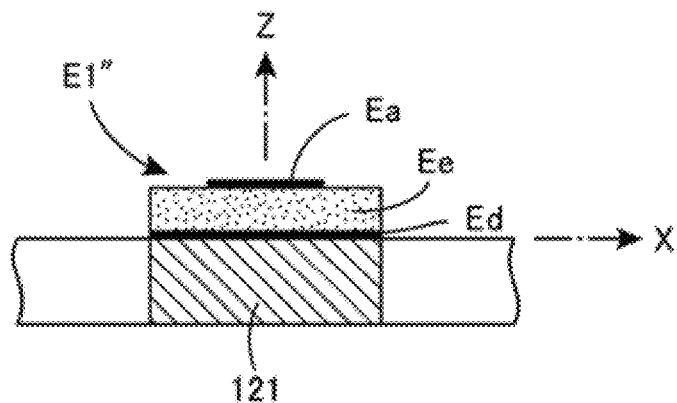
FIG. 2C is a front cross-sectional view (cross-sectional view taken along the XZ plane) illustrating a second variation of the layer structure.

FIGS. 2B and 2C are front cross-sectional views illustrating variations of the piezoelectric element E1 illustrated in FIG. 2A. The variation illustrated in FIG. 2B is an example in which a common lower electrode Ed is provided instead of the lower electrodes Ec illustrated in FIG. 2A. The common lower electrode Ed is an electrically conductive layer formed on the entire upper surface of the first arm 120, and serves as the lower electrode of the piezoelectric element E1 as well as the lower electrode of the piezoelectric element E2.

In other words, in the variation illustrated in FIG. 2B, a portion (portion corresponding to an area hatched with oblique lines and indicating the piezoelectric element E1 of (a) of FIG. 1AB) of the common lower electrode Ed that is a physically single electrically conductive layer, serves as the lower electrode of the piezoelectric element E1, while the other portion (portion corresponding to an area hatched with oblique lines and indicating the piezoelectric element E2 of (a) of FIG. 1AB) serves as the lower electrode of the piezoelectric element E2. Of course, the lower electrodes for both the piezoelectric elements E1 and E2 conduct and are kept at an equal potential. In FIG. 2B, the piezoelectric element using the common lower electrode Ed is given the reference sign, E1', for convenience.

In contrast, the variation illustrated in FIG. 2C provides an example in which a common piezoelectric material layer Ee is provided instead of the piezoelectric material layer Eb in the variation illustrated in FIG. 2B. The common piezoelectric material layer Ee is a piezoelectric material layer formed on the entire upper surface of the common lower electrode Ed, and serves as the piezoelectric material layer of the piezoelectric element E1 as well as the piezoelectric material layer of the piezoelectric element E2.

In other words, in the variation illustrated in FIG. 2C, a portion (portion covered with the upper electrode Ea of the piezoelectric element E1) of the common lower electrode Ed that is a physically single electrically conductive layer, serves as the lower electrode of the piezoelectric element E1, and the other portion (portion covered with the upper electrode Ea of the piezoelectric element E1) of the common piezoelectric material layer Ee that is a physically single piezoelectric material layer, serves as the piezoelectric material layer of the piezoelectric element E1. The other portion (portion covered with the upper electrode Ea of the piezoelectric element E2) of the common lower electrode Ed that is a physically single electrically conductive layer serves as the lower electrode of the piezoelectric element E2, and the other portion (portion covered with the upper electrode Ea of the piezoelectric element E2) of the common piezoelectric material layer Ee that is a physically single piezoelectric material layer serves as the piezoelectric material layer of the piezoelectric element E2. In FIG. 2C, the piezoelectric element using the common lower electrode Ed and the common piezoelectric material layer Ee is given the reference sign, E1", for convenience.

Again, when the piezoelectric elements having the respective layer structure as in the piezoelectric element E1 illustrated in FIG. 2A are used as each of the four piezoelectric elements E1 to E4 illustrated in FIG. 1AB, each piezoelectric element E1 to E4 individually includes the separate upper electrode Ea, the separate piezoelectric material layer Eb, and the separate lower electrode Ec. In this case, orthogonal projection images of the upper electrode Ea, the piezoelectric material layer Eb, and the lower electrode Ec for each piezoelectric element, obtained by orthogonal projection to the XY plane, are overlaid with one another (the orthogonal projection images each have an area hatched with oblique lines in (a) of FIG. 1AB).

In contrast, when the piezoelectric element having the layer structure as in the piezoelectric element E1' illustrated in FIG. 2B is used as each of the four piezoelectric elements E1 to E4 illustrated in FIG. 1AB, first, the common lower electrode Ed may be formed on the upper surfaces of the first arm 120 and the second arm 130, then each of the piezoelectric material layers Eb individually forming the respective piezoelectric elements may be formed at a given corresponding location (area hatched with oblique lines in (a) of FIG. 1AB) on the upper surface of the common lower electrode Ed, and finally each of the upper electrodes Ea may be formed on the upper surface of the separate piezoelectric material layer Eb. With this configuration, the areas (areas hatched with oblique lines in (a) of FIG. 1AB) of the common lower electrode Ed, in which areas the separate piezoelectric material layers Eb are formed, serve as the lower electrodes Ec of the separate piezoelectric elements.

Alternatively, when the piezoelectric element having the layer structure as in the piezoelectric element E1″ illustrated in FIG. 2C is used as each of the four piezoelectric elements E1 to E4 illustrated in FIGS. 1AB and 1C, first, the common lower electrode Ed may be formed on the upper surfaces of the first arm 120 and the second arm 130, then the common piezoelectric material layer Ee may be formed on the upper surface of the common lower electrode Ed, and finally each of the upper electrodes Ea individually forming the respective piezoelectric elements may be formed at a given corresponding location (area hatched with oblique lines in (a) of FIG. 1 AB) on the upper surface of the common piezoelectric material layer Ee. With this configuration, the areas (areas hatched with oblique lines in (a) of FIG. 1 AB) of the common piezoelectric material layer Ee, in which areas the separate upper electrodes Ea are formed, serve as the piezoelectric material layers Eb of the separate piezoelectric elements, and the areas of the common lower electrode Ed, in which areas the separate upper electrodes Ea are formed, serve as the lower electrodes Ec of the separate piezoelectric elements.

As described above, the lower electrode Ed is common in a plurality of piezoelectric elements when the layer structure illustrated in FIG. 2B is used, and the piezoelectric material layer Ee is additionally common when the layer structure illustrated in FIG. 2C is used. However, in either case, the upper electrodes Ea are separate discrete electrodes, thus enabling the piezoelectric elements to operate as the separate and independent piezoelectric elements. In short, even if any layer structure of FIG. 2A, 2B, or 2C is selected, the portions that substantially serve as the piezoelectric elements are portions in which the separate upper electrodes Ea are formed, and thus the planar arrangement of the piezoelectric elements occurs in the four areas hatched with oblique lines in (a) of FIG. 1 AB and is the same in any of the layer structures of FIGS. 2A, 2B, and 2C.

In the following description of the present disclosure, the arrangement of the piezoelectric elements provided in the arms is illustrated in the areas hatched with the oblique lines in the top view as in (a) of FIG. 1 AB. However, the actual layer structure of the piezoelectric element may by any layer structure of FIG. 2A, 2B, or 2C. When the layer structure of FIG. 2A is used, the areas hatched with the oblique lines in the top view represent the arrangement of the separate piezoelectric elements having the three layer structure, while when the layer structure of FIG. 2B or 2C is used, the areas hatched with the oblique lines in the top view represent the arrangement of the separate upper electrodes among the piezoelectric elements having the three-layer structure.

When the layer structure of FIG. 2B or 2C is used, the entire upper surface area of the first arm 120 and the entire upper surface area of the second arm 130 can be each used as an area in which the common lower electrode Ed or the common piezoelectric material layer Ee is formed. However, use of the entire upper surface area of the basic structure including the support 110 and the mirror 160 as the area for such formation is preferable in practice.

For example, when the layer structure of FIG. 2C is used, the common lower electrode Ed may be formed on the entire upper surface of the basic structure including the support 110, the arms 120 and 130, and the mirror 160, then the common piezoelectric material layer Ee may be formed on the entire upper surface, and then each of the separate upper electrodes Ea may be formed at a given corresponding location (area hatched with the oblique lines in (a) of FIG. 1AB) of the upper surface of the common piezoelectric material layer Ed. In this case, if the upper electrode Ea is also formed on the mirror 160, the upper electrode Ea (area hatched with the double oblique lines in (a) of FIG. 1AB) formed on the mirror 160 can be used as the reflective layer 165. Selection of such a layer structure simplifies a fabrication process. When the arms 120 and 130 are made of an electrically conductive material such as metal, since the upper layer portions of the arms can be used as the common lower electrode Ed, forming an additional common lower electrode is not necessary.

Figure 3A:
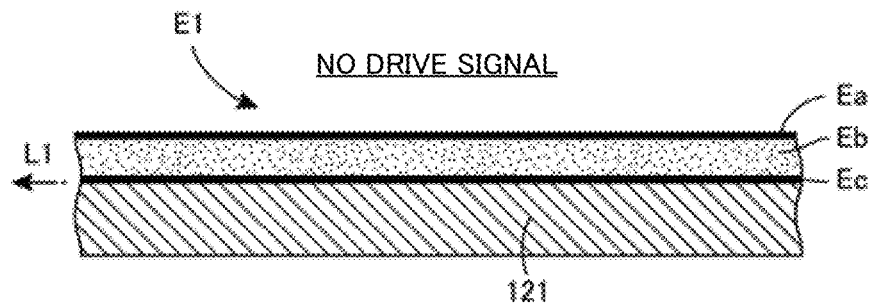
FIG. 3A is a side cross-sectional view (cross-sectional view taken along the axis L1) of a bridge 121 illustrated in FIG. 1AB.
Figure 3B:
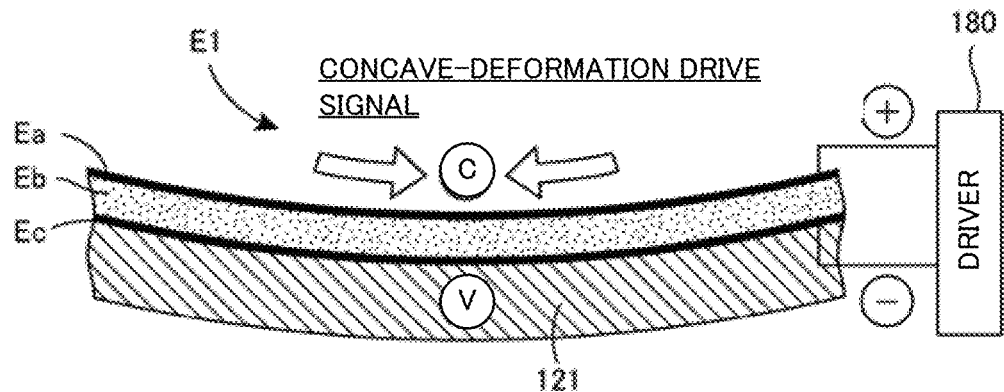
FIG. 3B is a side cross-sectional view illustrating a first deformed shape of the bridge 121 caused by application of voltage with a predetermined polarity to the piezoelectric element E1 illustrated in FIG. 1AB.
Figure 3C:
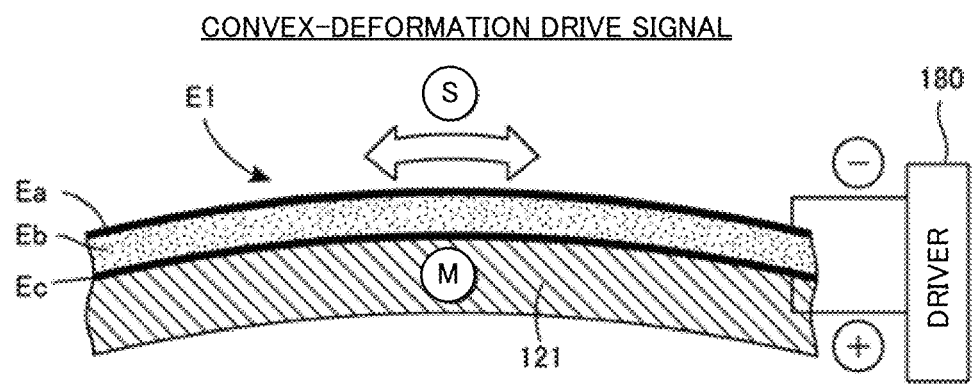
FIG. 3C is a side cross-sectional view illustrating a second deformed shape of the bridge 121 caused by application of voltage with a predetermined polarity to the piezoelectric element E1 illustrated in FIG. 1AB.

The following describes shapes of deformation of the bridge caused by application of voltage with a predetermined polarity across the electrodes for each piezoelectric element E1 to E4. FIGS. 3A, 3B, and 3C are side cross-sectional views (cross sections taken along the axis L1) illustrating deformed shapes of the bridge 121 caused by application of voltage with a predetermined polarity to the piezoelectric element E1 illustrated in FIGS. 1AB and 1C. The piezoelectric element E1 illustrated here uses the layer structure illustrated in FIG. 2A, and has a structure in which the lower electrode Ec, the piezoelectric material layer Eb, and the upper electrode Ea are laminated on or above the upper surface of the bridge 121.

First, FIG. 3A illustrates a state in which no drive signal is applied to the piezoelectric element E1. In contrast to FIG. 2A, which is a front cross-sectional view taken along the XZ plane, FIG. 3A is a side cross-sectional view taken along the longitudinal axis L1. Thus the bridge 121 is depicted as having a plate-like structure extending in the left/right direction (direction along the longitudinal axis L1) of the drawing, and similarly the piezoelectric element E1 is depicted as having a plate-like structure extending in the left/right direction (direction along the longitudinal axis L1) of the drawing.

FIG. 3B illustrates a deformed shape of the piezoelectric element E1 caused when a driver 180 applies voltage with a predetermined polarity across the electrodes Ea and Ec that are located above and below the piezoelectric element E1. In the illustrated example, the voltage applied by the driver 180 has such a polarity that the upper electrode Ea side is positive and the lower electrode Ec side is negative. As a result, a stress for the piezoelectric material layer Eb to contract in the horizontal direction occurs, which applies a force of contraction to the upper surface of the bridge 121. Thus the bridge 121 bows convexly downward along the longitudinal direction, and as illustrated in FIG. 3B, the entire bridge 121 deforms in a concave manner.

In contrast, FIG. 3C illustrates a deformed shape of the piezoelectric element E1 caused when the driver 180 applies voltage with a reverse polarity across the electrodes Ea and Ec. In the illustrated example, the voltage applied by the driver 180 has such a polarity that the upper electrode Ea side is negative and the lower electrode Ec side is positive.

As a result, a stress for the piezoelectric material layer Eb to stretch in the horizontal direction occurs, which applies a force of stretching to the upper surface of the bridge 121. Thus the bridge 121 bows convexly upward along the longitudinal direction, and as illustrated in FIG. 3C, the entire bridge 121 deforms in a convex manner.

Of course, a relationship between the polarity of voltage applied in the thickness of the piezoelectric material layer Eb and a stress of stretching and contracting occurring in the piezoelectric material layer Eb depends on polarization treatment applied to the piezoelectric material layer Eb used. That is, in the illustrated example, application of voltage with such a polarity that the upper side is positive causes concave deformation (FIG. 3B), and application of voltage with such a polarity that the upper side is negative causes convex deformation (FIG. 3C). However, use of the piezoelectric material layer subjected to the reverse polarization treatment leads to reversals of the shape of concave deformation and the shape of convex deformation. Although the piezoelectric element E1 is disposed on the upper surface of the bridge 121 in the illustrated example, the concave and convex deformation have reversed shapes when the piezoelectric element E1 is disposed on the lower surface of the bridge 121.

In the present embodiment, a drive signal that causes the bridge to deform so as to bow convexly downward along the longitudinal direction is referred to as a "concave-deformation drive signal", while a drive signal that causes the bridge to deform so as to bow convexly upward along the longitudinal direction is referred to as a "convex-deformation drive signal". In the drawings, a mark V is depicted in a cross-section portion of the bridge deformed so as to bow convexly downward, while a mark M is depicted in a cross-section portion of the bridge deformed so as to bow convexly upward. The specific polarity of the "concave-deformation drive signal" and the "convex-deformation drive signal" is determined by the direction of polarization treatment applied to the piezoelectric material layer used and the arrangement of the piezoelectric element (whether the piezoelectric element is disposed on the upper surface or the lower surface of the bridge).

FIG. 3B is a side cross-sectional view illustrating a state in which a concave-deformation drive signal is provided by the driver 180 to the piezoelectric element E1, and the bridge 121 with the mark V depicted deforms in a concave manner. In contrast, FIG. 3C is a side cross-sectional view illustrating a state in which a convex-deformation drive signal is provided by the driver 180 to the piezoelectric element E1, and the bridge 121 with the mark M depicted deforms in a convex manner.

In the movable reflective device 100 illustrated in FIGS. 1AB and 1C, when the "concave-deformation drive signal" or the "convex-deformation drive signal" is applied by the driver 180 to each of the four piezoelectric elements E1 to E4, each of the bridges 121, 122, 131, and 132 deforms in a concave or convex manner accordingly, which leads to displacement of the mirror 160. Selection of the polarity of the drive signal provided to each piezoelectric element E1 to E4 enables control of the displacement direction of the mirror 160, and also enables control of an amount of displacement of the mirror 160 by adjustment of the magnitude (voltage) of the drive signal. The above describes the basic structure and movement of the common movable reflective device using the plate-like arms.

Section 2. Basic Principle of the Present Disclosure

Figure 4A:
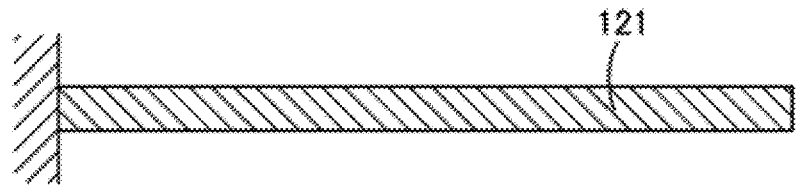
FIG. 4A is a side cross-sectional view (cross-sectional view taken along the axis L1) of the bridge 121 with no drive signal applied to the piezoelectric elements in a state in which the bridge 121 is fixed at the left end (proximal end) thereof, for an arm of the movable reflective device illustrated in FIG. 1AB.
Figure 4B:
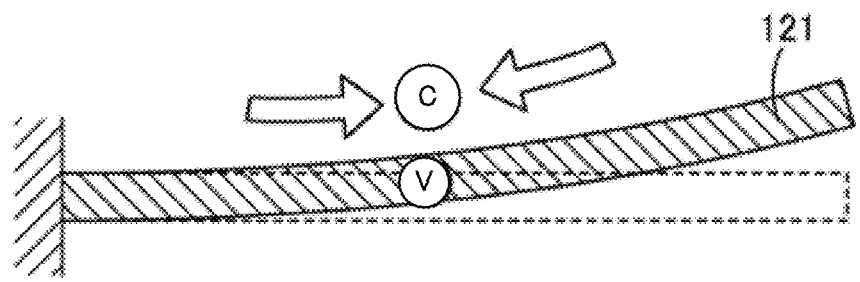
FIG. 4B is a side cross-sectional view (cross-sectional view taken along the axis L1) illustrating a deformed shape of the bridge 121 caused when a concave-deformation drive signal is provided to the piezoelectric elements with the bridge 121 fixed at the left end (proximal end) thereof, for the arm of the movable reflective device illustrated in FIG. 1AB.
Figure 4C:
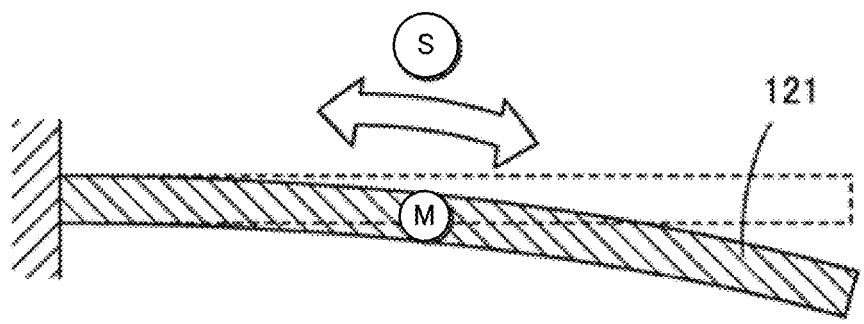
FIG. 4C is a side cross-sectional view (cross-sectional view taken along the axis L1) illustrating a deformed shape of the bridge 121 caused when a convex-deformation drive signal is provided to the piezoelectric elements with the bridge 121 fixed at the left end (proximal end), for the arm of the movable reflective device illustrated in FIG. 1AB.

Firstly, the description below examines how each of the arms 120 and 130 is to be deformed to cause a predetermined displacement in the mirror 160 in the movable reflective device 100 illustrated in FIGS. 1AB and 1C. FIGS. 4A to 4C are side cross-sectional views (cross-sectional views taken along the axis L1) illustrating deformed shapes of the bridge 121 caused by application of each drive signal to the piezoelectric element E1 in a state in which the bridge 121 of the movable reflective device 100 illustrated in FIGS. 1AB and 1C is fixed at one end thereof. For simplicity of illustration, the piezoelectric element E1 is not depicted here.

The arm is a component for connecting a fixation point on the support to a fixation point on the mirror along a predetermined connection path. For example, in the example illustrated in FIGS. 1AB and 1C, the first arm 120 is a component for connecting the fixation point Q1 on the support 110 to the fixation point Q2 on the mirror 160 along a single U-shaped connection path, and the second arm 130 is a component for connecting the fixation point Q3 on the support 110 to the fixation point Q4 on the mirror 160 along a single U-shaped connection path.

In the present embodiment, multiple bridges forming a single arm or multiple intermediate connectors described below are referred by numbering that increases in order from the bridge or intermediate connector that is closer to the support 110 in the connection path of the arm. For example, in the first arm 120 illustrated in (a) of FIG. 1AB, the bridge 121 located closer to the fixation point Q1 in the connection path is referred to as the first bridge, and the bridge 122 located closer to the fixation point Q2 is referred to as the second bridge. Similarly, in the second arm 130, the bridge 131 located closer to the fixation point Q3 in the connection path is referred to as the first bridge, and the bridge 132 located closer to the fixation point Q4 is referred to as the second bridge.

For both the ends of a single bridge, one end closer to the support 110 in the connection path is referred to as a proximal end, and the other end closer to the mirror 160 is referred to as a distal end. For example, in the first arm 120 illustrated in (a) of FIG. 1AB, the first bridge 121 has a proximal end at the reference point P11 side located at the upper end of the drawing and a distal end at the reference point P12 side located at the lower end of the drawing, while the second bridge 122 has a proximal end at the reference point P21 side located at the lower end of the drawing and a distal end at the reference point P22 located at the upper end of the drawing.

FIGS. 4A to 4C illustrate the bridge 121 with the proximal end (left end in the drawing) fixed. This is because the proximal end of the bridge 121 is fixed to the fixation point Q1 of the support 110 via an intermediate connector described below. FIGS. 4A to 4C also depict the distal end (right end in the drawing) of the bridge 121 as a free end, but in practice, the proximal end of the second bridge 122 is connected via the intermediate connector described below to the distal end of the first bridge 121.

FIG. 4A illustrates a state of the bridge 121 without any drive signal applied to the piezoelectric element E1, in which the bridge 121 keeps a reference attitude without deformation. FIG. 4B illustrates a state of the bridge 121 deformed when the concave-deformation drive signal is supplied to the piezoelectric element E1 (dashed lines indicate the position before deformation). For example, when a voltage of such a polarity as in FIG. 3B is applied by the driver 180 to the piezoelectric element E1, a transverse-contracting stress acts on the upper surface of the bridge 121 to cause concave deformation. With the proximal end (left end in the drawing) of the bridge 121 fixed, this concave deformation causes the distal end (right end in the drawing) of the bridge 121 to be displaced upwardly.

In contrast, FIG. 4C illustrates a state of the bridge 121 deformed when the convex-deformation drive signal is supplied to the piezoelectric element E1 (dashed lines indicate the position before deformation). For example, when a voltage of such a polarity as in FIG. 3C is applied by the driver 180 to the piezoelectric element E1, a transverse-stretching stress acts on the upper surface of the bridge 121 to cause convex deformation. With the proximal end (left end in the drawing) of the bridge 121 fixed, this convex deformation causes the distal end (right end in the drawing) of the bridge 121 to be displaced downwardly.

Figure 5A:
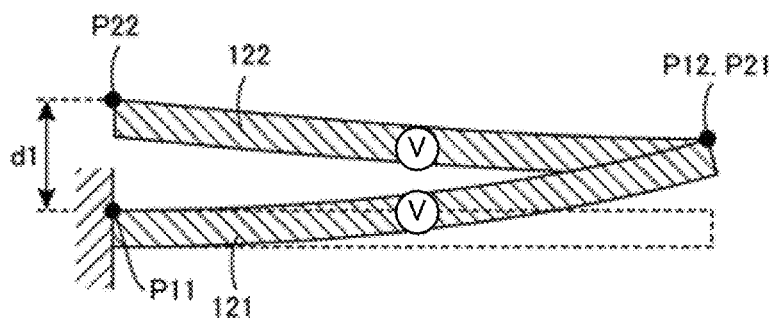
FIG. 5A is a side cross-sectional view (cross-sectional view taken along the axis L1 or L2) illustrating deformed shapes of the bridges 121 and 122 caused when the concave deformation is caused in the piezoelectric elements with the bridge 121 fixed at the left end (proximal end) thereof, for the arm of the movable reflective device illustrated in FIG. 1AB.

Next, the displacement of the entire first arm 120 is considered in further light of deformation of the second bridge 122. FIG. 5A is a side cross-sectional view illustrating shapes of the bridges 121 and 122 deformed when the concave deformation is caused in both the bridges 121 and 122 with the bridge 121 fixed at the proximal end (left end), for the first arm 120 of the movable reflective device 100 illustrated in (a) of FIG. 1AB. Both the cross-sections of the bridges 121 and 122 do not appear in the same cross-sectional view because the bridge 122 is located deeper than the bridge 121 in reality. For convenience of description, however, FIG. 5A depicts the cross-section of the bridge 121 and the cross-section of the bridge 122 together in the same cross-sectional view. In reality, the cross-sectional portion of the bridge 121 is a side cross-sectional view taken along the longitudinal axis L1, and the cross-sectional portion of the bridge 122 is a side cross-sectional portion taken along the longitudinal axis L2.

The reference points P11 to P22 depicted in FIG. 5 are points indicated in the positions in the top view (a) of FIG. 1AB, and are defined at the ends of the bridges on the upper surfaces. As can be seen from the top view (a) of FIG. 1AB, the reference point P11 is a point defined near the fixation point Q1 on the support 110 side, and for convenience of description, is taken here as a stationary fixation point. In contrast, the reference point P22 is a defined point that is located near the fixation point Q2 on the mirror 160 side, in which displacement is caused with respect to the reference point P11. The displacement of the reference point P22 corresponds to the displacement of the mirror 160.

When the concave-deformation drive signal is supplied by the driver 180 to both the piezoelectric elements E1 and E2, the bridges 121 and 122 both deform in a concave manner. Here, with the bridge 121 fixed at the proximal end (reference point P11), the distal end (reference point P12) of the bridge 121 is displaced upwardly, as described above. The proximal end (reference point P21) of the bridge 122 deforms in accordance with the displacement of the distal end (reference point P12) of the bridge 121 since the proximal end is connected to the distal end (reference point P12) of the bridge 121. This results in the state in FIG. 5A in which the reference point P21 is displaced upwardly together with the reference point P12.

In reality, the intermediate connector (a portion of the U-shaped portion in the top view (a) of FIG. 1AB) exists between the distal end of the bridge 121 and the proximal end of the bridge 122, and the intermediate connector deforms so as to twist. Thus the reference points P12 and P21 have different positions in the up/down direction. For convenience of description, however, both the reference points P12 and P21 are depicted at the same position in FIG. 5A, which is the side cross-sectional view. Although in FIG. 5A, which is the side cross-sectional view, the positional gap between the bridges 121 and 122 is exaggerated for convenience of description, the positional gap therebetween results from the twist of the intermediate connector connecting both the bridges, and thus the actual gap is not as great as the gap illustrated.

As illustrated, upon concave deformation of the bridge 121, the distal end (reference point P12) of the bridge 121 is displaced upwardly, and the proximal end (reference point P21) of the bridge 122 connected via the intermediate connector to the bridge 121 also is displaced upwardly. Additionally, the distal end (reference point P22) of the bridge 122 is displaced upwardly as illustrated since the bridge 122 also deforms in a concave manner. Here, twisting occurs in the intermediate connector, and thus a gap as illustrated occurs in the positions of the bridges 121 and 122, as described above.

Conversely, when the convex-deformation drive signal is supplied by the driver 180 to both the piezoelectric elements E1 and E2, the bridges 121 and 122 both deform in a convex manner. Since the proximal end (reference point P11) of the bridge 121 is fixed, when the bridge 121 deforms in a convex manner, the distal end (reference point P12) of the bridge 121 is displaced downwardly, and the proximal end (reference point P21) of the bridge 122 connected to the bridge 121 is displaced downwardly. Additionally, the distal end (reference point P22) of the bridge 122 is displaced downwardly in a direction opposite to that of FIG. 5A since the bridge 122 also deforms in a convex manner.

In this way, when the concave-deformation drive signal is supplied to both the piezoelectric elements E1 and E2, the reference point P22 is displaced upwardly by an amount of displacement d1 on the basis of the position of the reference point P11. Conversely, when the convex-deformation drive signal is supplied to both the piezoelectric elements E1 and E2, the reference point P22 is displaced downwardly by the amount of displacement d1 on the basis of the position of the reference point P11. The amount of displacement d1 is a value corresponding to the voltage of the drive signal supplied to the piezoelectric elements, and the higher applied voltage provides the greater amount of displacement d1.

Thus, in the conventional movable reflective device 100 illustrated in FIGS. 1AB and 1C, adjustment of the polarity and voltage of the drive signal supplied by the driver 180 to the piezoelectric elements E1 and E2 enables control of the deformed shape of the first arm 120, thereby controlling the displacement direction and the amount of displacement of the fixation point Q2 on the mirror 160. Similarly, the adjustment of the polarity and voltage of the drive signal supplied by the driver 180 to the piezoelectric elements E3 and E4 enables control of the deformed shape of the second arm 130, thereby controlling the displacement direction and the amount of displacement of the fixation point Q4 on the mirror 160. Such control of the displacement of the fixation points Q2 and Q4 relative to the support 110 enables guiding of the mirror 160 to a desired attitude and adjustment of the orientation of the reflective layer 165.

An objective of the present disclosure is to provide an improved movable reflective device of the conventional type 100 illustrated in FIG. 1 AB, enabling the mirror 160 to efficiently provide an amount of displacement. Use of the MEMS technology enables reduction in size of this movable reflective device 100 used, for example for mobile devices such as smartphones as an installed device. However, such mobile devices require low operating voltage and low power consumption. Thus a configuration is preferred that enables the securing of a sufficient amount of displacement of the mirror 160 even when driven under conditions of low voltage and low power consumption.

After analysis of a displacement motion of the conventional movable reflective device 100 illustrated in FIG. 1AB, the present inventors found that the movable reflective device 100 does not necessarily have a structure that allows an efficient displacement motion. The reasons are as follows.

Figure 5B:
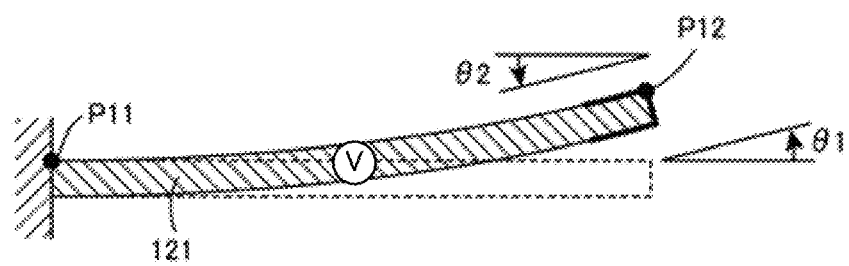
FIG. 5B is a side cross-sectional view (cross-sectional view taken along the axis L1 or L2) illustrating a deformed shape of the bridge 121 caused when the concave deformation is caused in the piezoelectric elements with the bridge 121 fixed at the left end (proximal end) thereof, for the arm of the movable reflective device illustrated in FIG. 1AB.

Consider the case in which both the bridges 121 and 122 are caused to deform in a concave manner (i.e., by providing the concave-deformation drive signal to both the piezoelectric elements E1 and E2) to cause the reference point P22 to be displaced upwardly, as illustrated in FIG. 5A. FIG. 5B is a side cross-sectional view illustrating only the deformed shape of the bridge 121 in the above case. Since the bridge 121 bows convexly downward with the left end (proximal end) fixed, the bridge 121 inevitably deforms so as to raise the right end (distal end). Such deformation yields a positive effect of "displacing the reference point P22 upwardly to increase the amount of displacement d1" in terms of "raising the reference point P12 upwardly". On the other hand, the deformation yields a negative effect of "displacing the reference point P22 downwardly to reduce the amount of displacement d1" in terms of "angling the right end (distal end) to tilt downwardly to the left".

The factors producing this negative effect can be explained with the tilt angles indicated as θ1 and θ2 in FIG. 5B. The tilt angle θ1 indicated in FIG. 5B is a tilt angle of the distal end (indicated by bold lines therein) of the first bridge 121, and is made by the distal end relative to the reference horizontal line indicated by dashed lines. In light of the first bridge 121 extending from the proximal end to the distal end, that is, from the left to the right in the drawing, the tilt angle θ1 can be regarded as a positive angle at which the bridge stretches upwardly from the proximal end to the distal end. In the present disclosure, it is assumed for the bridge extending from the proximal end to the distal end that the tilt angle at which the bridge moves upwardly is taken as a positive angle and the tilt angle at which the bridge moves downwardly is taken as a negative angle.

In contrast, upon consideration of the second bridge 122, the direction in which the second bridge 122 extends from the proximal end to the distal end is a direction from the right to the left in the drawing. The tilt angle θ2 indicated in FIG. 5B is a tilt angle made by the second bridge 122 from the proximal end (substantially the same as the front end of the first bridge 121 indicated by bold lines) to the distal end. This tilt angle θ2 is also an angle made by the second bridge 122 relative to the reference horizontal line indicated by dashed lines, but is a negative angle for the proximal end of the second bridge 122, at which the proximal end directs downwardly.

As described above, the distal end of the first bridge 121 is connected via the intermediate connector to the proximal end of the second bridge 122, and some twisting arises in the intermediate connector. Thus the absolute value of the tilt angle θ1 of the bridge 121 and the absolute value of the tilt angle θ2 of the bridge 122 are substantially the same, although not completely the same. The greater absolute value of the tilt angle θ1 yields the greater absolute value of the tilt angle θ2. In other words, the more the reference point P12 is raised upwardly by increasing the degree of bow of the first bridge 121, the more the attitude of the second bridge 122 tilts downwardly to the left, which causes adverse effects that eventually lower the position of the reference point P22.

Figure 5C:
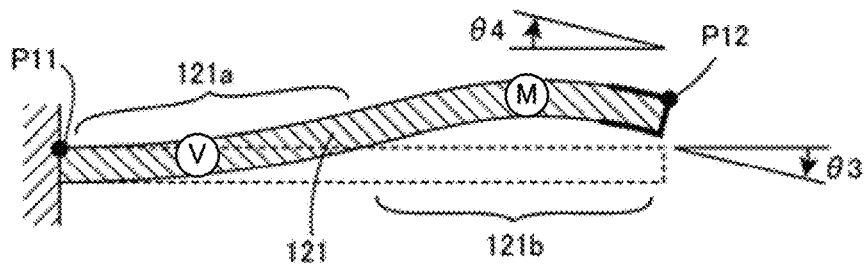
FIG. 5C is a side cross-sectional view (cross-sectional view taken along the axis L1 or L2) illustrating a deformed shape of the bridge 121 caused when the concave deformation and the convex deformation are caused in the piezoelectric elements with the bridge 121 fixed at the left end (proximal end) thereof, for the arm of the movable reflective device illustrated in FIG. 1AB.

In view of such phenomena, the present inventors have found that the above problem can be solved by causing the first bridge 121 to be in a combined concave and convex deformed shape as in FIG. 5C instead of the simple concave deformed shape as in FIG. 5B. In the deformed shape illustrated in FIG. 5B, the first bridge 121 is caused to deform in a concave manner over the entire length of the first bridge 121. In the deformed shape illustrated in FIG. 5C, in which the first bridge 121 is divided into a proximal-end-side area 121a and a distal-end-side area 121b, the proximal-end-side area 121a is caused to deform in a concave manner, while the distal-end-side area 121b is caused to deform in a convex manner.

Causing the first bridge 121 to have such different deformed shapes at the proximal end side and the distal end side circumvents the above problem. Specifically, causing the proximal-end-side area 121a to deform in a concave manner has the effect of displacing the entire distal-end-side are 121b upwardly, while causing the distal-end-side area 121b to deform in a convex manner causes the distal end (right end) of the distal-end-side area 121b to be tilted downwardly to the right.

The tilt angle θ3 indicated in FIG. 5C is a tilt angle of the distal end (indicated by bold lines therein) of the first bridge 121, and is made by the distal end relative to the reference horizontal line indicated by dashed lines. In FIG. 5B, the tilt angle θ1 is a positive upward angle at which the distal end indicated by bold lines tilts upwardly to the right, whereas in FIG. 5C, the tilt angle θ3 is a negative downward angle at which the distal end indicated by bold lines tilts downwardly to the right. The tilt angle θ4 indicated in FIG. 5C is a tilt angle of the proximal end of the second bridge 122 and is made by the proximal end relative to the reference horizontal line indicated by dashed lines. In FIG. 5B, the tilt angle θ2 is a negative downward angle at which the second bridge 122 extends to tilt downwardly to the left, whereas in FIG. 5C, the tilt angle θ4 is a positive upward angle at which the second bridge 122 extends to tilt upwardly to the left.

Here, upon consideration of the position of the reference point P12 that is taken at the distal end of the first bridge 121, the position of the first point P12 in the deformed shape illustrated in FIG. 5B is higher than the position of the reference point P12 in the deformed shape illustrated in FIG. 5C. Thus the deformed shape illustrated in FIG. 5B is preferable in terms of "displacing the reference point P12 upwardly as high as possible". However, the final goal here is to deform the first arm 120 is to "displace the reference point P22 that is defined at the distal end of the second bridge 122 upwardly as high as possible", and thus the deformed shape illustrated in FIG. 5C is preferable in terms of such a standpoint.

Figure 6A:
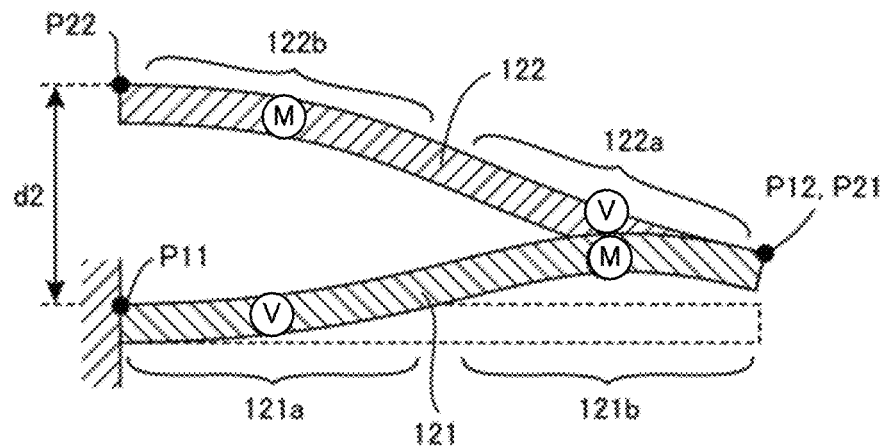
FIG. 6A is a side cross-sectional view (cross-sectional view taken along the axis L1 or L2) illustrating another deformed shapes of bridges 121 and 122 caused when the concave deformation and the convex deformation are caused in the piezoelectric elements with the bridge 121 fixed at the left end (proximal end) thereof, for the arm of the movable reflective device illustrated in FIG. 1AB.
Figure 6B:
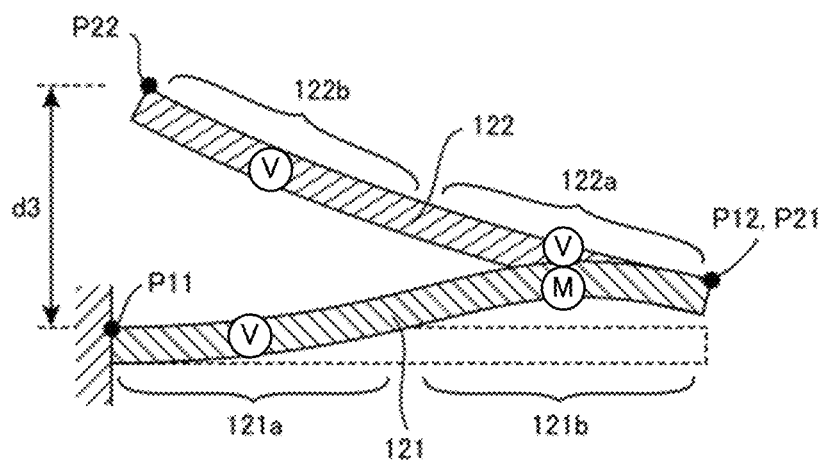
FIG. 6B is another side cross-sectional view (cross-sectional view taken along the axis L1 or L2) illustrating deformed shapes of the bridges 121 and 122 caused when the concave deformation and the convex deformation are caused in the piezoelectric elements with the bridge 121 fixed at the left end (proximal end) thereof, for the arm of the movable reflective device illustrated in FIG. 1AB.

FIGS. 6A and 6B are side cross-sectional views illustrating deformed shapes of the bridges 121 and 122 caused when the concave deformation and the convex deformation are caused in portions of bridges with the bridge 121 fixed at the left end (proximal end) thereof, for the first arm 120 of the movable reflective device 100 illustrated in FIG. 1AB. Here again, for convenience of description, FIGS. 6A and 6B depict the cross-section of the bridge 121 and the cross-section of the bridge 122 together in the same cross-sectional view. In reality, the cross-sectional portion of the bridge 121 is a side cross-sectional view taken along the longitudinal axis L1, and the cross-sectional portion of the bridge 122 is a side cross-sectional portion taken along the longitudinal axis L2.

FIG. 6A illustrates the result in which the deformed shape illustrated in FIG. 5C is applied to both of the first bridge 121 and the second bridge 122. That is, in the deformed shape illustrated in FIG. 6A, in which the first bridge 121 is divided into the proximal-end-side area 121*a* and the distal-end-side area 121*b* similarly to the deformed shape illustrated in FIG. 5C, the proximal-end-side area 121*a* is caused to deform in a concave manner, while the distal-end-side area 121*b* is caused to deform in a convex manner. Similarly, the second bridge 122 is divided into the proximal-end-side area 122*a* and the distal-end-side area 122*b*, and the proximal-end-side area 122*a* is caused to deform in a concave manner, while the distal-end-side area 122*b* is caused to deform in a convex manner.

By comparison of the conventional deformed shape illustrated in FIG. 5A and the deformed shape, as illustrated in FIG. 6A, according to the present disclosure, the deformed shape of FIG. 5A yields a better result for the amount of displacement of the reference point P12 on the right end, but the deformed shape of FIG. 6A yields a better result for the amount of displacement of the reference point P22 on the left end. That is, the amount of displacement d2 indicated in FIG. 6A is greater than the amount of displacement d1 indicated in FIG. 5A. This results from the difference in the attitudes of the proximal end (right end) of the second bridge 122, that is, the proximal end of FIG. 5A has an attitude tilting downwardly to the left, while the proximal end of FIG. 6A has an attitude tilting upwardly to the left. Since the final goal here is to displace the reference point P22 upwardly as high as possible, the deformed shape of FIG. 6A is more preferable than the deformed shape of FIG. 5A.

FIG. 6B illustrates the result in which the deformed shape illustrated in FIG. 5C is applied to the first bridge 121 and the deformed shape illustrated in FIG. 5A is applied to the second bridge 122. That is, in the deformed shape illustrated in FIG. 6B, in which the first bridge 121 is divided into the proximal-end-side area 121*a* and the distal-end-side area 121*b* similarly to the deformed shape illustrated in FIG. 5C, the proximal-end-side area 121*a* is caused to deform in a concave manner, while the distal-end-side area 121*b* is caused to deform in a convex manner. The second bridge 122 is caused to deform in a concave manner over the entire length of the second bridge 122. Although FIG. 6B depicts the second bridge 122 divided into the proximal-end-side area 122*a* and the distal-end-side area 122*b* in the context of the comparison with FIG. 6A, the deformed shapes of both the proximal-end-side area 122*a* and the distal-end-side area 122*b* are the same concave type, which means that the second bridge 122 deforms in a concave manner over the entire length thereof.

By comparison of the deformed shapes illustrated in FIGS. 6A and 6B, the deformed shape of FIG. 6B yields a better result for the amount of displacement of the reference point P22 on the left end. That is, the amount of displacement d3 indicated in FIG. 6B is further greater than the amount of displacement d2 indicated in FIG. 6A. This results from the attitude of the distal end (left end) of the second bridge 122 being kept upwardly to the left. Since the final goal here is to displace the reference point P22 upwardly as high as possible, the deformed shape of FIG. 6B is more preferable than the deformed shape of FIG. 6A.

The deformed shapes for upward displacement of the reference point P22 are described above, but conversely, for downward displacement of the reference point P22, the convex deformation and the concave deformation may be applied in reverse. As such, specific description of the deformed shape for causing the downward displacement of the reference point P22 is omitted here. The above description for the deformed shape is directed to the first arm 120, but the same also applies to the deformed shape for the second arm 130.

Section 3. Basic Embodiments of the Present Disclosure

Section 2 above describes advantageous results in the new type of deformed shape as illustrated in FIG. 6A or 6B to increase the amount of displacement of the reference point P22 in the arm 120 of the movable reflective device 100 illustrated in FIG. 1AB, compared with the conventional deformed shape as illustrated in FIG. 5A. However, in practice, the conventional movable reflective device 100 illustrated in FIG. 1AB does not have a structure that allows for such a new type of deformed shape as illustrated in FIG. 6A or 6B. This is because each bridge 121, 122, 131, and 132 of the movable reflective device 100 illustrated in FIG. 1AB is provided with only one corresponding piezoelectric element E1, E2, E3, and E4.

For example, when the deformed shape illustrated in FIG. 6A is selected, each bridge 121, 122, 131, and 132 is required to cause opposite deformation, that is, the concave deformation in each proximal-end-side area and the convex deformation in each distal-end-side area. When the deformed shape illustrated in FIG. 6B is selected, each bridge 121 and 131 is required to cause opposite deformation, that is, the concave deformation in each proximal-end-side area and the convex deformation in each distal-end-side area. However, the configuration of the piezoelectric elements of the movable reflective device 100 illustrated in FIG. 1AB cannot cause such deformation. Thus in practice, another movable reflective device having a configuration of the piezoelectric elements modified as below is to be provided.

Figure 7:
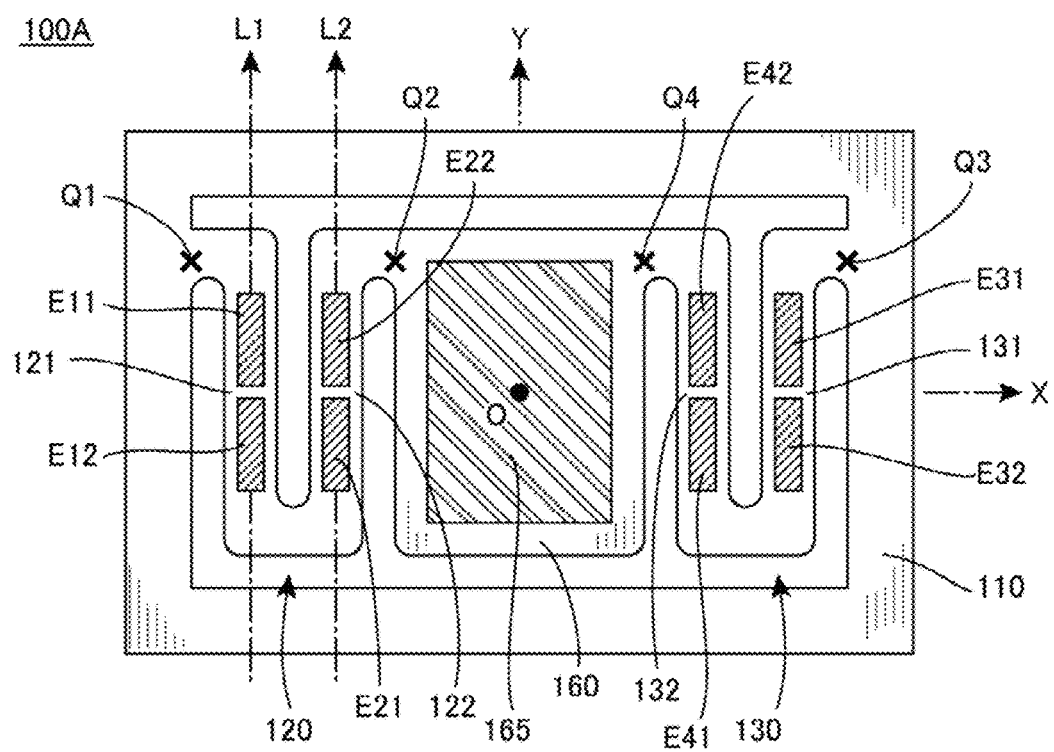
FIG. 7 is a top view of a four-element movable reflective device as a reference example (the hatches are not intended to indicate the cross section, but to indicate individual areas)

In a case for use of the deformed shape illustrated in FIG. 6A, a movable reflective device 100A as illustrated in the top view of FIG. 7 may be used. The only difference between the movable reflective device 100 illustrated in (a) of FIG. 1AB and the movable reflective device 100A illustrated in FIG. 7 is a configuration of the piezoelectric elements. Specifically, the movable reflective element 100 includes the piezoelectric elements E1, E2, E3, and E4 disposed one on each upper surface of the corresponding bridge 121, 122, 131, and 132, while the movable reflective element 100A includes the piezoelectric elements E11, E12; E21, E22; E31, E32; and E41, E42 disposed two on each upper surface of the corresponding bridge 121, 122, 131, and 132. Here, the piezoelectric elements E11, E21, E31, and E41 disposed on the proximal-end side of each bridge are referred to as the proximal-end-side piezoelectric elements, and the piezoelectric elements E12, E22, E32, and E42 disposed on the distal-end side of each bridge are referred to as the distal-end-side piezoelectric elements.

The movable reflective device 100 illustrated in (a) of FIG. 1AB is identical to the movable reflective device 100A illustrated in FIG. 7 with only the exception of the configuration of the piezoelectric elements, as described above. Thus in FIG. 7, components similar or identical to those of FIG. 1AB are denoted with the same reference signs, and the descriptions thereof are omitted.

Figure 8:
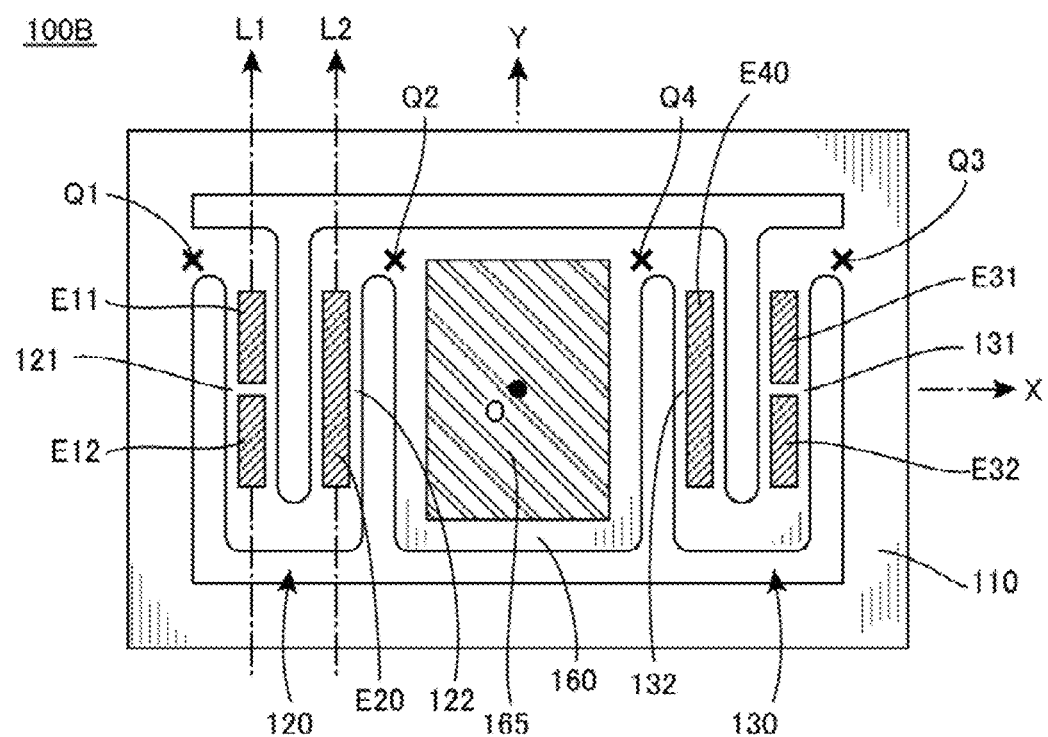
FIG. 8 is a top view of a three-element movable reflective device according to the present disclosure (the hatches are not intended to indicate the cross section, but to indicate individual areas)

In another case for use of the deformed shape illustrated in FIG. 6B, a movable reflective device 100B as illustrated in the top view of FIG. 8 may be used. Here again, the only difference between the movable reflective device 100 illustrated in (a) of FIG. 1AB and the movable reflective device 100B illustrated in FIG. 8 is a configuration of the piezoelectric elements. Specifically, the movable reflective element 100 includes the piezoelectric elements E1, E2, E3, and E4 disposed one on each upper surface of the corresponding bridge 121, 122, 131, and 132, while the movable reflective element 100B includes the piezoelectric elements E11, E12; E31, E32 disposed two on each upper surface of the corresponding bridge 121 and 131 and further includes the piezoelectric elements E20 and E40 disposed one on each upper surface of the corresponding bridge 122 and 132. Here, the piezoelectric devices E20 and E40 illustrated in FIG. 8 are identical to the piezoelectric elements E2 and E4 illustrated in FIG. 1AB, but are denoted with different reference signs for convenience.

Here again in FIG. 8, the piezoelectric elements E11 and E31 disposed on the proximal-end side of each bridge are referred to as the proximal-end-side piezoelectric elements, and the piezoelectric elements E12 and E32 disposed on the distal-end side of each bridge are referred to as the distal-end-side piezoelectric elements. Here, the piezoelectric elements E20 and E40 are referred to as lengthwise piezoelectric elements since the piezoelectric elements E20 and E40 are each a single piezoelectric element extending from the vicinity of the proximal end to the vicinity of the distal end.

The movable reflective device 100 illustrated in (a) of FIG. 1AB is identical to the movable reflective device 100B illustrated in FIG. 8 with only the exception of the configuration of the piezoelectric elements, as described above. Thus in FIG. 8, components similar or identical to those of FIG. 1AB are denoted with the same reference signs, and the descriptions thereof are omitted.

Briefly, the movable reflective device 100 illustrated in FIG. 1AB includes two piezoelectric elements disposed per a single U-shaped arm, the movable reflective device 100A illustrated in FIG. 7 includes four piezoelectric elements disposed per a single U-shaped arm, and the movable reflective device 100B illustrated in FIG. 8 includes three piezoelectric elements disposed per a single U-shaped arm. In light of such configurations, here, the movable reflective device 100 illustrated in FIG. 1AB is referred to as a two-element movable reflective device, the movable reflective device 100A illustrated in FIG. 7 is referred to as a four-element movable reflective device, and the movable reflective device 100B illustrated in FIG. 8 is referred to as a three-element movable reflective device. In general, the movable reflective device including k piezoelectric elements per a single arm is referred to as a k-element movable reflective device. ¥

As described above, the deformed shape illustrated in FIG. 6B is a preferable choice to meet the final goal that is to obtain the greatest possible amount of displacement of the reference point P22. Then the deformed shape illustrated in FIG. 6B is provided preferably by use of the three-element movable reflective device 100B illustrated in FIG. 8 and its related odd-number-of-element movable reflective device (described below).

Of course, the deformed shape illustrated in FIG. 6B can be provided by use of the four-element movable reflective device 100A illustrated in FIG. 7. In this case, however, the same drive signal is applied to the pair of piezoelectric elements E21 and E22 disposed on the bridge 122, and the same drive signal is applied to the pair of piezoelectric elements E41 and E42 disposed on the bridge 132. Providing two separate piezoelectric elements is thus inefficient. Such configuration of the two separate piezoelectric elements creates a gap therebetween, which may reduce the drive efficiency. In addition, the efforts for wiring may be increased.

In light of such a standpoint, the three-element movable reflective device 100B illustrated in FIG. 8 provides more advantages in practice than the four-element movable reflective device 100A illustrated in FIG. 7. The present disclosure is directed to this three-element movable reflective device 100B and its related odd-number-of-element movable reflective device (described below), and assumes the driving based on the deformed shape illustrated in FIG. 6B.

The two-element movable reflective device 100 illustrated in FIGS. 1AB and 1C, which is a typical device that is commonly used, cannot necessarily provide a sufficient amount of displacement d1 of the reference point P22 as illustrated in FIG. 5A. In contrast, the three-element movable reflective device 100B illustrated in FIG. 8 can provide a sufficient amount of displacement d3 of the reference point P22 by providing driving for causing the deformed shape illustrated in FIG. 6B. That is, the present disclosure provides a new structure that enables the mirror to provide the amount of displacement more efficiently in the movable reflective device that supports the mirror with the plate-like arms having the U-shaped plan view shape.

In practice, operation of the movable reflective device having various structures described above requires a driver to drive each piezoelectric element by supplying drive signals thereto. The whole system with the driver added to the movable reflective device is referred to herein as a reflective surface drive system. To implement the reflective surface drive system using the three-element movable reflective device 100B illustrated in FIG. 8, an electronic circuit having the following functions may be prepared as a driver 180.

Now, consider the case where an operation is performed to cause the fixation points Q2 and Q4 on the mirror 160 to be displaced upwardly (in the Z-axis positive direction). Such an operation displaces the upper side of the rectangular mirror 160 illustrated in FIG. 8 upwardly (in the Z-axis positive direction), and tilts the reflective layer 165 relative to the Y-axis direction. The upward displacement of the fixation point Q2 may be achieved by causing the first arm 120 to be displaced as illustrated in FIG. 6B. Thus the driver 180 may supply the concave-deformation drive signal to the proximal-end-side piezoelectric element E11, the convex-deformation drive signal to the distal-end-side piezoelectric element E12, and the concave-deformation drive signal to the lengthwise piezoelectric element E20. Similarly, the upward displacement of the fixation point Q4 may be achieved by causing the second arm 130 to be displaced as illustrated in FIG. 6B. Thus the driver 180 may supply the concave-deformation drive signal to the proximal-end-side piezoelectric element E31, the convex-deformation drive signal to the distal-end-side piezoelectric element E32, and the concave-deformation drive signal to the lengthwise piezoelectric element E40.

Next, consider the case where an operation is performed to cause the fixation points Q2 and Q4 on the mirror 160 to be displaced downwardly (in the Z-axis negative direction). Such an operation displaces the upper side of the rectangular mirror 160 illustrated in FIG. 8 downwardly (in the Z-axis negative direction), and tilts the reflective layer 165 oppositely relative to the Y-axis direction. The downward displacement of the fixation point Q2 may be achieved by causing the first arm 120 to be displaced oppositely to the displacement of FIG. 6B. Thus the driver 180 may supply the convex-deformation drive signal to the proximal-end-side piezoelectric element E11, the concave-deformation drive signal to the distal-end-side piezoelectric element E12, and the convex-deformation drive signal to the lengthwise piezoelectric element E20. Similarly, the downward displacement of the fixation point Q4 may be achieved by causing the second arm 130 to be displaced oppositely to the displacement of FIG. 6B. Thus the driver 180 may supply the convex-deformation drive signal to the proximal-end-side piezoelectric element E31, the concave-deformation drive signal to the distal-end-side piezoelectric element E32, and the convex-deformation drive signal to the lengthwise piezoelectric element E40.

Although the basic structure and the operation method of the three-element movable reflective device 100B illustrated in FIG. 8 are described above as an example for explanatory purpose, the movable reflective device to which the basic principle of the present disclosure stated in Section 2 is not limited to such a three-element movable reflective device, and the basic principle of the present disclosure is in general applicable to the movable reflective device having an odd-number of elements.

Figure 9:
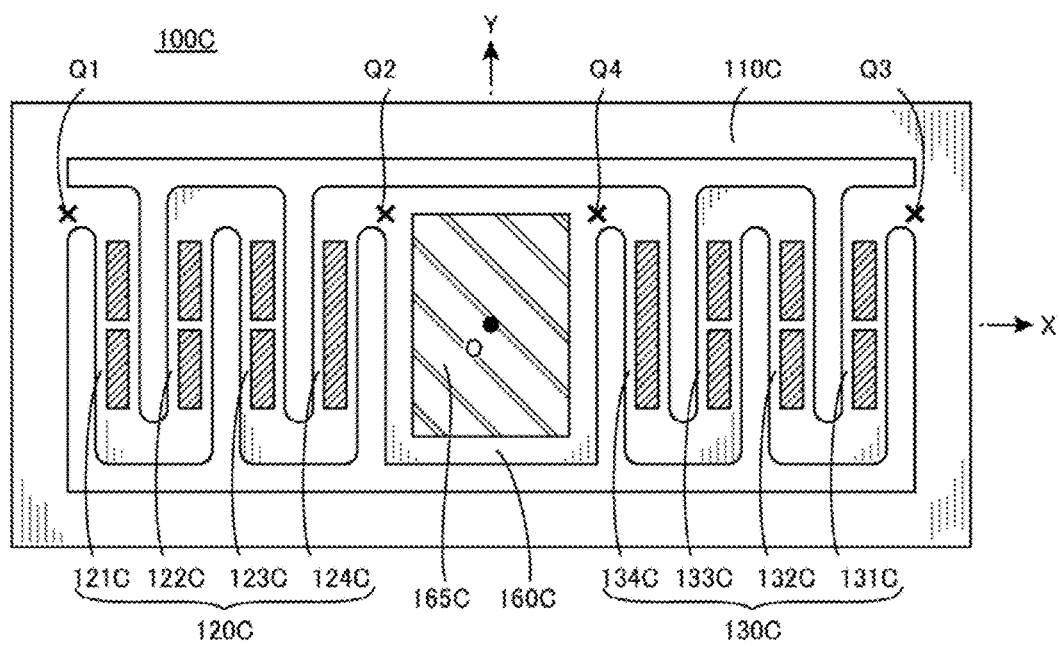
FIG. 9 is a top view of a seven-element movable reflective device according to the present disclosure (the hatches are not intended to indicate the cross section, but to indicate individual areas)

For example, FIG. 9 is a top view of a seven-element movable reflective device 100C according to the present disclosure (the hatches are not intended to indicate the cross section, but to indicate individual areas). For the three-element movable reflective device 100B illustrated in FIG. 8, the first arm 120 is configured to have a U-shaped turned-back portion at one location, and has two bridges that are the first bridge 121 and the second bridge 122. The same applies to the second arm 130.

In contrast, for the seven-element movable reflective device 100C illustrated in FIG. 9, the first arm 120C is configured to have U-shaped turned-back portions at three locations, and has four bridges that are a first bridge 121C, a second bridge 122C, a third bridge 123C, and a fourth bridge 124C. In addition, a total of seven piezoelectric elements are disposed on the first arm 120C. Similarly, the second arm 130C is configured to have U-shaped turned-back portions at three locations, and has four bridges that are a first bridge 131C, a second bridge 132C, a third bridge 133C, and a fourth bridge 134C. A total of seven piezoelectric elements are also disposed on this second arm 130C.

In the movable reflective device 100C, the first arm 120C connects the fixation point Q1 on the support 110C, which is a frame-shaped member, to the fixation point Q2 on the rectangular mirror 160C. Similarly, the second arm 130C connects the fixation point Q3 to the fixation point Q4. Displacement of each arm enables tilting of the reflective layer 165C on the mirror 160C.

Here, upon consideration of the seven piezoelectric elements of the first arm 120C, in which the first bridge 121C to the third bridge 123C is provided with a pair of piezoelectric elements of a proximal-end-side piezoelectric element and a distal-end-side piezoelectric element, and the last fourth bridge 124C is provided with a single lengthwise piezoelectric element extending from the vicinity of the proximal end to the vicinity of the distal end. The same applies to the second arm 130C.

The reasons for use of such arrangement in a single arm, in which the first to third bridges are provided with the pair of piezoelectric elements of the proximal-end-side piezoelectric element and the distal-end-side piezoelectric element and the fourth bridge is provided with the single lengthwise piezoelectric element, will be readily understood with reference to the deformed shapes illustrated in FIGS. 6A and 6B. In general, when a single arm includes n bridges, the n bridges are connected along a serpentine connection path connecting the fixation point Q1 to the fixation point Q2. The movable reflective device 100C illustrated in FIG. 9 is an example of setting in which n=4, and the first arm 120C includes a total of four bridges 121C, 122C, 123C, and 124C that are connected to one another in a serpentine manner.

Considering, for example, the upward (Z-axis positive direction) displacement of the fixation point Q2 with this structure, such deformation as gradually upward tilting from the fixation point Q1 to the fixation point Q2 is necessary for each bridge. When the following bridge exists, the deformed shape of the bridge tilting downwardly at the distal end as illustrated in FIG. 5C is preferably adopted, and when no following bridge exists, the deformed state of the bridge tilting upwardly at the distal end as illustrated in FIG. 5B is preferably adopted.

In other words, for the first arm 120C illustrated in FIG. 9, preferably, the deformed shape illustrated in FIG. 6A is applied to the relationship between the first bridge 121C and the second bridge 122C, and is also applied to the relationship between the second bridge 122C and third bridge 123C, but the deformed shape illustrated in FIG. 6B is applied to the relationship between the third bridge 123C and the fourth bridge 124C. The enablement of such deformed shapes is the reason for the arrangement of the first arm 120C illustrated in FIG. 9 such that the first to third bridges 121C to 123C are provided with the pair of piezoelectric elements of the proximal-end-side piezoelectric element and the distal-end-side piezoelectric element, and the fourth bridge 124C is provided with the single lengthwise piezoelectric element. The same applies to the second arm 130C.

To displace the fixation points Q2 and Q4 on the mirror 160C upwardly (in the Z-axis positive direction) in the movable reflective device 100C illustrated in FIG. 9, for the first arm 120C, the concave-deformation drive signal is supplied to each proximal-end side piezoelectric element on the first to third bridges 121C to 123C, the convex-deformation drive signal is supplied to each distal-end side piezoelectric element, and the concave-deformation drive signal is supplied to the lengthwise piezoelectric element on the fourth bridge 124C. Similarly, for the second arm 130C, the concave-deformation drive signal is supplied to each proximal-end side piezoelectric element on the first to third bridges 131C to 133C, the convex-deformation drive signal is supplied to each distal-end side piezoelectric element, and the concave-deformation drive signal is supplied to the lengthwise piezoelectric element on the fourth bridge 134C. Conversely, to displace the fixation points Q2 and Q4 on the mirror 160C downwardly (in the Z-axis negative direction), the convex-deformation drive signal and the concave-deformation drive signal in the above description may be mutually interchanged.

Although FIG. 9 illustrates the seven-element movable reflective device 100C as an example, the basic principle of the present disclosure is, of course, applicable using a five-element movable reflective device (device having a structure with three bridges per arm), a nine-element movable reflective device (device having a structure with five bridges per arm), and so on.

In short, the basic principle of the present disclosure stated in Section 2 may be applied by providing an odd-number-of-element movable reflective device having an odd number k of piezoelectric elements provided on the single arm, providing a single lengthwise piezoelectric element on the last bridge (bridge connected to the mirror) while providing a pair of piezoelectric elements of the proximal-end-side piezoelectric element and a distal-end-side piezoelectric element on each of the other bridges. When the mirror is controlled to assume a predetermined position relative to the support, one of the concave-deformation drive signal and the convex-deformation drive signal may be supplied to each proximal-end-side piezoelectric element and the lengthwise piezoelectric element in accordance with the displacement direction of the mirror, and the other drive signal may be supplied to each distal-end-side piezoelectric element.

For reference purposes, the following shows the results of verification of the effects of the present disclosure for the movable reflective device 100C illustrated in FIG. 9. Results 1 and 2 below are obtained by simulations of a computer including an application program for finite element method (FEM) analysis.

<Result 1>
Analyzed object: seven-element movable reflective device 100C
Resulting amount of displacement d=1.76 mm
<Result 2>
Analyzed object: four-element movable reflective device 100C'
Resulting amount of displacement d=0.87 mm In Results 1 and 2 above, the seven-element movable reflective device 100C is the movable reflective device 100C illustrated in FIG. 9, and the four-element movable reflective device 100C' is a device (conventional type of device as illustrated in FIG. 1AB by example) obtained by replacing "the proximal-end-side piezoelectric element and the distal-end-side piezoelectric element" of the movable reflective device 100C with the "single lengthwise piezoelectric element". In other words, for the seven-element movable reflective device 100C, the "proximal-end-side piezoelectric elements and the distal-end-side piezoelectric elements" are disposed on three out of four bridges included in a single arm, and the "single lengthwise piezoelectric element" is disposed on the last one bridge thereof. In contrast, for the four-element movable reflective device 100C', the "single lengthwise piezoelectric elements" are disposed on all the four bridges included in a single arm.

In Results 1 and 2 above, the resulting amount of displacement d is an amount of displacement d of the fixation point Q2 relative to the fixation point Q1 relative in the Z-axis direction upon application of the same voltage of predetermined polarity to each piezoelectric element. As can be seen by comparison of the results, the use of the movable reflective device 100C according to the present disclosure yields a 2-fold or greater increase in the amount of displacement compared with the use of the conventional movable reflective device 100C' even with the same voltage applied. Such application of the basic principle of the present disclosure enables the mirror to provide an amount of displacement more efficiently.

Section 4. Basic Configuration of the Present Disclosure

In Section 3 above, the basic embodiments of the present disclosure are described. In this section, the basic configuration of the movable reflective device and the reflective surface drive system according to the present disclosure is generally stated, and intrinsic constituent elements of the present disclosure are described. For convenience, the movable reflective device 100C illustrated in FIG. 9 is used as an example for explanatory purpose.

First, the basic configuration of the movable reflective device according to the present disclosure is described with reference to an implementation of FIG. 9. The movable reflective device 100C illustrated in FIG. 9 includes the mirror 160C having the reflective layer 165C, the support 110C for supporting the mirror 160C, arms 120C and 130C having one end fixed to the support 110C and the other end fixed to the mirror 160C, and piezoelectric elements (a total of fourteen elements arranged in areas with a hatch pattern of oblique lines) for causing each arm 120C and 130C to be deformed in accordance with electrical signals provided. The movable reflective device 100C has functions of controlling the relative position of the mirror 160C to the support 110C by displacement of the arms 120C and 130C caused by each piezoelectric element.

Figure 10:
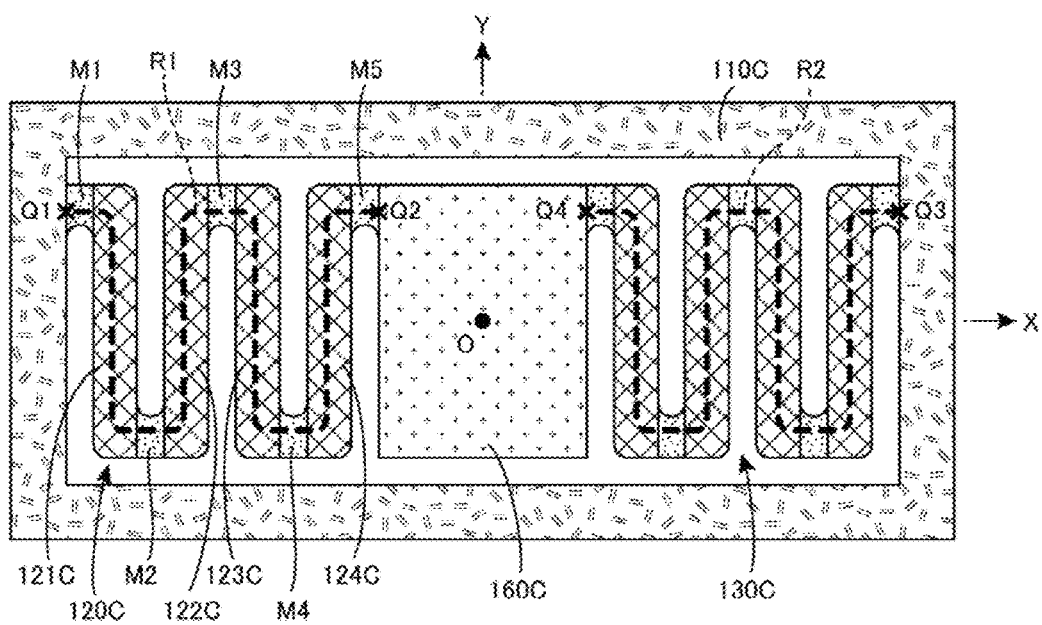
FIG. 10 is a plan view illustrating the basic structure of the movable reflective device illustrated in FIG. 9 (the hatches are not intended to indicate the cross section, but to indicate individual areas)

FIG. 10 is a plan view illustrating the basic structure of the movable reflective device 100C illustrated in FIG. 9. Here, the hatches in various forms are not intended to indicate the cross section, but to indicate individual areas. In the drawing, the portion with a "=" hatch pattern indicates the support 110C, and in this example case, forms a rectangular frame structure. The arms 120C and 130C and the mirror 160C are disposed within the support 110C having the frame structure.

The portions with a tilted-square or dot hatch pattern in FIG. 10 are the arms. In the illustrated example, two arms 120C and 130C each having U-shaped structures at three locations are provided. The U-shaped structure is configured by the plate-like member having a U-shaped plan view shape. The number of U-shaped structures is not limited to three (in the example of FIG. 10), but may be one (in the example of FIG. 8) or any plural number. A portion of the U-shaped structure has a curved shape in the illustrated example, but the "U-shaped" described herein does not necessarily indicate the shape including a curved portion, and the profile of the U-shaped structure may be configured only by straight lines.

In the drawing, the portion with a "+" hatch pattern is the mirror 160C, and in the illustrated example, is configured as the rectangular plate-like member. Briefly, the basic structure includes the support 110C, the arms 120C and 130C, and the mirror 160C as illustrated in FIG. 10, and in the implementation illustrated here, is configured as a wholly integral plate-like member. In this basic structure, the arms 120C and 130C are required to cause the elastic deformation, while the support 110C and the mirror 160C preferably maintains a property of a body that is as rigid as possible. Thus preferably in practice, the whole basic structure is configured as a plate-like member made of metal or synthetic resin, and as illustrated in (b) of FIG. 1AB and FIG. 1C, which are cross-sectional views, the arm (particularly, the bridge portion) is processed into a beam-like structure that facilitates elastic deformation.

The arms 120C and 130C serve as a connection of a predetermined location of the support 110C to a predetermined location of the mirror 160C along a single connection path. For example, in an example illustrated in FIG. 10, the first arm 120C serves as a connection of the fixation point Q1 of the support 110C to the fixation point Q2 of the mirror 160C along a connection path R1 indicated by dashed lines. Similarly, the second arm 130C servers as a connection of the fixation point Q3 of the support 110C to the fixation point Q4 of the mirror 160C along a connection path R2 indicated by dashed lines.

A single arm includes n bridges and n+1 intermediate connectors, where n≥2. The example illustrated in FIG. 10 is an example of setting n equal to 4, in which the first arm 120C includes the four bridges 121C, 122C, 123C, and 124C (tilted-square hatch pattern portion) and five intermediate connectors M1, M2, M3, M4, and M5 (dot hatch pattern portion). The same applies to the second arm 130C.

Here, the n bridges are each a plate-like structure extending along a predetermined longitudinal axis, and each of the longitudinal axes of the individual bridges is parallel to a predetermined common reference axis. In the example illustrated in FIG. 10, the Y axis is set to the common reference axis, and the four bridges 121C, 122C, 123C, and 124C forming the first arm 120C are each a plate-like structure extending along the predetermined longitudinal axis (a portion of the connection path R1 each indicated by dashed lines) that is parallel to the Y axis. The same applies to the four bridges forming the second arm 130C.

Each of the longitudinal axes of the individual bridges is not necessarily set to the axis parallel to the common reference axis, and may be oriented in any direction that allows the arm to extend along the single connection path. However, in practice, as in the illustrated implementations, setting of the longitudinal axes of the individual bridges to the axes parallel to the common reference axis can provide a turned-back portion for a U-turn at the individual intermediate connector, and cause deformation in a so-called serpentine form. This provides efficient spatial arrangement of the arms, which is preferable for space savings.

The n+1 intermediate connectors serve as a connection of the first bridge to the support, a connection of a pair of adjoining bridges to each other along the connection path, and a connection of the nth bridge to the mirror. That is, when an end side, of both ends of each bridge, closer to the support on the connection path is referred to as a proximal end, while the other end side closer to the mirror on the connection path is referred to as a distal end, the first intermediate connector among the n+1 intermediate connectors connects a predetermined location of the support to the proximal end of the first bridge, the ith intermediate connector connects the distal end of the (i−1)th bridge to the proximal end of the ith bridge, where 2≤i≤n, and the n+1th intermediate connector connects the distal end of the nth bridge to a predetermined location of the mirror.

To describe the above more specifically using the first arm 120C illustrated in FIG. 10 as an example, the first arm 120C includes the four bridges 121C, 122C, 123C, and 124C with a tilted-square hatch pattern, and five intermediate connectors M1, M2, M3, M4, and M5 with a dot hatch pattern. The first intermediate connector M1 connects the fixation point Q1 of the support 110C to the proximal end of the first bridge 121C. In the illustrated example, the first intermediate connector M1 is fixed to the inner surface of the frame structure forming the support 110C. In contrast, the second intermediate connector M2 connects the distal end of the first bridge 121C to the proximal end of the second bridge 122C, the third intermediate connector M3 connects the distal end of the second bridge 122C to the proximal end of the third bridge 123C, the fourth intermediate connector M4 connects the distal end of the third bridge 123C to the proximal end of the fourth bridge 124C, and the fifth intermediate connector M5 connects the distal end of the fourth bridge 124C to the fixation point Q2 of the mirror 160C.

For the basic structure illustrated in FIG. 10, when an XYZ three-dimensional orthogonal coordinate system is defined, the upper surfaces of the n bridges and the n+1 intermediate connectors, which form the arms, are in an XY plane, the lower surfaces thereof are in a predetermined plane parallel to the XY plane, and the longitudinal axes of the n bridges are set parallel to the Y axis taken as the common reference axis.

The movable reflective device 100C illustrated in FIG. 9 includes sets of seven piezoelectric elements, each set of which is arranged on the upper surface of the corresponding arm 120C and 130C of the basic structure illustrated in FIG. 10. The general arrangement of the piezoelectric devices is described as follows: the first to (n−1)th bridges of the n bridges may be each provided with the proximal-end-side piezoelectric element arranged on the proximal-end side and the distal-end-side piezoelectric element arranged on the distal-end side, while the nth bridge may be provided with the lengthwise piezoelectric element extending from the vicinity of the proximal end to the vicinity of the distal end. The movable reflective device 100C illustrated in FIG. 9 is an example of setting in which n=4, and the first to third bridges 121C, 122C, and 123C out of the four bridges 121C, 122C, 123C, and 124C are each provided with the proximal-end-side piezoelectric element arranged on the proximal-end side and the distal-end-side piezoelectric element arranged on the distal-end side, while the fourth bridge 124C is provided with the lengthwise piezoelectric element extending from the vicinity of the proximal end to the vicinity of the distal end.

For the movable reflective device 100C illustrated in FIG. 9, the proximal-end-side piezoelectric element, the distal-end-side piezoelectric element, and the lengthwise piezoelectric element are all disposed on the upper surfaces of the bridges, but some or all of the piezoelectric elements may be arranged on the lower surfaces of the bridges. Each piezoelectric element has a function of stretching and contracting the surface of the bridge along the longitudinal axis in accordance with the electrical signal provided.

The reflective surface drive system according to the present disclosure is configured by addition of the driver 180, which includes an electronic circuit, to the above-described movable reflective device 100C. The driver 180 has a function of driving each piezoelectric element of the movable reflective device 100C by supplying a predetermined drive signal to each piezoelectric element.

Specifically, the driver 180 has a function of selectively supplying, to the individual piezoelectric element, (i) a concave-deformation drive signal (see FIG. 3B) for causing the area of the bridge with the individual piezoelectric element to deform to bow convexly downward along the longitudinal direction, and (ii) a convex-deformation drive signal (see FIG. 3C) for causing the area of the bridge with the individual piezoelectric element to deform to bow convexly upward along the longitudinal direction. As described above, each of the arms 120C and 130C included in the movable reflective device 100C is configured as the plate-like member arranged in a predetermined plane (XY plane in the illustrated example). Thus, the supply of each deformation drive signal from the driver 180 causes the predetermined area of the bridge to deform concavely or convexly.

To perform an operation in accordance with the basic principle of the present disclosure, as stated in Section 3, when the electrical signals to be supplied to a particular arm is taken to be a first drive signal that is one of the concave-deformation drive signal and the convex-deformation drive signal and a second drive signal that is the other when the mirror 160C is controlled to be at a predetermined relative position to the support 110C, the driver 180 may operate to supply the first drive signal to the proximal-end-side piezoelectric element and the lengthwise piezoelectric element of the particular arm, and supply the second drive signal to the distal-end-side piezoelectric element of the particular arm.

For example, for upward displacement of the ends (fixation points Q2 and Q4), fixed to the mirror 160C, of the arms 120C and 130C, the driver 180 may supply the concave-deformation drive signals to the proximal-end-side piezoelectric elements and the lengthwise piezoelectric elements of the arms 120C and 130C, and supply the convex-deformation drive signal to the distal-end-side piezoelectric element. Conversely, for downward displacement, the driver 180 may supply the convex-deformation drive signals to the proximal-end-side piezoelectric elements and the lengthwise piezoelectric elements of the arms 120C and 130C, and supply the concave-deformation drive signal to the distal-end-side piezoelectric element.

The drive signal provided by the driver 180 to each piezoelectric element may be a direct-current drive signal or an alternating-current drive signal. When the direct-current drive signal is supplied to the individual piezoelectric element, the arms 120C and 130C are maintained in predetermined deformed shapes. Thus the mirror 160C is controlled to keep a predetermined attitude to the support 110C.

In contrast, when the alternating-current drive signal, in which the concave-deformation drive signal and the convex-deformation drive signal are alternately repeated periodically, is supplied to the individual piezoelectric element, control for periodic motion of the mirror 160C relative to the support 110C is enabled. Any waveform can be used as a waveform of the alternating-current drive signal, such as a sine waveform, a rectangular waveform, a sawtooth waveform, and the like. However, with respect to the phases of the supplied alternating-current drive signal, care may be necessary for the signal with the proper phase to be supplied to each piezoelectric element. Specifically, the alternating-current drive signal with a first phase may be supplied to the proximal-end-side piezoelectric element and the lengthwise piezoelectric element, while the alternating-current drive signal with a second phase different from the first phase may be supplied to the distal-end-side piezoelectric element.

Section 5. Variations of the Present Disclosure

The basic embodiments of the present disclosure are described above relative to the movable reflective device 100B illustrated in FIG. 8 and the movable reflective device 100C illustrated in FIG. 9. Here, some variations of the present disclosure are described.

The implementations above each have a structure that supports the mirror by the two arms. For example, the movable reflective device 100C illustrated in FIG. 9 has a structure that supports the mirror 160C by the two arms that are the first arm 120C and the second arm 130C. Here, the first arm 120C is arranged in the connection path R1 connecting the first fixation point Q1 located on the support 110C to the second fixation point Q2 located on the mirror 160C, and the second arm 130C is arranged in the second connection path R2 connecting the third fixation point Q3 located on the support 110C to the fourth fixation point Q4 located on the mirror 160C.

However, to implement the present disclosure, the number of the arms is not limited to two, but may be one or any plural number. In practice, however, two or four arms may be preferably used to support the mirror 160C stably.

Figure 11:
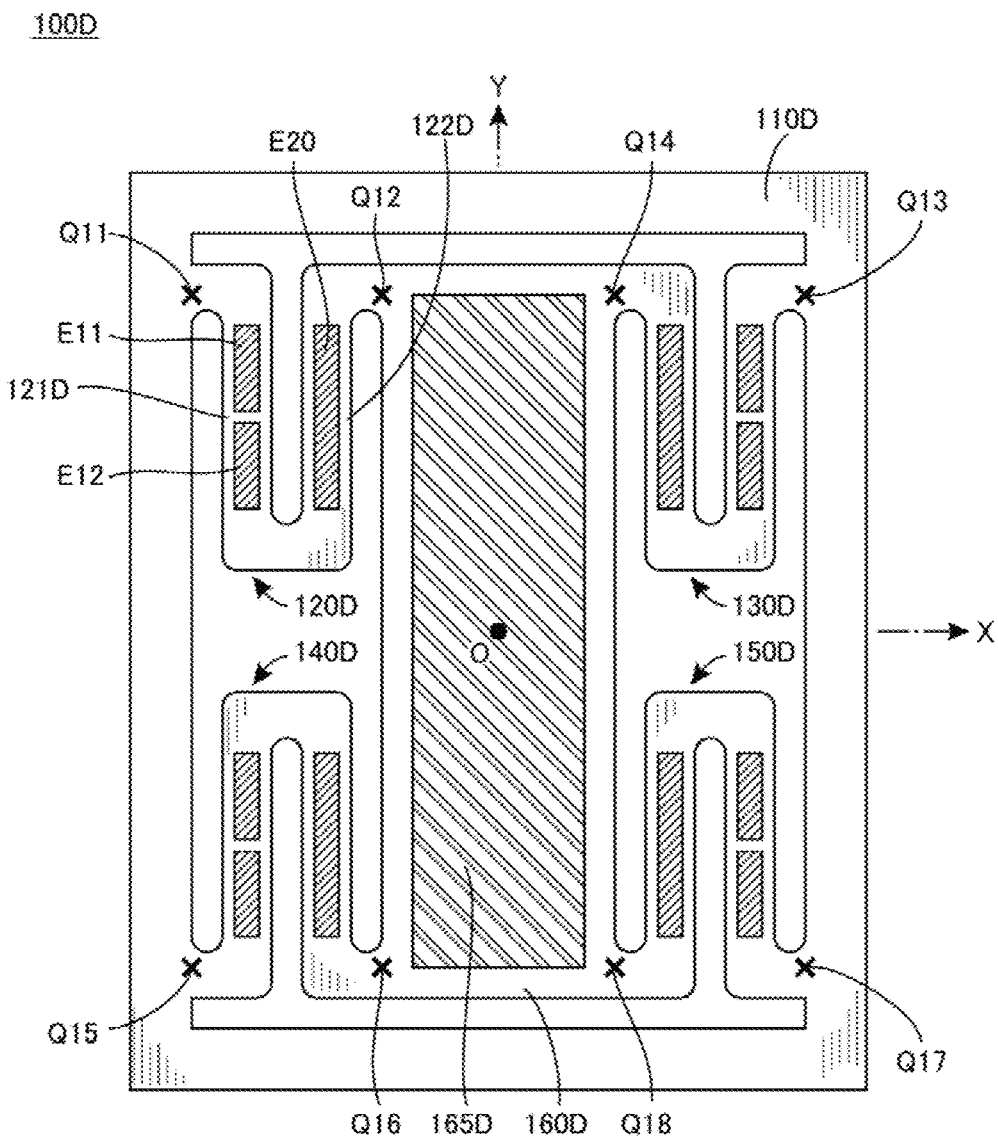
FIG. 11 is a top view of a four-arm movable reflective device according to a variation of the present disclosure (the hatches are not intended to indicate the cross section, but to indicate individual areas)

FIG. 11 is a top view of a four-arm movable reflective device 100D according to a variation of the present disclosure (similarly to the top views above, the hatches are not intended to indicated the cross section, but to indicate individual areas). For the movable reflective device 100D, a first arm 120D, a second arm 130D, a third arm 140D, and a fourth arm 150D are disposed to support a mirror 160D, on which a reflective layer 165D is formed, inside a support 110D having the frame structure.

The first arm 120D is arranged along the first connection path connecting the first fixation point Q11 located on the support 110D to the second fixation point Q12 located on the mirror 160D, the second arm 130D is arranged along the second connection path connecting the third fixation point Q13 located on the support 110D to the fourth fixation point Q14 located on the mirror 160D, the third arm 140D is arranged in the third connection path connecting the fifth fixation point Q15 located on the support 110D to the sixth fixation point Q16 located on the mirror 160D, and the fourth arm 150D is arranged along the fourth connection path connecting the seventh fixation point Q17 located on the support 110D to the eighth fixation point Q18 located on the mirror 160D.

As illustrated, the mirror 160D is configured as a rectangular plate-like member, and the first to fourth arms 120D, 130D, 140D, and 150D are connected to the vicinities of the corresponding first to fourth corners of the rectangle shape of the mirror 160D. As such, in the four-arm movable reflective device 100D illustrated in FIG. 11, the arms are connected to the corresponding four corners of the rectangular mirror 160D, thus enabling stable support of the mirror 160D.

Three piezoelectric elements are arranged in each of the arms 120D, 130D, 140D, and 150D, and is thus a three-element movable reflective device similarly to the movable reflective device 100B illustrated in FIG. 8. For example, the first bridge 121D of the first arm 120D is provided with the proximal-end-side piezoelectric element E11 and the distal-end-side piezoelectric element E12, and the second bridge 122D thereof is provided with the lengthwise piezoelectric element E20. The same applies to the arrangement of the piezoelectric elements for the second to fourth arms 130D, 140D, and 150D.

In the four-arm movable reflective device 100D, driving of the first arm 120D causes the fixation point Q12 to be displaced in the up/down direction (Z-axis direction), driving of the second arm 130D causes the fixation point Q14 to be displaced in the up/down direction, driving of the third arm 140D causes the fixation point Q16 to be displaced in the up/down direction, and driving of the fourth arm 150D causes the fixation point Q18 to be displaced in the up/down direction. The drive signals to be supplied to each piezoelectric element when causing displacement are the same as those used in the basic embodiments described above.

As such, the four-arm movable reflective device 100D can independently control the upward/downward displacement of the four corners of the mirror 160D, thus providing greater flexibility in the attitude control of the reflective layer 165D. For example, the upward displacement of the fixation points Q12 and Q14 and the downward displacement of the fixation points Q16 and Q18 tilt the reflective layer 165D relative to the Y-axis direction, while the upward displacement of the fixation points Q12 and Q16 and the downward displacement of the fixation points Q14 and Q18 tilt the reflective layer 165D relative to the X-axis direction. Use of the alternating-current signal as a drive signal enables the reflective layer 165D to oscillate in a predetermined axis direction or process.

Figure 12:
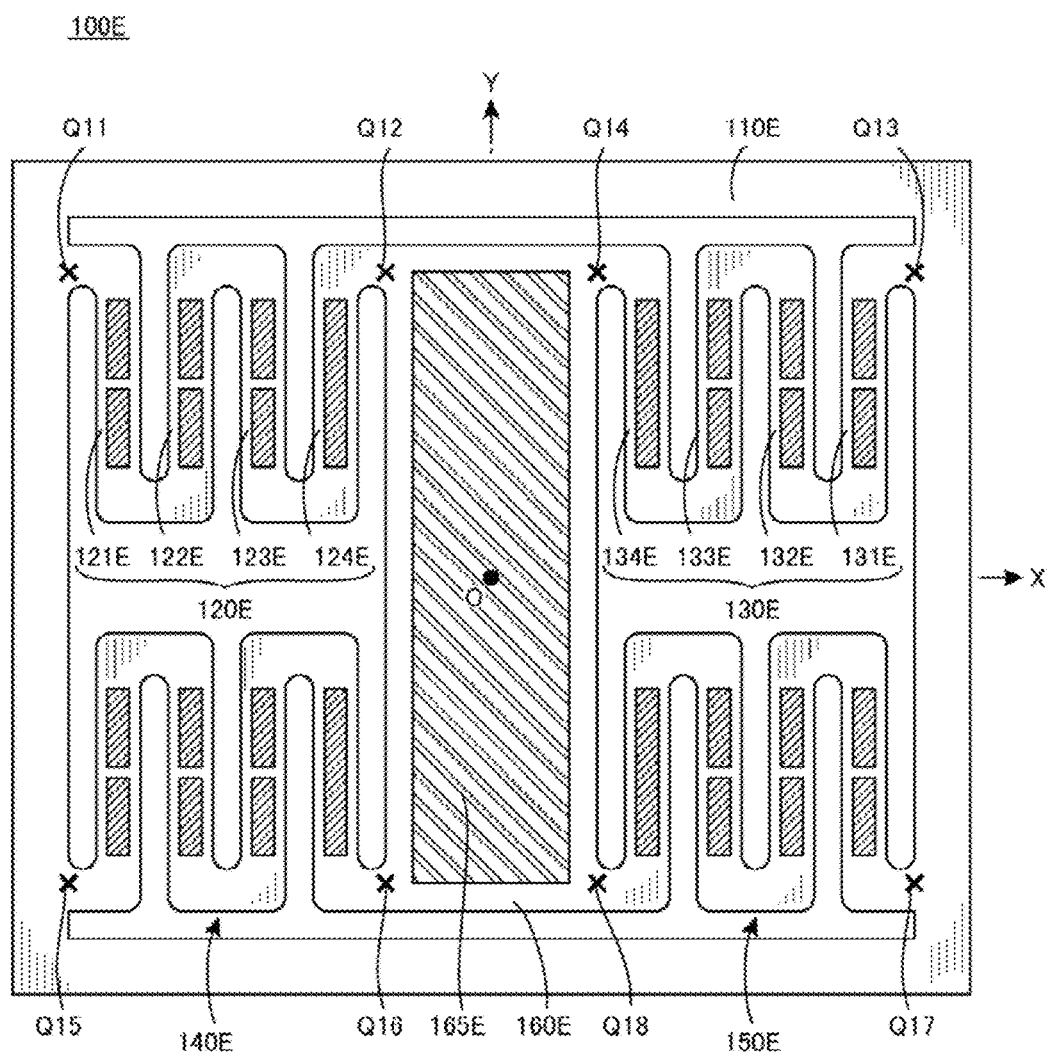
FIG. 12 is a top view of a variation of a seven-element and four-arm movable reflective device according to a variation of the present disclosure (the hatches are not intended to indicate the cross section, but to indicate individual areas)

FIG. 12 is a top view of a seven-element and four-arm movable reflective device 100E. The movable reflective device 100E has four arms that are longer than the four arms of the movable reflective device 100D illustrated in FIG. 11, and seven piezoelectric elements arranged in each arm. Here again, the movable reflective device 100E includes four arms 120E, 130E, 140E, and 150E arranged between a mirror 160E with a reflective layer 165E formed thereon and a support 110E having a frame structure, and the fixation points Q12, Q14, Q16, and Q18 in the vicinities of four corners of the mirror 160E are connected to the fixation points Q11, Q13, Q15, and Q17 located on the support 110E.

The arms 120E, 130E, 140E, and 150E each have four bridges, and a total of seven piezoelectric elements are arranged on the upper surface of each arm. For example, the first arm 120E has a first bridge 121E, a second bridge 122E, a third bridge 123E, and a fourth bridge 124E, while the second arm 130E has a first bridge 131E, a second bridge 132E, a third bridge 133E, and a fourth bridge 134E.

The arrangement of the seven piezoelectric elements disposed on each arm is the same as the seven-element movable reflective device 100C illustrated in FIG. 9. For example, a proximal-end-side piezoelectric element and a distal-end-side piezoelectric element are arranged on each of the first bridge 121E, the second bridge 122E, and the third bridge 123E, which are included in the first arm 120E, while a single lengthwise piezoelectric element is arranged on the fourth bridge 124E. The same applies to the arrangement of the piezoelectric elements for the second to fourth arms 130E, 140E, and 150E.

The four-arm movable reflective device 100E can independently control the upward/downward displacement of the four corners of the mirror 160E, similarly to the four-arm movable reflective device 100D illustrated in FIG. 11, thus providing greater flexibility in the attitude control for the reflective layer 165E. Since the specific driving method for the individual arms is the same as those used in the basic embodiments described above, the description thereof is omitted here.

Figure 13:
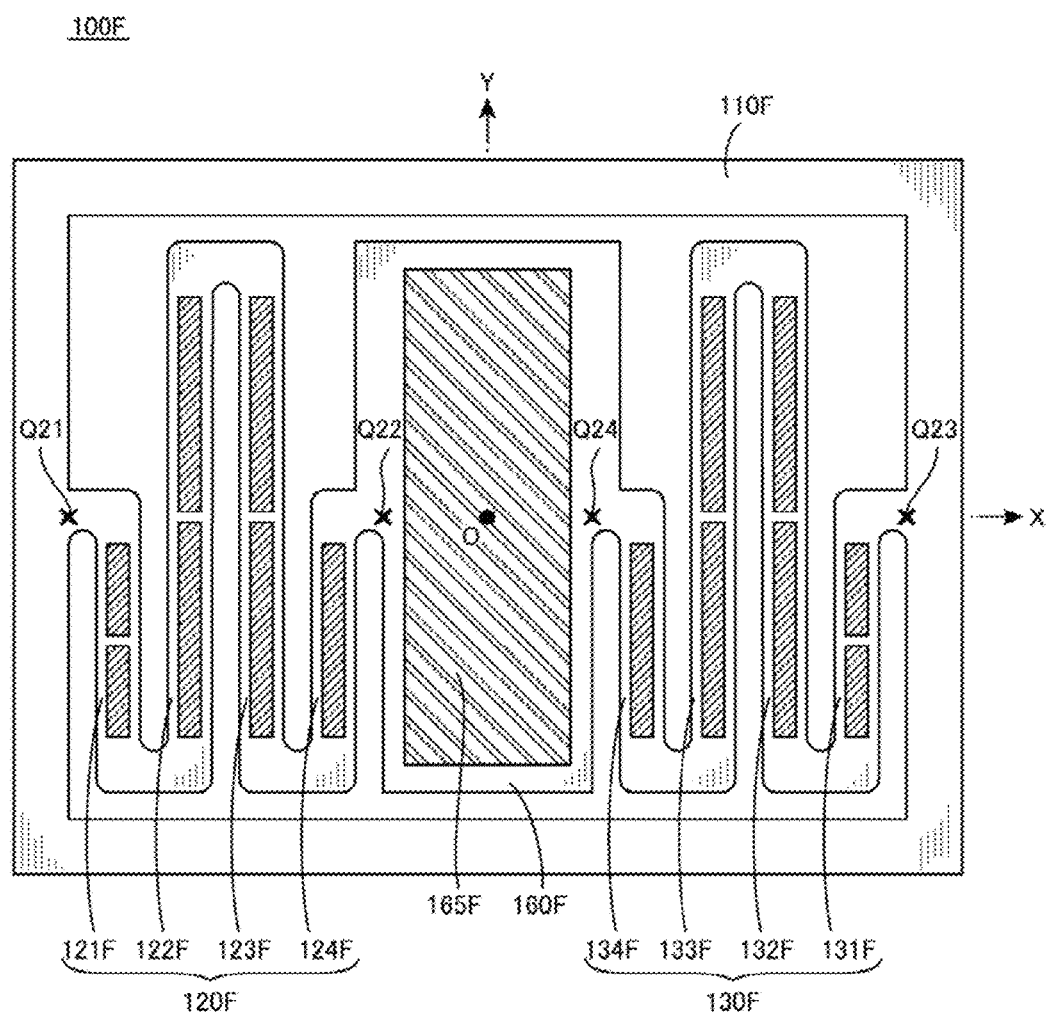
FIG. 13 is a top view of a seven-element and center-connection two-arm movable reflective device according to a variation of the present disclosure (the hatches are not intended to indicate the cross section, but to indicate individual areas)

FIG. 13 is a top view of a seven-element and center-connection two-arm movable reflective device 100F. The movable reflective device 100F supports a mirror by two arms similarly to the movable reflective device 100C illustrated in FIG. 9, but has slightly different support positions. That is, the movable reflective device 100F includes two arms 120F and 130F arranged between a mirror 160F on which a reflective layer 165F is formed and a support 110F having a frame structure. The first arm 120F serves as a connection of a fixation point Q21 located on the negative X axis of the support 110F to a fixation point Q22 located on the negative X axis of the mirror 160F, and the second arm 130F serves as a connection of a fixation point Q23 located on the positive X axis of the support 110F to a fixation point Q24 located on the positive X axis of the mirror 160F.

As illustrated, the first arm 120F has four bridges 121F, 122F, 123F, and 124F, and the second arm 130F has four bridges 131F, 132F, 133F, and 134F. Here, the second and third bridges 122F, 123F, 132F, and 133F have lengths longer than those of the first and fourth bridges 121F, 124F, 131F, and 134F. In the implementations described above, each bridge has the same length, but the lengths of the bridges are not necessarily the same.

The arrangement of the seven piezoelectric elements arranged on each of the arms 120F and 130F is the same as that of the seven-element movable reflective device 100C illustrated in FIG. 9. For example, a proximal-end-side piezoelectric element and a distal-end-side piezoelectric element are arranged on each of the first bridge 121F, the second bridge 122F, and the third bridge 123F, which are included in the first arm 120F, while a single lengthwise piezoelectric element is arranged on the fourth bridge 124F. The same applies to the arrangement of the piezoelectric elements for the second arm 130F.

The two-arm movable reflective device 100F can independently control the upward/downward displacement of the fixation points Q22 and Q24, and is thus suitable for tilting the reflective layer 165F in the X-axis direction. Since the specific driving method for the individual arms is the same as those used in the basic embodiments described above, the description thereof is omitted here.

In the movable reflective device 100F, the mirror 160F is configured as a rectangular plate-like member, and the first arm 120F is connected to a central portion of the left side of the rectangle formed by the plate-like member, while the second arm 130F is connected to a central portion of the right side (side opposite to the left side) of the rectangle formed by the plate-like member.

As such, when the mirror is configured as the rectangular plate-like member and is supported with the two arms, the fixation points of the two arms to the mirror are not necessarily located at the corners of the rectangle, and may be arranged on the central portions of the sides of the rectangle, as in the example illustrated in FIG. 13.

Additionally, in each of the movable reflective device 100B illustrated in FIG. 8 and the movable reflective device 100C illustrated in FIG. 9, the fixation points Q2 and Q4 are defined on both the sides of the upper sides of the rectangular mirror 160 and 160C and are supported with the two arms. However, when the corners of the rectangular mirror are supported with the two arms, the two arms are not necessarily connected to the adjoining corners, but may be connected to the vicinities of any of the four corners. Thus, for example, the two arms may be connected to the vicinities of the two corners that are located at both ends of a diagonal line connecting opposing corners of the rectangle.

Section 6. Analysis on the Dimensional Ratio of the Piezoelectric Element

In Section 2, the deformed shape as illustrated in FIG. 5C is used as the basic principle of the present disclosure. This deformed shape is characterized in that the bridge 121 is divided into the proximal-end-side area 121a and the distal-end-side area 121b, and the proximal-end-side area 121a is caused to deform in a concave manner, while the distal-end-side area 121b is caused to deform in a convex manner. As such, in the present disclosure, different deformed shapes in the proximal-end-side area and the distal-end-side area are necessary for each of the bridges other than the last bridge. Thus for example in the first arm 120C of the movable reflective device 100C illustrated in FIG. 9, a pair of piezoelectric elements of the proximal-end-side piezoelectric element and the distal-end-side piezoelectric element are disposed on each of the bridges 121C, 122C, and 123C other than the last bridge 124C.

Here, considering the case of the upward (Z-axis positive direction) displacement of the mirror 160C, the role of the proximal-end-side piezoelectric element is to move the whole distal-end-side area 121b upwardly, as can be seen from the deformed shape of the proximal-end-side area 121a illustrated in FIG. 5C. In contrast, the role of the distal-end-side piezoelectric element is to cause the end of the distal-end-side area 121b to bow downwardly. Thus, the proximal-end-side piezoelectric element and the distal-end-side piezoelectric element have opposing effects on the displacement (upward/downward displacement) of the reference point P12 of FIG. 5C. That is, the proximal-end-side piezoelectric element has an effect of displacing the reference point P12 upwardly, while the distal-end-side piezoelectric element has an effect of displacing the reference point P12 downwardly.

In light of the above, the present inventors have recognized that an optimal design can be achieved by balancing of the effects of the proximal-end-side piezoelectric element and the distal-end-side piezoelectric element to maximize the amount of displacement of the mirror. Specifically, the movable reflective device 100B to 100F illustrated in FIGS. 8 to 13 use the same sized piezoelectric elements (the same width, length, and thickness) as the proximal-end-side piezoelectric element and the distal-end-side piezoelectric element arranged on the same bridge. However, changing the size balance between both of the piezoelectric elements would further increase the amount of displacement of the mirror.

To fully realize the benefits of the effects of deformation caused by the piezoelectric elements, the area of the piezoelectric element occupying the surface of each bridge may be increased as much as possible. Thus, adjusting the dimensional ratio in the longitudinal direction is most appropriate for balancing of the effects of the proximal-end-side piezoelectric element and the distal-end-side piezoelectric element while achieving the greatest possible area occupied by the piezoelectric elements. Thus, the present inventors performed an analysis to find a value of the dimensional ratio that provides the greatest amount of displacement, by selecting as analyzed objects the four-element movable reflective device 100A illustrated in FIG. 7 and the three-element movable reflective device 100B illustrated in FIG. 8 and measuring the amounts of displacement by changing the dimensional ratio of the proximal-end-side piezoelectric element to the distal-end-side piezoelectric element. The results of analysis are shown below. The results of analysis are obtained by simulations of a computer including an application program for FEM analysis.

Figures 14A, 14B:
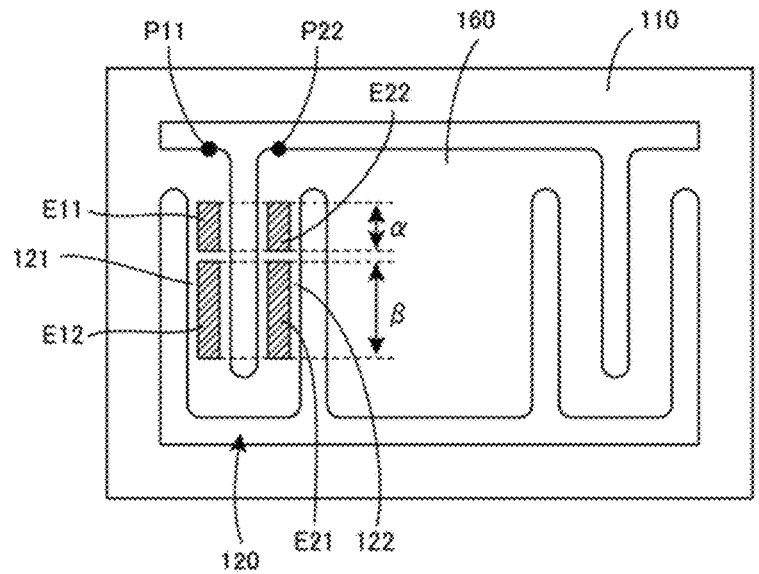
FIG. 14A is a diagram illustrating a dimensional ratio of the piezoelectric elements for the four-element movable reflective device illustrated in FIG. 7.
FIG. 14B is a table showing first analysis results obtained for the relationship between a variety of dimensional ratios of the piezoelectric elements and the amounts of displacement d for the four-element movable reflective device illustrated in FIG. 7.

FIGS. 14A and 14B, which are provided as a first variation, are diagrams illustrating first analysis results obtained for a relationship between variations of the dimensional ratio of the piezoelectric elements and the amount of displacement d for the four-element movable reflective device 100A illustrated in FIG. 7. FIG. 14A is a plan view of a four-element movable reflective device 100A1 that is used in the analysis. Here, only the profile of the basic structure and the four piezoelectric elements (portions with a hatch pattern of oblique lines) arranged on the first arm 120 are depicted so as not to overcomplicate the drawing. As illustrated, the proximal-end-side piezoelectric element E11 and the distal-end-side piezoelectric element E12 are arranged on the upper surface of the first bridge 121, and the proximal-end-side piezoelectric element E21 and the distal-end-side piezoelectric element E22 are arranged on the upper surface of the second bridge 122.

The movable reflective device 100A1 is characterized in that the dimensions (the dimension here is the length in the longitudinal direction; the same applies hereinafter) of the proximal-end-side piezoelectric element E11 and the distal-end-side piezoelectric element E22 are set to have the same length $\alpha$, and the dimensions of the proximal-end-side piezoelectric element E12 and the distal-end-side piezoelectric element E21 are set to have the same length $\beta$. Here, an arrangeable area that allows the piezoelectric elements to be arranged on the upper surface of the bridge is predetermined, and the distal-end-side piezoelectric element and the proximal-end-side piezoelectric element are arranged thereon so as to fill the arrangeable area. Although a slight gap is necessary between both of the piezoelectric elements, the distal-end-side piezoelectric element and the proximal-end-side piezoelectric element are arranged in all the arrangeable area other than the gap portion. Thus the sum of dimensions "$\alpha+\beta$" of both of the piezoelectric elements is kept constant, resulting in a relationship such that the dimensional value $\beta$ decreases as the dimensional value $\alpha$ increases.

The table of FIG. 14B shows the results of the above-mentioned analysis. The table shows values of the amounts of displacement d obtained for nine variations of the dimensional ratio $\alpha:\beta$ of the piezoelectric elements (having the same drive signal supplied). For example, the result shown in a row numbered 1 in the table shows that the amount of displacement d=+0.47, which is obtained when the dimensional ratio $\alpha:\beta$ is set to 1:9 (that is, $\beta/\alpha=9$) for the movable reflective device 100A1 illustrated in FIG. 14A. Here, the amount of displacement d is an amount of displacement of the reference point P22 relative to the Z-axis direction to the reference point P11 illustrated in FIG. 14A. Although the amount of displacement d is given in units of mm, the amount of displacement d is an amount determined depending on dimensions and material properties of components of the arm 120, materials of piezoelectric elements, applied voltage, and the like, and thus the absolute value of the amount is not greatly significant.

The movable reflective device 100A1 illustrated in FIG. 14A is basically the four-element movable reflective device 100A illustrated in FIG. 7, and the deformed shape of the first arm 120 becomes shaped as illustrated in FIG. 6A. Thus upon driving, the concave-deformation drive signal is supplied to the proximal-end-side piezoelectric elements E11 and E21, and the convex-deformation drive signal is supplied to the distal-end-side piezoelectric elements E12 and E22. The result shown in the row numbered 5 in the table of FIG. 14B shows that the amount of displacement d is +0.15, which is obtained when the dimensional ratio $\alpha:\beta$ is 1:1 (that is, $\beta/\alpha=1$) for the movable reflective device 100A1 illustrated in FIG. 14A. Here, the movable reflective device 100A1, for which the dimensional ratio $\alpha:\beta$ is set to 1:1, is exactly the type of four-element movable reflective device 100A illustrated in FIG. 7.

Examination of the analysis results in the table of FIG. 14B suggests that a large amount of displacement d is obtained when the proportion of the dimensional value $\beta$ in the dimensional ratio is large, compared with when the dimensional ratio $\alpha:\beta$ is set to 1:1. That is, such a relationship of the dimensional values $\alpha<\beta$ as in the movable reflective device 100A1 illustrated in FIG. 14A provides a large amount of displacement d. Among the nine variations in this analysis, the amount of displacement d is the largest when the dimensional ratio $\alpha:\beta$ is 1:9 (i.e., $\beta/\alpha=9$), as shown in the row numbered 1 in the table. Conversely, when the dimensional value $\alpha$ is set larger than the dimensional value $\beta$, the amounts of displacement d have negative values as shown in the rows numbered 6 to 9 in the table. That is, when the dimensional value $\alpha$ is set larger than the dimensional value $\beta$, the reference point P22 is displaced downwardly even with the drive signal supplied for the purpose of displacing the reference point P22 upwardly.

Figures 15A, 15B:
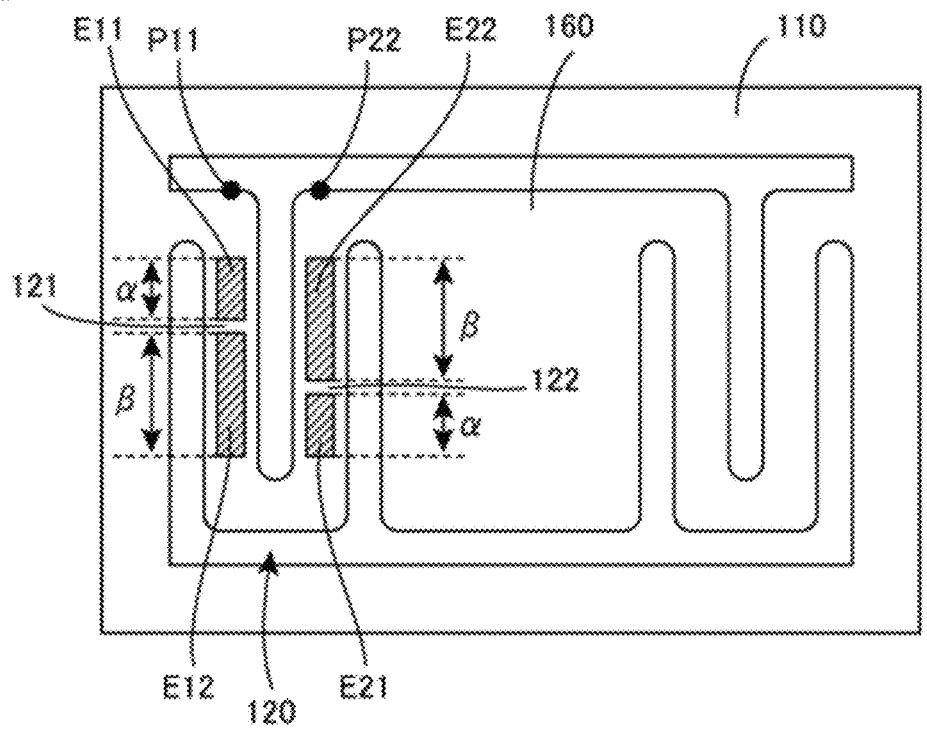
FIG. 15A is a diagram illustrating a dimensional ratio of the piezoelectric elements for the four-element movable reflective device illustrated in FIG. 7.
FIG. 15B is a table showing second analysis results obtained for the relationship between a variety of dimensional ratios of the piezoelectric elements and amounts of displacement d for the four-element movable reflective device illustrated in FIG. 7.

FIGS. 15A and 15B, which are provided as another variation, are diagrams illustrating second analysis results obtained for a relationship between variations of the dimensional ratio of the piezoelectric elements and the amount of displacement d for the four-element movable reflective device 100A illustrated in FIG. 7. FIG. 15A is a top view of the four-element movable reflective device 100A2 that is used in the analysis. Here again, only the profile of the basic structure and the four piezoelectric elements (portions with a hatch pattern of oblique lines) arranged on the first arm 120 are depicted so as not to overcomplicate the drawing. As illustrated, the proximal-end-side piezoelectric element E11 and the distal-end-side piezoelectric element E12 are arranged on the upper surface of the first bridge 121, and the proximal-end-side piezoelectric element E21 and the distalend-side piezoelectric element E22 are arranged on the upper surface of the second bridge 122. Such arrangement of the piezoelectric elements is basically the same as the arrangement of the piezoelectric elements in the movable reflective device 100A1 illustrated in FIG. 14A.

The movable reflective device 100A2 illustrated in FIG. 15A is characterized in that the dimensions of the proximal-end-side piezoelectric elements E11 and E21 are set to have the same length $\alpha$, and the dimensions of the distal-end-side piezoelectric elements E12 and E22 are set to have the same length $\beta$. The difference of the movable reflective devices in FIGS. 14A and 15A can be seen by comparison of the dimensions $\alpha$ and $\beta$ of each piezoelectric element. The brief description of the difference between both the movable reflective devices is as follows. First, in the movable reflective device 100A1 illustrated in FIG. 14A, the pair of piezoelectric elements E11 and E22 located on the upper side of the drawing has a dimension set to the same length $\alpha$, and the pair of piezoelectric elements E12 and E21 located on the lower side of the drawing has a dimension set to the same length $\beta$. In contrast, in the movable reflective device 100A2 illustrated in FIG. 15A, the proximal-end-side piezoelectric elements E11 and E21 have a dimension set to the same length $\alpha$, and the distal-end-side piezoelectric elements E12 and E22 have a dimension set to the same length $\beta$.

The table of FIG. 15B shows the analysis results for the above-mentioned movable reflective device 100A2. The table shows values of the amount of displacement d obtained for nine variations of the dimensional ratio $\alpha$:$\beta$ of the piezoelectric elements (having the same drive signal supplied). Here again, the amount of displacement d is an amount of displacement of the reference point P22 relative to the Z-axis direction with respect to the reference point P11 illustrated in FIG. 15A.

The movable reflective device 100A2 illustrated in FIG. 15A is also basically the four-element movable reflective device 100A illustrated in FIG. 7, and the deformed shape of the first arm 120 is similar to that illustrated in FIG. 6A. Thus upon driving, the concave-deformation drive signal is supplied to the proximal-end-side piezoelectric elements E11 and E21, and the convex-deformation drive signal is supplied to the distal-end-side piezoelectric elements E12 and E22. The result shown in the row numbered 5 in the table of FIG. 15B shows that the amount of displacement d is +0.145, which is obtained when the dimensional ratio $\alpha$:$\beta$ is 1:1 (that is, $\beta\alpha$=1) for the movable reflective device 100A2 illustrated in FIG. 15A. Here, the movable reflective device 100A2, for which the dimensional ratio $\alpha$:$\beta$ is set to 1:1, is exactly the type of four-element movable reflective device 100A illustrated in FIG. 7.

Although the result, "+0.15", shown in the row numbered 5 in the table of FIG. 14B is slightly different from the result, "+0.145", shown in the row numbered 5 in the table of FIG. 15B, this difference results from the difference in the number of significant digits for the amounts of displacement d shown as data. The results in the row numbered 5 in both of the tables are the results obtained for the four-element movable reflective device 100A illustrated in FIG. 7 when the dimensional ratio $\alpha$:$\beta$ is 1:1, and thus the values of the amounts of displacement d obtained are essentially the same.

Examination of the analysis results in the table of FIG. 15B suggests that the values of the amounts of displacement d are all positive regardless of the setting of the dimensional values $\alpha$ and $\beta$, and the reference point P22 in each variation is displaced upwardly. Further, when the dimensional value $\alpha$ is smaller than the dimensional value $\beta$, the amount of displacement d tends to increase. However, upon comparison between the absolute values of the amounts of displacement d in the tables of FIGS. 14B and 15B, the absolutes values in the table of FIG. 15B are found to be generally smaller. The results suggest that the setting of the dimensional ratio of the piezoelectric elements illustrated in FIG. 14A is more preferable than that of the piezoelectric elements illustrated in FIG. 15A to obtain a large amount of displacement d of the reference point P22.

Figures 16A, 16B:
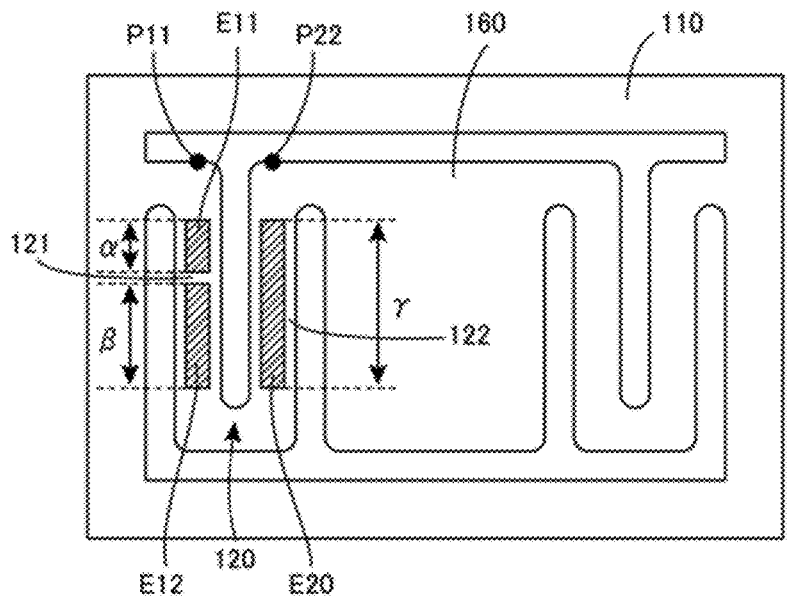
FIG. 16A is a diagram illustrating a dimensional ratio of the piezoelectric elements for the three-element movable reflective device illustrated in FIG. 8.
FIG. 16B is a table showing analysis results obtained for the relationship between a variety of dimensional ratios of the piezoelectric elements and amounts of displacement d for the three-element movable reflective device illustrated in FIG. 8.

FIGS. 16A and 16B, which are provided as the last variation, are diagrams illustrating analysis results obtained for a relationship between variations of the dimensional ratio of the piezoelectric elements and the amount of displacement d for the three-element movable reflective device 100B illustrated in FIG. 8. FIG. 16A is a top view of the three-element movable reflective device 100B that is used in the analysis. Here again, only the profile of the basic structure and the three piezoelectric elements (portions with a hatch pattern of oblique lines) arranged on the first arm 120 are depicted so as not to overcomplicate the drawing. As illustrated, the proximal-end-side piezoelectric element E11 and the distal-end-side piezoelectric element E12 are arranged on the upper surface of the first bridge 121, and the lengthwise piezoelectric element E20 is arranged on the upper surface of the second bridge 122.

The movable reflective device 100B is characterized in that the dimension of the proximal-end-side piezoelectric element E11 located on the first bridge 121 is set to have the same length $\alpha$, and the dimensions of the distal-end-side piezoelectric element E12 is set to have the same length $\beta$. Here again, the proximal-end-side piezoelectric element E11 and the distal-end-side piezoelectric element E12 are arranged so as to fill an arrangeable area on the first bridge 121. Thus the sum of dimensions "$\alpha+\beta$" of both the piezoelectric elements is maintained constant, resulting in a relationship such that the dimensional value $\beta$ decreases as the dimensional value $\alpha$ increases. In contrast, the single lengthwise piezoelectric element E20 is arranged on the upper surface of the second bridge 122, and the dimension thereof is fixed to the length $\gamma$ in all the variations. Here, $\gamma=\alpha+\beta+\delta$, where $\delta$ is a dimension of a gap provided between the proximal-end-side piezoelectric element E11 and the distal-end-side piezoelectric element E12.

The table of FIG. 16B shows the results of the above-mentioned analysis. The table shows values of the amounts of displacement d obtained for nine variations of the dimensional ratio $\alpha$:$\beta$ of the piezoelectric elements (having the fixed dimensions $\gamma$ and $\delta$ and the same drive signal supplied). Here, the amount of displacement d is an amount of displacement of the reference point P22 relative to the Z-axis direction to the reference point P11 illustrated in FIG. 16A.

The movable reflective device 100B illustrated in FIG. 16A is basically the three-element movable reflective device 100B illustrated in FIG. 8, and the deformed shape of the first arm 120 similar to that illustrated in FIG. 6B. Thus upon driving, the concave-deformation drive signal is supplied to the proximal-end-side piezoelectric element E11 and the lengthwise piezoelectric element E20, and the convex-deformation drive signal is supplied to the distal-end-side piezoelectric element E12. The result shown in the row numbered 5 in the table of FIG. 16B shows that the amount of displacement d is +0.29, which is obtained when the dimensional ratio $\alpha$:$\beta$ is 1:1 (that is, $\beta/\alpha$=1) for the movable reflective device 100B illustrated in FIG. 16A. Here, the movable reflective device 100B, for which the dimensional ratio α:β is set to 1:1, is exactly the type of three-element movable reflective device 100B illustrated in FIG. 8.

Examination of the analysis results in the table of FIG. 16B suggests that the values of the amounts of displacement d are all positive regardless of the setting of the dimensional values α and β, and the reference point P22 in each variation is displaced upwardly. When the dimensional value α is smaller than the dimensional value β, the amount of displacement d tends to increase. By comparison of the amounts of upward displacement d (positive amounts of displacement d) in the tables FIGS. 14B, 15B, and 16B, the results shown in the table of FIG. 16B are found to have the greatest values in all of the variations. The results suggest that the arrangement of the piezoelectric elements illustrated in FIG. 16A is the most preferable to obtain a large amount of displacement d of the reference point P22. If α:β=10:0 in the arrangement illustrated in FIG. 16A, the arrangement is equivalent to the two-element device illustrated in (a) of FIG. 1AB, and the amount of displacement d is smaller than that of the result numbered 9 in the table of FIG. 16B.

Figure 17:
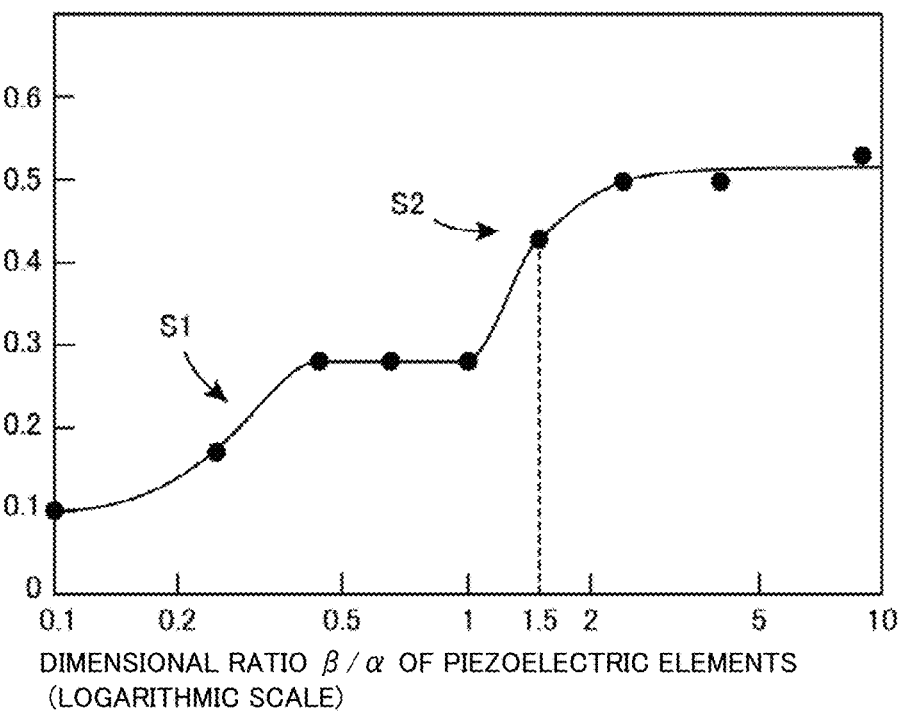
FIG. 17 is a graph showing the amount of displacement d as a function of the dimensional ratio $\beta/\alpha$, created on the basis of the analysis results illustrated in FIG. 16B (the horizontal axis is presented in a logarithmic scale)
Figure 18:
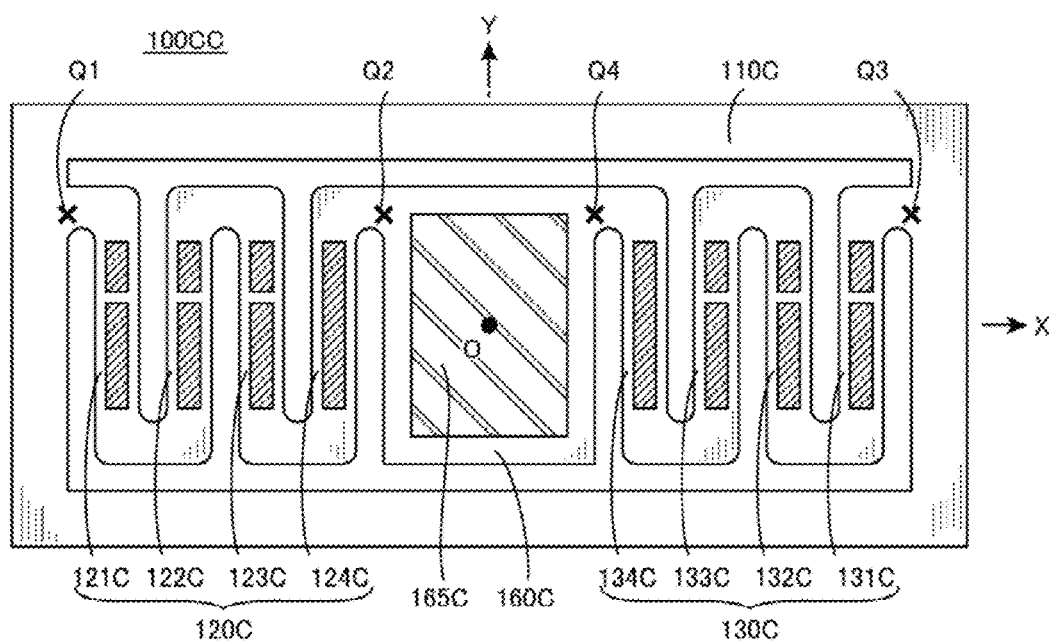
FIG. 18 is a top view illustrating an example variation of the seven-element movable reflective device according to the present disclosure illustrated in FIG. 9 (the hatches are not intended to indicate the cross section, but to indicate individual areas)

FIG. 17 is a "graph showing the amount of displacement d as a function of the dimensional ratio β/α" produced based on the analysis results for the movable reflective device 100B illustrated in FIG. 16B. The dimensional ratio β/α in the horizontal axis is plotted logarithmically. The range of the horizontal axis in the graph (range of the dimensional ratio β/α) is approximately from 0.1 to 10. This is because the analysis results are within this range, as shown in the table of FIG. 16B. If the dimensional ratio β/α is set out of this range, the dimensional value of one piezoelectric element is extremely small, which is less preferable in practice because implementation issues arise, such as difficulties in wiring the electrodes.

As far as the range of the dimensional ratio β/α shown in this graph is concerned, the higher dimensional ratio β/α is found to provide the greater amount of displacement d. It is noted, however, that a first shoulder S1 and a second shoulder S2 appear in the graph. The reasons for the shoulders S1 and S2 appearing at such two locations are unclear, but designing the dimensional ratio β/α to be in a range to the right of the second shoulder S2, that is, in a range of 1.5 or more is preferable in practice. With the dimensional ratio β/α equal to or higher than 2, no further increase in the amount of displacement d is achievable, and thus extreme increase in the dimensional ratio β/α is not greatly significant in practice. Extreme increase in the dimensional ratio β/α provides extreme decrease in one dimensional value, which is less preferable because implementation issues arise, such as difficulties in wiring the electrodes. Thus preferable setting of limits of the dimensional ratio β/α in practice is to set the lower limit to 1.5 and the upper limit to a value just before the occurrence of the implementation issues (e.g., approximately 9). The graph shows that with the lower limit being set to 1.5 and the upper limit being set to 9, a preferable amount of displacement d can be obtained at least in such a range.

The analysis results shown in FIG. 16B are obtained by a computer-based FEM analysis using various analysis parameters for the movable reflective device 100B having the structure illustrated in FIG. 16A. Examples of the analysis parameters include length, width, thickness, and the material properties (modulus of elasticity) of the arm, width of the piezoelectric element, and the like. The present inventors executed analyses repeatedly by trying various sets of these analysis parameters, and found that the shape of the graph showing the amount of displacement d as a function of the dimensional ratio β/α had no significant change, and particularly the second shoulder S2 is kept unchanged at the dimensional ratio β/α=1.5. This suggests that the phenomenon in which the shoulder appears at the dimensional ratio β/α=1.5 is not a special phenomenon occurring only when particular analysis parameters are set, but is a universal phenomenon not dependent on the values of the analysis parameters. In addition, sufficiently acceptable amounts of displacement d are obtained at least at the dimensional ratio β/α=9 or less in any of the analysis results.

The present inventors further performed similar analyses on the seven-element movable reflective device 100C illustrated in FIG. 9. As a result, the results that are consistent with the analysis results shown in FIGS. 14A to 16B are obtained. In the seven-element movable reflective device 100C illustrated in FIG. 9, two piezoelectric elements are arranged on the upper surface of each of the first bridge 121C, the second bridge 122C, and the third bridge 123C. As illustrated in FIG. 14A, the dimension of the piezoelectric elements located on the upper side of the drawing is set to α, and the dimension of the piezoelectric elements located on the lower side of the drawing is set to β. Then, changes in the amounts of displacement d are analyzed using various values of the dimensional ratio β/α. The analysis resulted in the graph showing that the amount of displacement d increases as the dimensional ratio β/α increases, and a shoulder appeared at the dimensional ratio β/α=1.5, similarly to the graph of FIG. 17. In addition, sufficiently acceptable amounts of displacement d are obtained at least at the dimensional ratio β/α=9 or less.

This suggests that the features (optimal conditions of the dimensional ratio of the piezoelectric elements) seen in the graph of FIG. 17 can appear not only in the three-element movable reflective device 100B illustrated in FIG. 16A including two bridges per a single arm, but similarly in a typical odd-number-of-element movable reflective device including a plurality of n bridges.

When the arm is the odd-number-of element movable reflective device including the n bridges, a pair of piezoelectric elements, that is, the proximal-end-side piezoelectric element and the distal-end-side piezoelectric element, is disposed on each of the first to (n−1)th bridges. In this case, considering the "optimal conditions of the dimensional ratio of the piezoelectric elements" described above, a greater amount of displacement d can be obtained such that one of the pair of piezoelectric elements disposed on each bridge is set to have a length longer than the other relative to the longitudinal axis of the bridge. Here, the piezoelectric element having a longer length is referred to as a long element, and the piezoelectric element having a shorter length is referred to as a short element. The odd-numbered bridge may be configured such that the proximal-end-side piezoelectric element is a short element and the distal-end-side piezoelectric element is a long element. The even-numbered bridge may be configured such that the proximal-end-side piezoelectric element is a long element and the distal-end-side piezoelectric element is a short element.

The movable reflective device 100B illustrated in FIG. 16A is a three-element movable reflective device for which n is set to 2, and the first (odd-numbered) bridge 121 is configured such that the proximal-end-side piezoelectric element E11 is a short element having a dimensional value α and the distal-end-side piezoelectric element E12 is a long element having a dimensional value β. According to the "optimal conditions of the dimensional ratio of the piezoelectric elements" described above, the dimensional ratio β/α is preferably set to 1.5 or more. In this three-element movable reflective device, the second (even-numbered)

bridge 122 is provided with a lengthwise piezoelectric element having a dimensional value γ, instead of the short element and the long element.

Referring back to the seven-element movable reflective device 100C illustrated in FIG. 9, the two piezoelectric elements having the same dimension such that the dimensional values α=β are arranged on each of the first to third bridges. However, considering the "optimal conditions of the dimensional ratio of the piezoelectric elements" described above, the seven-element movable reflective device may be preferably configured, in practice, to be a type of the movable reflective device 100CC illustrated in FIG. 18 instead of the movable reflective device 100C illustrated in FIG. 9.

The movable reflective device 100CC, which is a seven-element movable reflective device for which n is set to 4, includes a support 110C that is a frame member, a mirror 160C that is a rectangular plate-like member, and two arms 120C and 130C connecting the support 110C to the mirror 160C and each having seven piezoelectric elements. The first and third (odd-numbered) bridges are configured such that the proximal-end-side piezoelectric elements are the long elements and the distal-end-side piezoelectric elements are the long elements. The second (even-numbered) bridge is configured such that the proximal-end-side piezoelectric element is the long element and the distal-end-side piezoelectric element is the short element. Such a configuration satisfies the "optimal conditions of the dimensional ratio of the piezoelectric elements" described above, and can provide an increased amount of displacement d. Provided that the dimension of the short element is α and the dimension of the long element is β in each of the first to (n−1)th bridges, the dimensional ratio β/α is preferably set to 1.5 or more, as described above.

Figure 19:
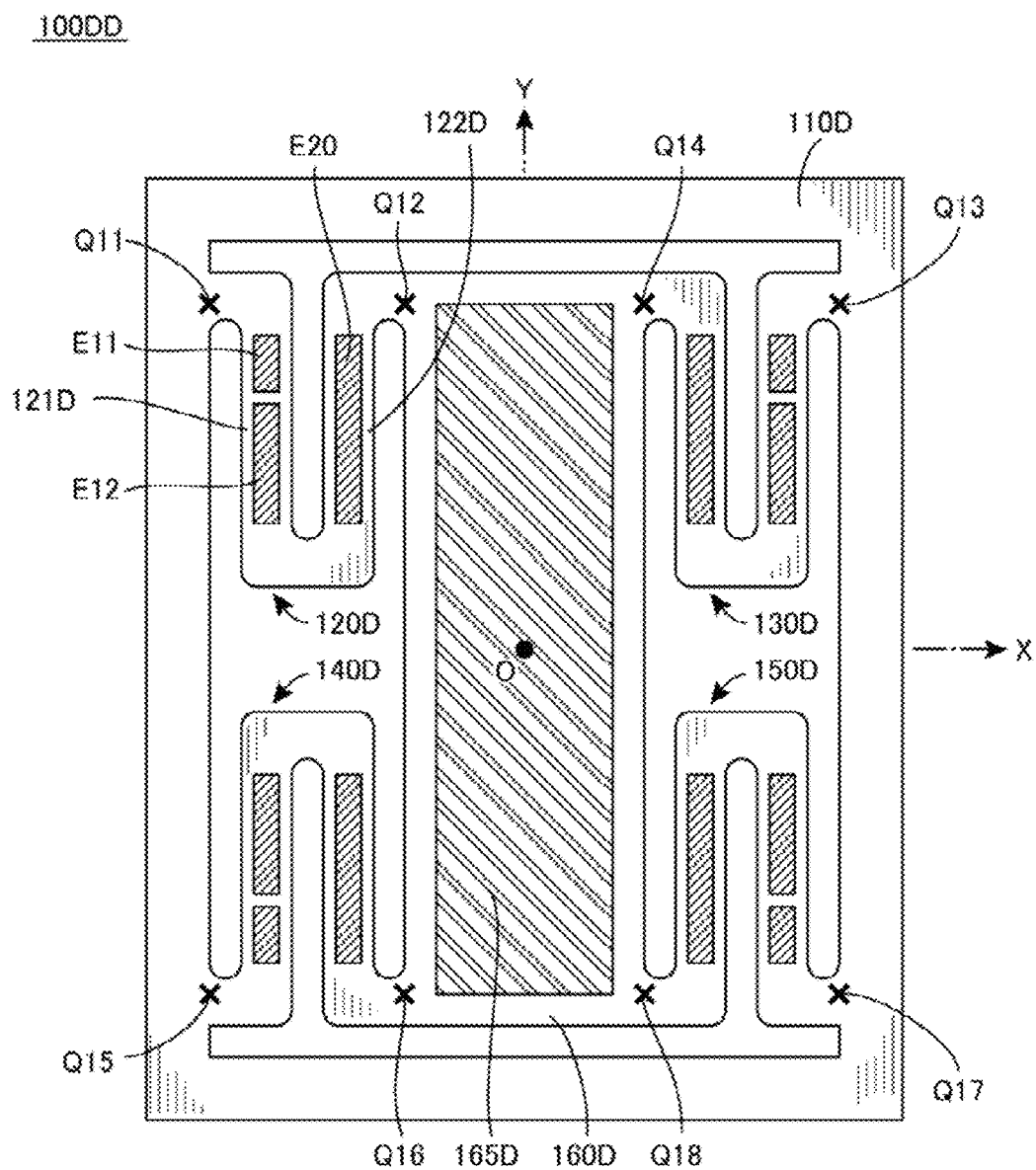
FIG. 19 is a top view illustrating an example variation of a four-arm movable reflective device according to the present disclosure illustrated in FIG. 11 (the hatches are not intended to indicate the cross section, but to indicate individual areas)
Figure 20:
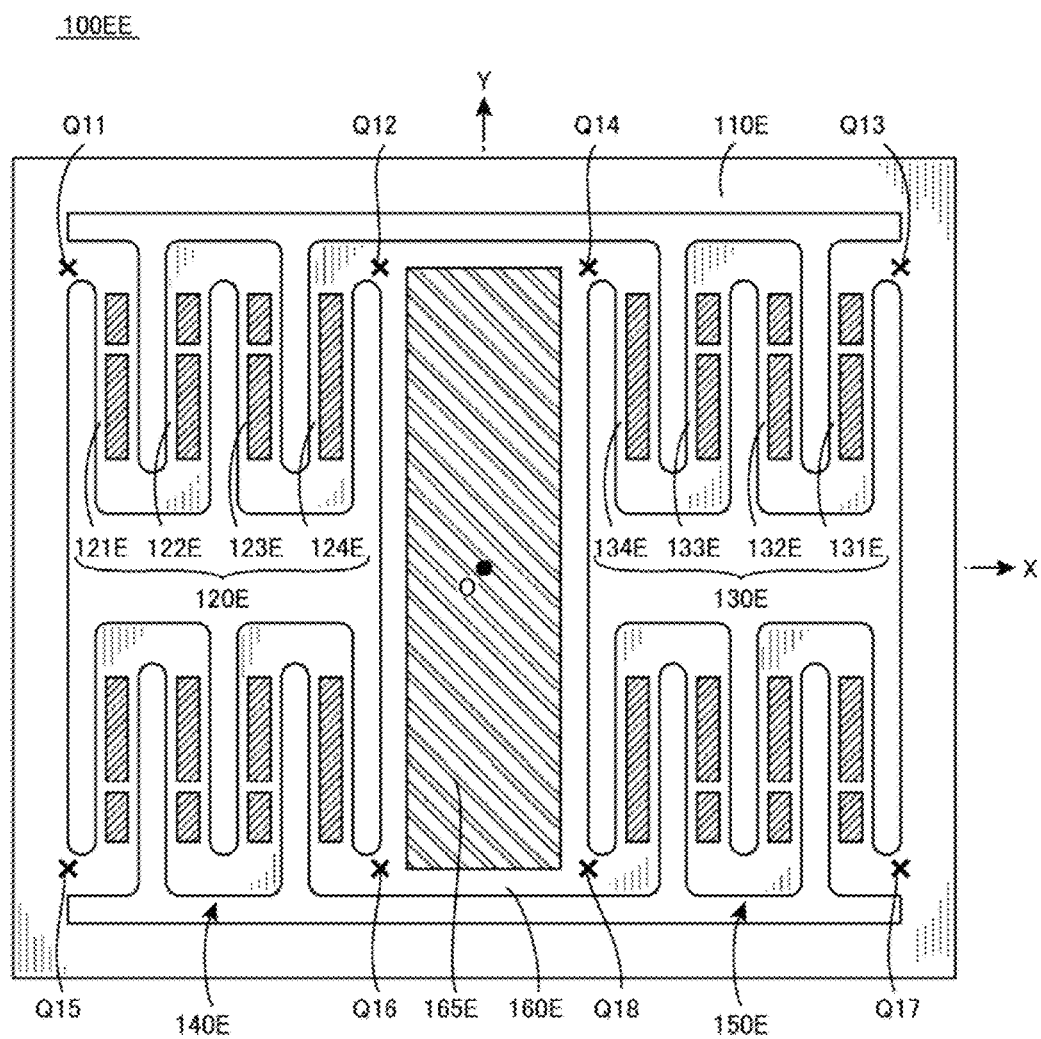
FIG. 20 is a top view illustrating an example variation of the seven-element and four-arm movable reflective device according to the present disclosure illustrated in FIG. 12 (the hatches are not intended to indicate the cross section, but to indicate individual areas)
Figure 21:
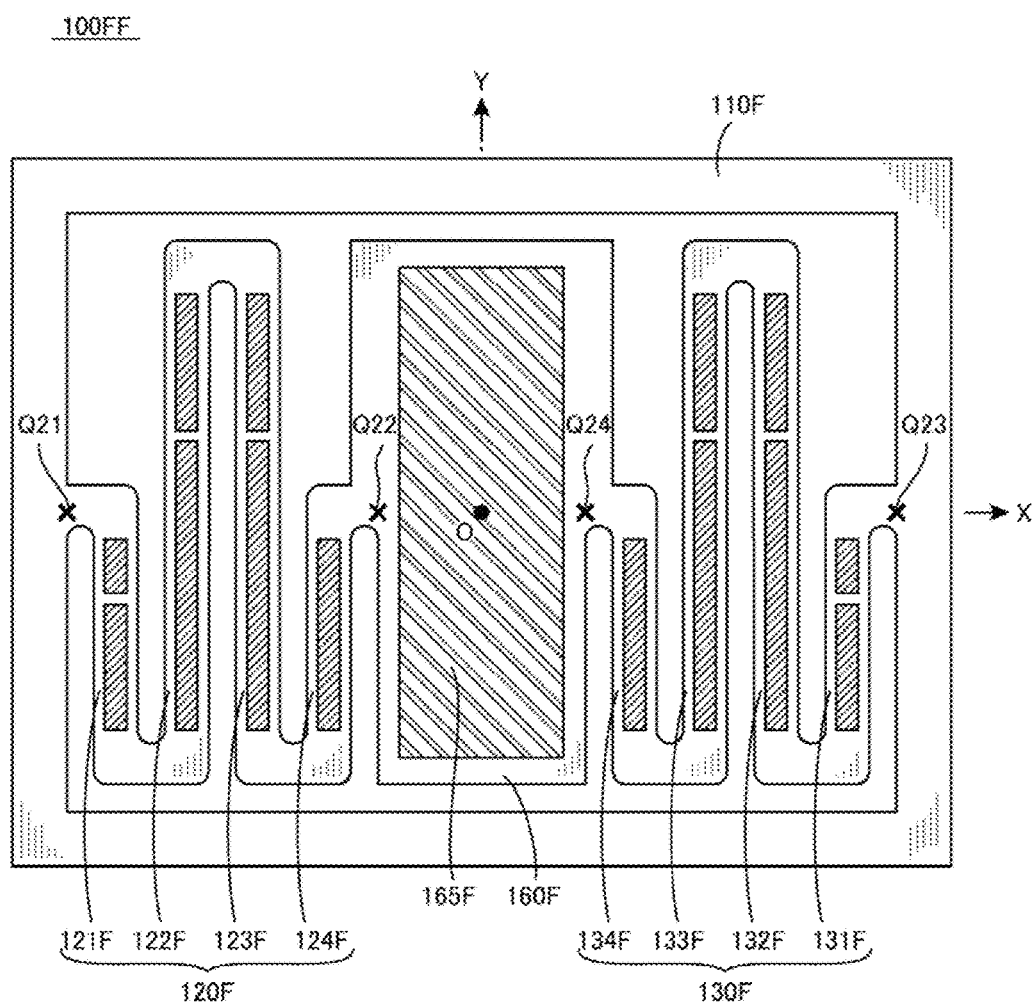
FIG. 21 is a top view illustrating an example variation of the seven-element and center-connection two-arm movable reflective device according to the present disclosure illustrated in FIG. 13 (the hatches are not intended to indicate the cross section, but to indicate individual areas)

Similarly, the four-arm movable reflective device 100D illustrated in FIG. 11 is preferably configured to be a type of a movable reflective device 100DD illustrated in FIG. 19, considering the "optimal conditions of the dimensional ratio of the piezoelectric elements". Additionally, the seven-element and four-arm movable reflective device 100E illustrated in FIG. 12 is preferably configured to be a type of a movable reflective device 100EE illustrated in FIG. 20, and the seven-element and center-connection two-arm movable reflective device 100F illustrated in FIG. 13 is preferably configured to be a type of a movable reflective device 100FF illustrated in FIG. 21. In any case, β/α, which is a ratio of the dimensional value α of the short element to the dimensional value β of the long element, is preferably set to 1.5 or more.

An approach to improving the displacement of the last distal end of the arm having a total of n (n≥2) bridges is provided by disposing on the first to (n−1)th bridges a short element having a dimensional value α and a long element having a dimension value β, in which the odd-numbered bridge includes a short element on the proximal-end side and a long element on the distal-end side, the even-numbered bridge includes a long element on the proximal-side end and a short element on the distal-end side, and the dimensional ratio β/α is preferably 1.5 or more. This approach is effective for any type of piezoelectric element disposed on the nth bridge.

For example, the implementations of FIGS. 16A, 18, 19, 20, and 21 are examples in which the short element and the long element are arranged on the first to (n−1)th bridge, and the lengthwise piezoelectric element is arranged on the nth bridge. However, providing a type of element other than the lengthwise piezoelectric element in the nth bridge can also benefit from the above approach. For example, as illustrated in FIG. 14A, the above approach is also effective in the example in which the short element and the long element are disposed on the nth (n=2 in this example) bridge.

In the example illustrated in FIG. 14A, a pair of piezoelectric elements E11 and E12 is disposed on the first (odd-numbered) bridge 121, and a pair of piezoelectric elements E21 and E22 is disposed on the second (nth) bridge 122. In other words, the example illustrated in FIG. 14A is the same as the example illustrated in FIG. 7 in that the two piezoelectric elements are disposed on each of the bridges 121 and 122. However, since the first (odd-numbered) bridge 121 of the example of FIG. 14A is configured such that the piezoelectric element E11 is the short element and the piezoelectric element E12 is the long element, the example of FIG. 14A benefits from increasing the tilt angle θ4 (see FIG. 5C) formed in a direction extending from the proximal end to the distal end of the second (nth) bridge 122, compared with the example of FIG. 7.

As a generality, considering an arm including a total of n (n≥2) bridges with a short element and a long element both disposed on each of the first to (n−1)th bridges, in which the odd-numbered bridge includes the short element on the proximal-end side and the long element on the distal-end side, and the even-numbered bridge includes the long element on the proximal-end side and the short element on the distal-end side, the effects provided by the arm having such a configuration, that is, the effects of improving the displacement of the last distal end of the arm, are also effective in an example in which the proximal-end-side piezoelectric element and the distal-end-side piezoelectric element are disposed on the nth bridge as in the four-element movable reflective device 100A1 illustrated in FIG. 14A. Similarly, the condition that the dimensional ratio β/α is preferably 1.5 or more is also effective. In short, the effects provided by the above configuration are effective regardless of the configuration of the piezoelectric elements for the nth bridge.

Section 7. Embodiments of Composite Movable Reflective Device

Finally, a composite movable reflective device including a combination of two of the above-mentioned movable reflective devices is described. The composite movable reflective device described here has a so-called gimbal structure in which two movable reflective devices are combined, one nesting inside the other, and a mirror of the first movable reflective device is replaced with the entirety of the second movable reflective device.

Figure 22:
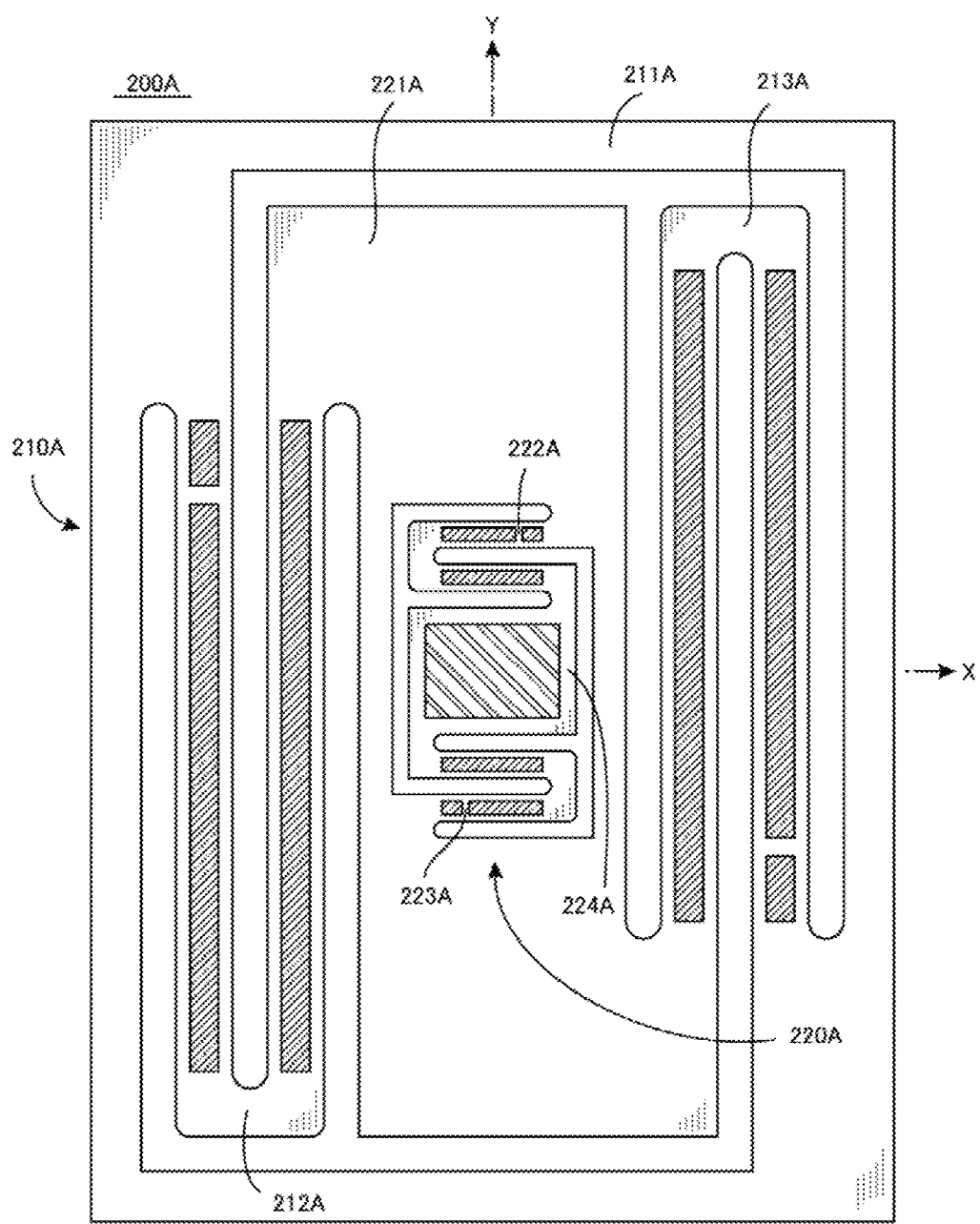
FIG. 22 is a top view illustrating a first embodiment of a composite movable reflective device according to the present disclosure (the hatches are not intended to indicate the cross section, but to indicate individual areas)

FIG. 22 is a top view illustrating a first embodiment of such a composite movable reflective device. Here again, the hatches are not intended to indicate the cross section, but to indicate individual areas. A composite movable reflective device 200A as illustrated is a device having a combination of a first movable reflective device 210A and a second movable reflective device 220A, and in the first movable reflective device 210A, the entirety of the second movable reflective device 220A is substituted for a portion of the first movable reflective device 210A, which portion would be otherwise a mirror.

The outer periphery of the first movable reflective device 210A is configured by a support 211A that is a frame member, and a first arm 212A and a second arm 213A are connected to the inner sides of the support 211A. In the above-mentioned movable reflective devices, the mirror is supported with these two arms 212A and 213A, but in the case of the illustrated composite movable reflective device 200A, the mirror is replaced with the entirety of the second movable reflective device 220A.

That is, in the composite movable reflective device 200A, the two arms 212A and 213A of the first movable reflective device 210A serve as a connection of a support 211A of the first movable reflective device 210A to a support 221A of the second movable reflective device 220A. Piezoelectric elements are arranged on the upper surfaces of the two arms 212A and 213A (at portions hatched with oblique lines in the drawing), and can be deformed by supply of drive signals from a non-illustrated driver. Such deformation of the arms 212A and 213A of the first movable reflective device by the piezoelectric elements of the first movable reflective device 210A enables control of the relative position of the support 221A of the second movable reflective device 220A to the support 211A of the first movable reflective device 210A.

In contrast, the second movable reflective device 220A, which has the same configuration as the above-mentioned movable reflective devices, includes the support 221A, two arms 222A and 223A, and a mirror 224A. The mirror 224A includes a reflective layer (portion hatched with double oblique lines in the drawing) formed thereon, and displacement of the mirror 224A enables control of the attitude of the reflective layer.

The two arms 222A and 223A of the second movable reflective device 220A serve as a connection of the support 221A of the second movable reflective device 220A to the mirror 224A of the second movable reflective device 220A. Piezoelectric elements are arranged on the upper surfaces of the two arms 222A and 223A (at portions hatched with oblique lines in the drawing), and can be deformed by supply of drive signals from a non-illustrated driver. Such deformation of the arms 222A and 223A of the second movable reflective device 220A by the piezoelectric elements of the second movable reflective device 220A enables control of the relative position of the mirror 224A of the second movable reflective device 220A to the support 221A of the second movable reflective device 220A.

In addition, the common reference axis of the first movable reflective device 210A (the longitudinal axis in which the bridges of the arms 212A and 213A extend: Y axis in the drawing) is disposed perpendicular to the common reference axis of the second movable reflective device 220A (the longitudinal axis in which the bridges of the arms 222A and 223A extend: X axis in the drawing).

The first movable reflective device 210A and the second movable reflective device 220A are basically a three-element movable reflective device in which three piezoelectric elements are arranged on each arm. Specifically, the movable reflective device 100B illustrated in FIG. 8 is modified such that the position of the connection point of the second arm 130 to the support 110 is changed from the reference point Q3 located upward to a point located downward, the position of the connection point of the second arm 130 to the mirror 160 is changed from the reference point Q4 located at the upper right corner of the mirror 160 to the lower right corner thereof, and the U-shaped structure of the second arm 130 is vertically inverted. Use of such a configuration provides support of two corner points on a diagonal line of the rectangular mirror 160 by the two arms, and upward drive of one arm and downward drive of the other arm enable the mirror 160 to rotate about a predetermined pivot.

The setting of the dimensions $\alpha$ and $\beta$ of the proximal-end-side piezoelectric element and the distal-end-side piezoelectric element is made such that $\alpha < \beta$, as in the example illustrated in FIG. 16A, and the dimensional ratio $\beta/\alpha$ is 1.5 or more, thereby satisfying the "optimal conditions of the dimensional ratio of the piezoelectric elements" described in Section 6.

Thus the composite movable reflective device 200A illustrated in FIG. 22 can cause the entirety of the second movable reflective device 220A to rotate about a first pivot by driving the first movable reflective device 210A. In addition, driving of the second movable reflective device 220A enables the mirror 224A to rotate about a second pivot. Thus driving both of the first movable reflective device 210A and the second movable reflective device 220A enables the mirror 224A to rotate about the first pivot and the second pivot, which can control the mirror 224A to have any attitude.

Figure 23:
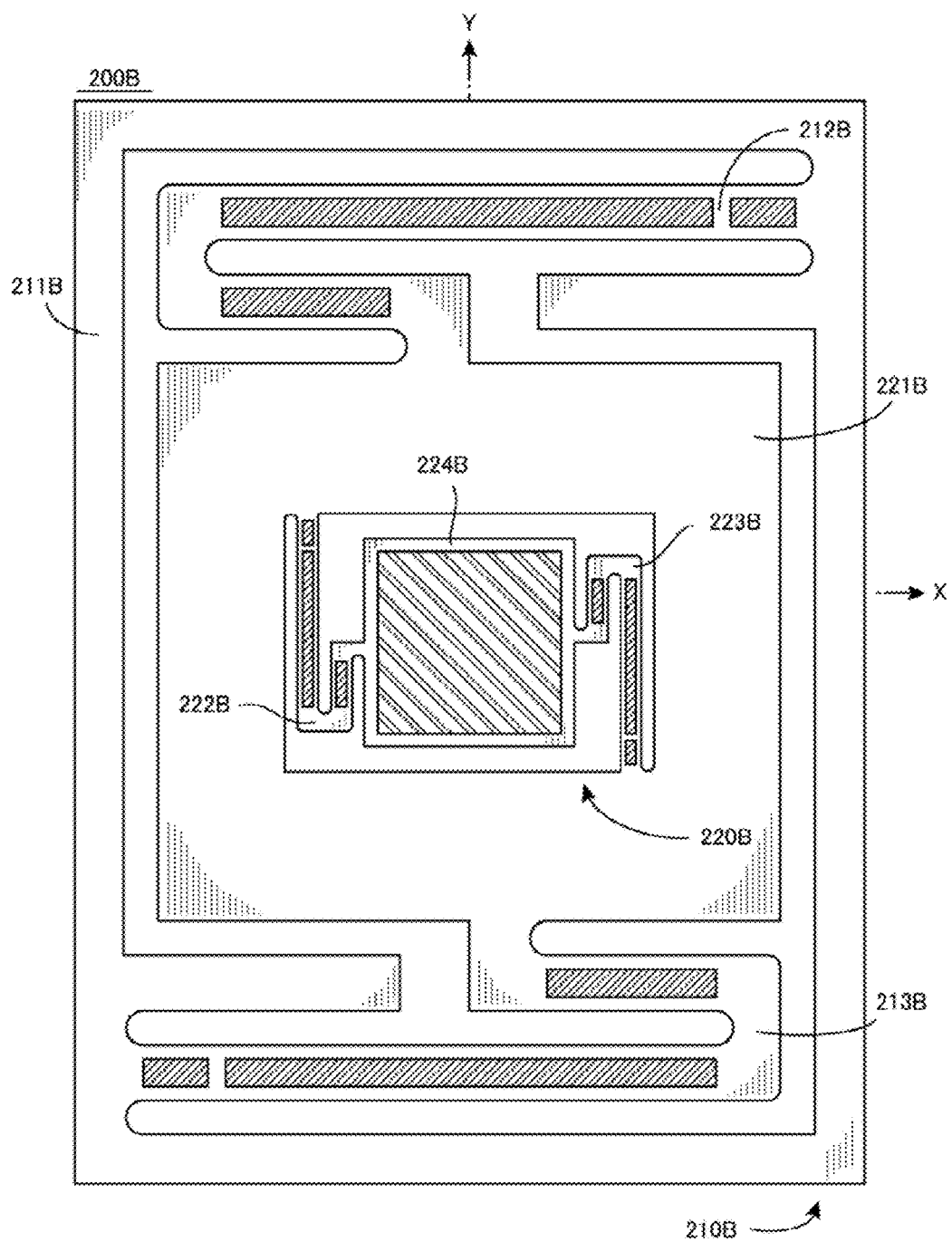
FIG. 23 is a top view illustrating a second embodiment of a composite movable reflective device according to the present disclosure (the hatches are not intended to indicate the cross section, but to indicate individual areas)

FIG. 23 is a top view illustrating a second embodiment of the composite movable reflective device. A composite movable reflective device 200B as illustrated is a device having a combination of a first movable reflective device 210B and a second movable reflective device 220B, and in the first movable reflective device 210B, the entirety of the second movable reflective device 220B is substituted for a portion of the first movable reflective device 210B, which portion would be otherwise a mirror.

The first arm 212B and the second arm 213B are connected to the inner sides of the support 211B of the first movable reflective device 210B, and a support 221B of the second movable reflective device 220B is supported by these two arms. The first arm 222B and the second arm 223B are connected to the inner sides of the support 221B of the second movable reflective device 220B, and the mirror 224B is supported by these two arms. Here again, piezoelectric elements are arranged on the upper surface of each arm (at portions hatched with oblique lines in the drawing), and can be deformed by supply of drive signals from a non-illustrated driver.

The first movable reflective device 210B and the second movable reflective device 220B used here are basically a three-element movable reflective device, and are designed to satisfy the "optimal conditions of the dimensional ratio of the piezoelectric elements" described in Section 6 by the setting of the dimensional ratio $\beta/\alpha$ to 1.5 or more. In addition, the common reference axis (X axis in the drawing) of the first movable reflective device 210B is disposed perpendicular to the common reference axis (Y axis in the drawing) of the second movable reflective device 220B. This thus enables rotation of the mirror 224B about the X axis taken as a pivot and also about the Y axis taken as another pivot, which can control the reflective layer (portion hatched with double oblique lines in the drawing) formed on the mirror 224B to have any attitude.

Figure 24:
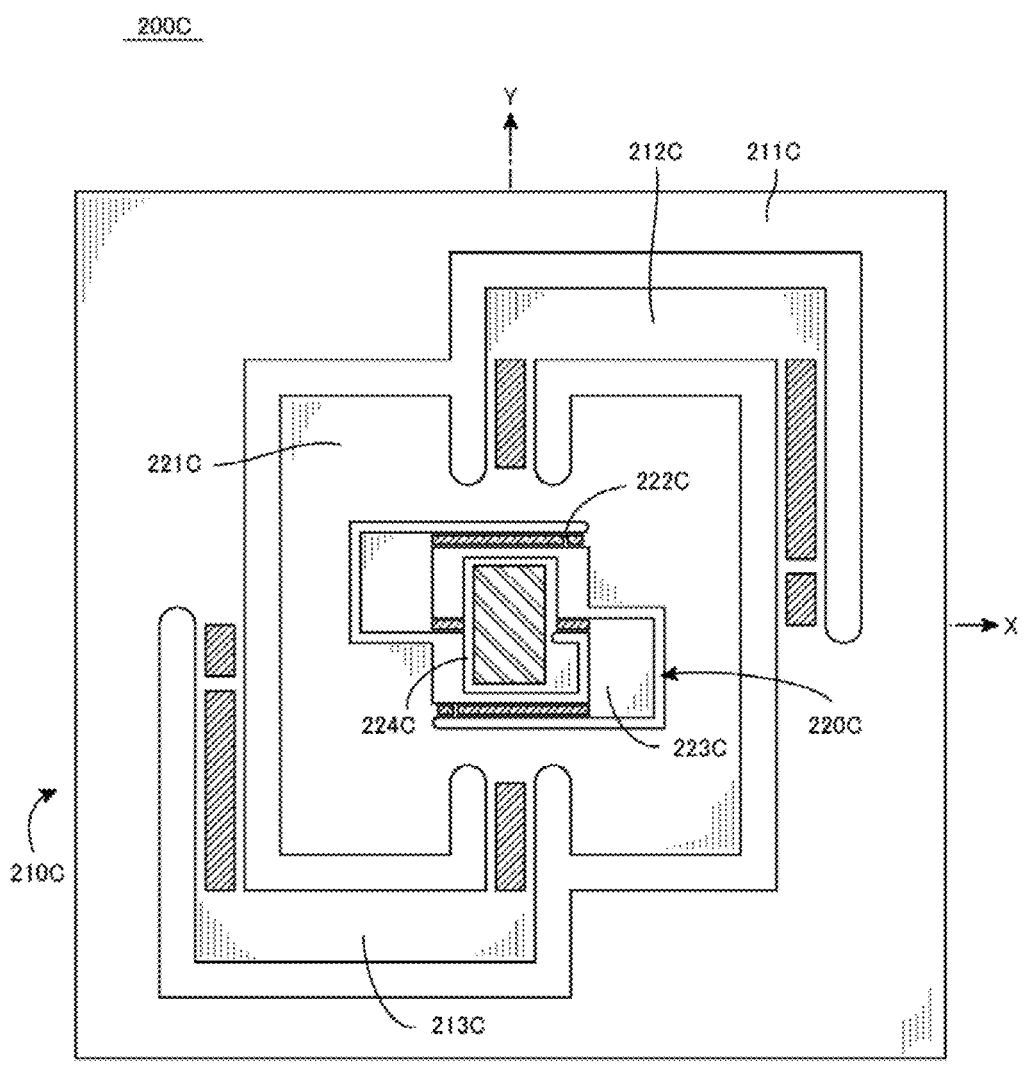
FIG. 24 is a top view illustrating a third embodiment of a composite movable reflective device according to the present disclosure (the hatches are not intended to indicate the cross section, but to indicate individual areas)

FIG. 24 is a top view illustrating a third embodiment of the composite movable reflective device. A composite movable reflective device 200C as illustrated is a device having a combination of a first movable reflective device 210C and a second movable reflective device 220C, and in the first movable reflective device 210C, the entirety of the second movable reflective device 220C is substituted for a portion of the first movable reflective device 210C, which portion would be otherwise a mirror.

The first arm 212C and the second arm 213C are connected to the inner sides of the support 211C of the first movable reflective device 210C, and a support 221C of the second movable reflective device 220C is supported by these two arms. The first arm 222C and the second arm 223C are connected to the inner sides of the support 221C of the second movable reflective device 220C, and the mirror 224C is supported by these two arms. Here again, piezoelectric elements are arranged on the upper surface of each arm (at portions hatched with oblique lines in the drawing), and can be deformed by supply of drive signals from a non-illustrated driver.

The first movable reflective device 210C and the second movable reflective device 220C used here are basically a three-element movable reflective devices, and are designed to satisfy the "optimal conditions of the dimensional ratio of the piezoelectric elements" described in Section 6 by the setting of the dimensional ratio β/α to 1.5 or more. In addition, the common reference axis (Y axis in the drawing) of the first movable reflective device 210C is disposed perpendicular to the common reference axis (X axis in the drawing) of the second movable reflective device 220C. This thus enables rotation of the mirror 224C about the X axis taken as a pivot and also about the Y axis taken as another pivot, which can control the reflective layer (portion hatched with double oblique lines in the drawing) formed on the mirror 224C to have any attitude.

Figure 25:
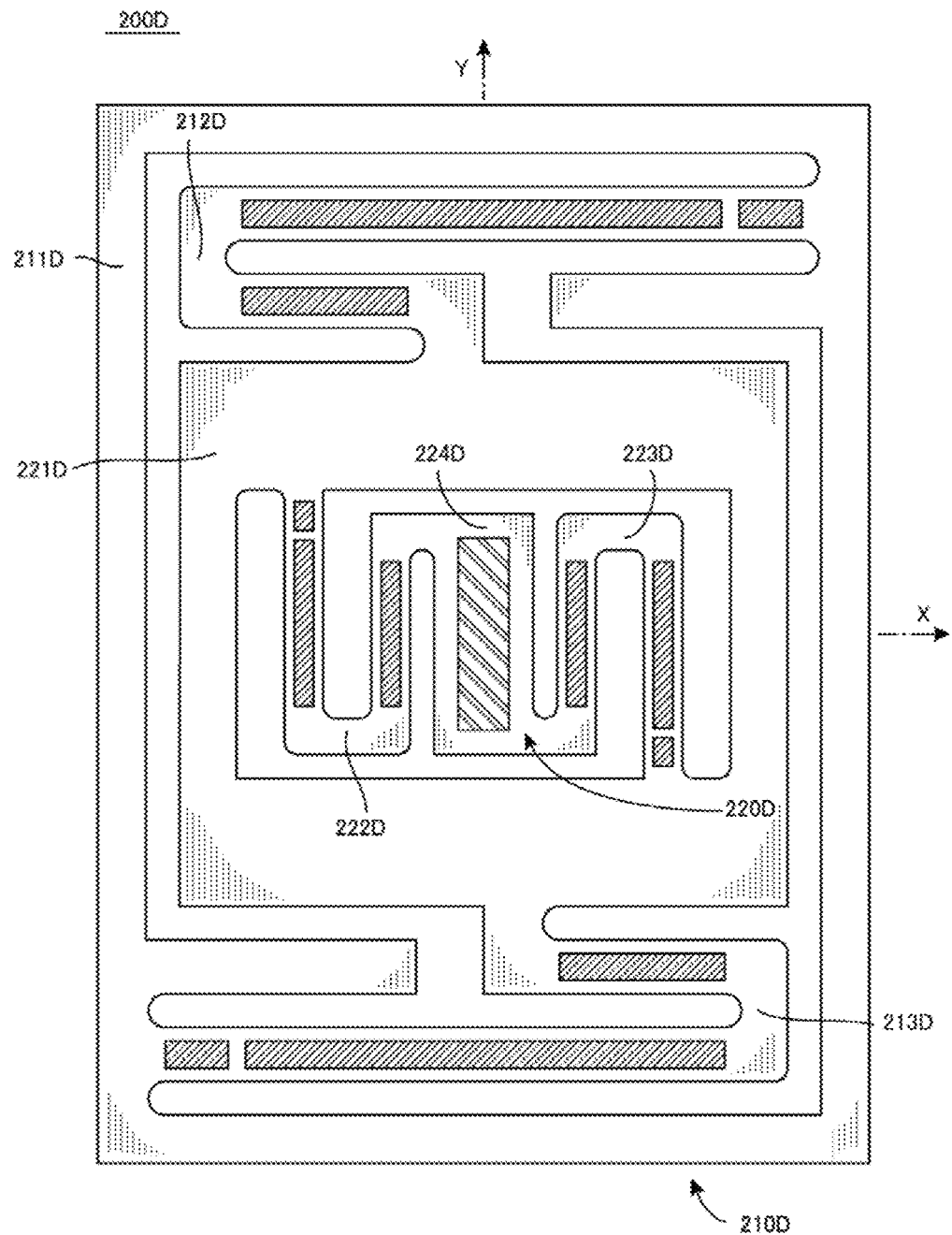
FIG. 25 is a top view illustrating a fourth embodiment of a composite movable reflective device according to the present disclosure (the hatches are not intended to indicate the cross section, but to indicate individual areas).

FIG. 25 is a top view illustrating a fourth embodiment of the composite movable reflective device. A composite movable reflective device 200D as illustrated is a device having a combination of a first movable reflective device 210D and a second movable reflective device 220D, and in the first movable reflective device 210D, the entirety of the second movable reflective device 220D is substituted for a portion of the first movable reflective device 210D, which portion would be otherwise a mirror.

The first arm 212D and the second arm 213D are connected to the inner sides of the support 211D of the first movable reflective device 210D, and a support 221D of the second movable reflective device 220D is supported by these two arms. The first arm 222D and the second arm 223D are connected to the inner sides of the support 221D of the second movable reflective device 220D, and the mirror 224D is supported by these two arms. Here again, piezoelectric elements are arranged on the upper surface of each arm (at portions hatched with oblique lines in the drawing), and can be deformed by supply of drive signals from a non-illustrated driver.

The first movable reflective device 210D and the second movable reflective device 220D used here are basically a three-element movable reflective devices, and are designed to satisfy the "optimal conditions of the dimensional ratio of the piezoelectric elements" described in Section 6 by the setting of the dimensional ratio β/α to 1.5 or more. In addition, the common reference axis (X axis in the drawing) of the first movable reflective device 210D is disposed perpendicular to the common reference axis (Y axis in the drawing) of the second movable reflective device 220D. This thus enables rotation of the mirror 224D about the X axis taken as a pivot and also about the Y axis taken as another pivot, which can control the reflective layer (portion hatched with double oblique lines in the drawing) formed on the mirror 224D to have any attitude.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese patent Application No. 2015-116200, filed on Jun. 9, 2015, the entire disclosure of which is incorporated by reference herein.

REFERENCE SIGNS LIST 100, 100A to 100F, 100A1, 100A2, 100CC, 100DD, 100EE, and 100FF Movable reflective device
110, 110C to 110F Support
111 Right side frame portion
112 Upper side frame portion
113 Left side frame portion
114 Lower side frame portion
120, 120C to 120F First arm
121 First bridge of first arm
121a Proximal-end-side area of bridge 121
121b Distal-end-side area of bridge 121
121C to 121F First bridge of first arm
122 Second bridge of first arm
122a Proximal-end-side area of bridge 122
122b Distal-end-side area of bridge 122
122C to 122F Second bridge of first arm
123C, 123E, 123F Third bridge of first arm
124C, 124E, 124F Fourth bridge of first arm
130, 130C to 130F Second arm
131, 131C, 131E, 131F First bridge of second arm
132, 132C, 132E, 132F Second bridge of second arm
133C, 133E, 133F Third bridge of second arm
134C, 134E, 134F Fourth bridge of second arm
140D, 140E Third arm
150D, 150E Fourth arm
160, 160C to 160F Mirror
165, 165C to 165F Reflective layer
180 Driver
200A to 200D Composite movable reflective device
210A to 210D First movable reflective device
211A to 211D Support of first movable reflective device
212A to 212D First arm of first movable reflective device
213A to 213D Second arm of first movable reflective device
220A to 220D Second movable reflective device
221A to 221D Support of second movable reflective device
222A to 222D First arm of second movable reflective device
223A to 223D Second arm of second movable reflective device
224A to 224D Mirror of second movable reflective device
d1 to d3 Amount of displacement
E1 to E4, E1', E1" Piezoelectric element
E1, E21, E31, E41 Proximal-end-side piezoelectric element
E12, E22, E32, E42 Distal-end-side piezoelectric element
E20, E40 Lengthwise piezoelectric element
Ea Upper electrode
Eb Piezoelectric material layer
Ec Lower electrode
Ed Common lower electrode
Ee Common piezoelectric material layer
L1, L2 Longitudinal axis (axis parallel to Y axis)
M1 to M5 Intermediate connector
O Origin of three-dimensional orthogonal coordinate system
P11 to P22 Reference point
Q1 to Q4, Q11 to Q18, Q21 to Q24 Fixation point
R1 First connection path R2 Second connection path
S1 First shoulder
S2 Second shoulder
X, Y, Z Coordinate axis of three-dimensional orthogonal coordinate system
α Dimension of short element
β Dimension of long element
γ Dimension of lengthwise piezoelectric element
θ1 to θ4 Tilt angle

The invention claimed is:

1. A movable reflective device, comprising:
a mirror including a reflective surface;
a support for supporting the mirror;
an arm having one end connected to the support and another end connected to the mirror; and
piezoelectric elements for causing the arm to deform in accordance with an electrical signal provided, a relative position of the mirror to the support being controllable by deformation of the arm caused by the piezoelectric elements,
wherein the arm comprises n bridges and n+1 intermediate connectors, where n≥2, and the arm connects a predetermined portion of the support to a predetermined portion of the mirror along a single connection path,
wherein the n bridges are plate-like structures extending along different predetermined longitudinal axes;
wherein when one end of each bridge, closer to the support on the connection path, is referred to as a proximal end, and another end of each bridge, closer to the mirror on the connection path, is referred to as a distal end, a first intermediate connector connects the predetermined portion of the support to the proximal end of a first bridge, an ith intermediate connector connects the distal end of an (i−1)th bridge to the proximal end of an ith bridge, and an (n+1)th intermediate connector connects the distal end of an nth bridge to the predetermined portion of the mirror, where 2≤i≤n,
wherein each of the first to (n−1)th bridges includes a proximal-end-side piezoelectric element arranged on a proximal-end side and a distal-end-side piezoelectric element arranged on a distal-end side, and the nth bridge includes a lengthwise piezoelectric element extending from a vicinity of the proximal end to a vicinity of the distal end, and
wherein each of the proximal-end-side piezoelectric element, the distal-end-side piezoelectric element, and the lengthwise piezoelectric element is disposed on an upper surface or a lower surface of the corresponding bridge, and stretches and contracts a surface of the corresponding bridge along the longitudinal axis in accordance with the electrical signal provided.

2. The movable reflective device according to claim 1,
wherein a pair of piezoelectric elements disposed on each of the first to (n−1)th bridges consists of a piezoelectric element having a first length and a piezoelectric element having a second length along the longitudinal axis of the bridge, the first length being longer than the second length, and
wherein when the piezoelectric element having the first length is referred to as a long element and the piezoelectric element having the second length is referred to as a short element, for an odd-numbered bridge, the proximal-end-side piezoelectric element is the short element and the distal-end-side piezoelectric element is the long element, and for an even-numbered bridge, the proximal-end-side piezoelectric element is the long element and the distal-end-side piezoelectric element is the short element.

3. The movable reflective device according to claim 2, wherein a dimensional ratio β/α is set to be 1.5 or more for each of the first to (n−1)th bridge, where α is a dimension of the short element and β is a dimension of the long element.

4. The movable reflective device according to claim 1, wherein the support is a frame structure, the mirror and the arm are disposed inside the frame structure, and the first intermediate connector of the arm is fixed to an inner surface of the frame structure.

5. The movable reflective device according to claim 1, wherein the longitudinal axis of each bridge is parallel to a predetermined common reference axis.

6. The movable reflective device according to claim 5, wherein when an XYZ three-dimensional orthogonal coordinate system is defined, the n bridges and n+1 intermediate connectors that are included in the arm include upper surfaces contained in an XY plane and lower surfaces contained in a predetermined plane parallel to the XY plane, and the longitudinal axes of the n bridges are set to be axes parallel to a Y axis that is the common reference axis.

7. The movable reflective device according to claim 6,
wherein each piezoelectric element includes a piezoelectric material layer expanding in directions parallel to the XY plane, an upper electrode formed on an upper surface of the piezoelectric material layer, and a lower electrode formed on a lower surface of the piezoelectric material layer, and
wherein each piezoelectric element has a property of stretching and contracting in a direction parallel to the XY plane upon application of voltage across the upper electrode and the lower electrode.

8. The movable reflective device according to claim 7, wherein each piezoelectric element is disposed on the upper surface of the corresponding bridge, and the lower electrode is fixed on the upper surface of the corresponding bridge.

9. The movable reflective device according to claim 8, wherein each piezoelectric element includes the upper electrode, the piezoelectric material layer, and the lower electrode, and orthogonal projection images of the upper electrode, the piezoelectric material layer, and the lower electrode, obtained by orthogonal projection onto the XY plane, are overlaid with one another.

10. The movable reflective device according to claim 8, wherein a common lower electrode is formed on an upper surface of the arm, the separate piezoelectric material layers for forming the corresponding piezoelectric elements are formed at predetermined positions on an upper surface of the common lower electrode, the separate upper electrodes are formed on the upper surfaces of the corresponding piezoelectric material layers, and the common lower electrode includes areas in which the separate piezoelectric material layers are formed, the areas serving as the lower electrodes for the corresponding piezoelectric elements.

11. The movable reflective device according to claim 8,
wherein a common lower electrode is formed on an upper surface of the arm, a common piezoelectric material layer is formed on an upper surface of the common lower electrode, and separate upper electrodes for forming separate piezoelectric elements are formed on an upper surface of the common piezoelectric material layer, and
wherein the common piezoelectric material layer includes areas in which the separate upper electrodes are formed, the areas serving as the piezoelectric material layers of the separate piezoelectric elements, and the common lower electrodes include areas in which the separate upper electrodes are formed, the areas serving as lower electrodes of the separate piezoelectric elements.

12. The movable reflective device according to claim 1, wherein the arm includes one or more U-shaped structures, each including a plate-like member having a U-shaped plan view shape.

13. The movable reflective device according to claim 1, wherein the arm includes a first arm and a second arm, and wherein the first arm is disposed along a first connection path connecting a first fixation point located on the support to a second fixation point located on the mirror, and the second arm is disposed along a second connection path connecting a third fixation point located on the support and a fourth fixation point located on the mirror.

14. The movable reflective device according to claim 13, wherein the mirror includes a rectangular plate-like member, and the first arm and the second arm are connected to vicinities of any of four corners of a rectangle formed by the plate-like member.

15. The movable reflective device according to claim 13, the mirror includes a rectangular plate-like member, the first arm is connected to a central portion of a first side of a rectangle formed by the plate-like member, and the second arm is connected to a central portion of a second side of the rectangle, the first side being opposite to the second side.

16. The movable reflective device according to claim 1, wherein the arm include first to fourth arms,
wherein the first arm is disposed along a first connection path connecting a first fixation point located on the support to a second fixation point located on the mirror, the second arm is disposed along a second connection path connecting a third fixation point located on the support to a fourth fixation point located on the mirror, the third arm is disposed along a third connection path connecting a fifth fixation point located on the support to a sixth fixation point located on the mirror, and the fourth arm is disposed along a fourth connection path connecting a seventh fixation point located on the support to an eighth fixation point located on the mirror, and
wherein the mirror includes a rectangular plate-like member, and the first to fourth arms are connected to respective vicinities of first to fourth corners of a rectangle formed by the plate-like member.

17. A composite movable reflective device, comprising:
first and second movable reflective devices according to claim 1, wherein the mirror of the first movable reflective device is replaced with an entirety of the second movable reflective device,
wherein the support of the first movable reflective device is connected to the support of the second movable reflective device by the arm of the first movable reflective device, and a relative position of the support of the second movable reflective device to the support of the first movable reflective device is controllable by deformation of the arm of the first movable reflective device caused by the piezoelectric elements of the first movable reflective device, and
wherein the support of the second movable reflective device is connected to the mirror of the second movable reflective device by the arm of the second movable reflective device, and a relative position of the mirror of the second movable reflective device to the support of the second movable reflective device is controllable by deformation of the arm of the second movable reflective device caused by the piezoelectric elements of the second movable reflective device.

18. A composite movable reflective device, comprising:
first and second movable reflective devices according to claim 5, wherein the mirror of the first movable reflective device is replaced with an entirety of the second movable reflective device,
wherein the support of the first movable reflective device is connected to the support of the second movable reflective device by the arm of the first movable reflective device, and a relative position of the support of the second movable reflective device to the support of the first movable reflective device is controllable by deformation of the arm of the first movable reflective device caused by the piezoelectric elements of the first movable reflective device,
wherein the support of the second movable reflective device is connected to the mirror of the second movable reflective device by the arm of the second movable reflective device, and a relative position of the mirror of the second movable reflective device to the support of the second movable reflective device is controllable by deformation of the arm of the second movable reflective device caused by the piezoelectric elements of the second movable reflective device, and
wherein the common reference axis of the first movable reflective device is disposed perpendicular to the common reference axis of the second movable reflective device.

19. A reflective surface drive system, comprising:
a movable reflective device or a composite movable reflective device according to claim 1, and a driver for driving the piezoelectric elements of the movable reflective device or the composite movable reflective device by supplying drive signals to the movable reflective device or the composite movable reflective device,
wherein the arm included in the movable reflective device includes a plate-like member disposed in a predetermined plane,
wherein the driver has a function of selectively supplying, to each piezoelectric element, a concave-deformation drive signal for causing areas of the bridges in which the piezoelectric elements are disposed, to deform to bow convexly downward along the longitudinal direction, and a convex-deformation drive signal for causing the areas of the bridges in which the piezoelectric elements are disposed, to deform to bow convexly upward along the longitudinal direction, and
wherein when the driver controls the mirror to have a predetermined attitude, the driver supplies, as electrical signals for supply to a particular arm, a first drive signal to the proximal-end-side piezoelectric element and the lengthwise piezoelectric element of the particular arm, and a second drive signal to the distal-end-side piezoelectric element of the particular arm, the first drive signal being one of the concave-deformation drive signal and the convex-deformation drive signal, the second drive signal being the other thereof.

20. The reflective surface drive system according to claim 19,
wherein, for upward displacement of an end portion of the arm, fixed to the mirror, the driver supplies the concave-deformation drive signal to the proximal-end-side piezoelectric element and the lengthwise piezoelectric element of the arm, and supplies the convex-deformation drive signal to the distal-end-side piezoelectric element of the arm, and wherein, for downward displacement of the end portion of the arm, fixed to the mirror, the driver supplies the convex-deformation drive signal to the proximal-end-side piezoelectric element and the lengthwise piezoelectric element of the arm, and supplies the concave-deformation drive signal to the distal-end-side piezoelectric element of the arm.

21. The reflective surface drive system according to claim 19, wherein the driver controls the mirror to keep a predetermined attitude relative to the support by supplying a direct-current drive signal to each piezoelectric element.

22. The reflective surface drive system according to claim 19, wherein the driver controls periodic motion of the mirror relative to the support by supplying to each piezoelectric element an alternating-current drive signal in which the concave-deformation drive signal and the convex-deformation drive signal are alternately repeated periodically.

23. A movable reflective device, comprising:
a mirror including a reflective surface;
a support for supporting the mirror;
an arm having one end connected to the support and another end connected to the mirror; and
piezoelectric elements for causing the arm to deform in accordance with an electrical signal provided, a relative position of the mirror to the support being controllable by deformation of the arm caused by the piezoelectric elements,
wherein the arm comprises n bridges and n+1 intermediate connectors, where n≥2, and the arm connects a predetermined portion of the support to a predetermined portion of the mirror along a single connection path,
wherein the n bridges are plate-like structures extending along different predetermined longitudinal axes,
wherein when one end of each bridge, closer to the support on the connection path, is referred to as a proximal end, and another end of each bridge, closer to the mirror on the connection path, is referred to as a distal end, a first intermediate connector connects the predetermined portion of the support to the proximal end of a first bridge, an ith intermediate connector connects the distal end of an (i−1)th bridge to the proximal end of an ith bridge, and an (n+1)th intermediate connector connects the distal end of an nth bridge to the predetermined portion of the mirror, where 2≤i≤n, wherein each of the first to (n−1)th bridges includes a proximal-end-side piezoelectric element arranged on a proximal-end side and a distal-end-side piezoelectric element arranged on a distal-end side, wherein each of the proximal-end-side piezoelectric element and the distal-end-side piezoelectric element is disposed on an upper surface or a lower surface of the associated bridge, and stretches and contracts a surface of the associated bridge along the longitudinal axis in accordance with the electrical signal provided, and wherein a pair of piezoelectric elements disposed on each of the first to (n−1)th bridges consists of a piezoelectric element having a first length and a piezoelectric element having a second length along the longitudinal axis of the bridge, the first length being longer than the second length, and when the piezoelectric element having the first length is referred to as a long element and the piezoelectric element having the second length is referred to as a short element, for an odd-numbered bridge, the proximal-end-side piezoelectric element is the short element and the distal-end-side piezoelectric element is the long element, and for an even-numbered bridge, the proximal-end-side piezoelectric element is the long element and the distal-end-side piezoelectric element is the short element.

24. The movable reflective device according to claim 23, wherein a dimensional ratio $\beta/\alpha$ is set to be 1.5 or more for each of the first to (n−1)th bridge, where $\alpha$ is a dimension of the short element and $\beta$ is a dimension of the long element.

25. The movable reflective device according to claim 23, wherein the nth bridge includes the proximal-end-side piezoelectric element arranged on the proximal-end side and the distal-end-side piezoelectric element arranged on the distal-end side.

26. The movable reflective device according to claim 23, wherein the longitudinal axis of each bridge is parallel to a predetermined common reference axis.

27. The movable reflective device according to claim 26, wherein when an XYZ three-dimensional orthogonal coordinate system is defined, the n bridges and n+1 intermediate connectors that are included in the arm include upper surfaces contained in an XY plane and lower surfaces contained in a predetermined plane parallel to the XY plane, and the longitudinal axes of the n bridges are set to be axes parallel to a Y axis that is the common reference axis.

* * * * *